(12) United States Patent
Sutardja

(10) Patent No.: US 8,063,711 B2
(45) Date of Patent: Nov. 22, 2011

(54) CRYSTAL OSCILLATOR EMULATOR

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 12/876,739

(22) Filed: Sep. 7, 2010

(65) Prior Publication Data

US 2011/0001571 A1    Jan. 6, 2011

Related U.S. Application Data

(63) Continuation of application No. 11/732,304, filed on Apr. 3, 2007, now Pat. No. 7,791,424, which is a continuation of application No. 11/649,433, filed on Jan. 4, 2007, now Pat. No. 7,768,360, and a continuation-in-part of application No. 11/328,979, filed on Jan. 10, 2006, now abandoned, and a continuation-in-part of application No. 10/892,709, filed on Jul. 16, 2004, now Pat. No. 7,148,763, which is a continuation-in-part of application No. 10/272,247, filed on Oct. 15, 2002, now Pat. No. 7,042,301.

(60) Provisional application No. 60/869,807, filed on Dec. 13, 2006, provisional application No. 60/868,807, filed on Dec. 6, 2006, provisional application No. 60/829,710, filed on Oct. 17, 2006, provisional application No. 60/714,454, filed on Sep. 6, 2005, provisional application No. 60/730,568, filed on Oct. 27, 2005, provisional application No. 60/756,828, filed on Jan. 6, 2006.

(51) Int. Cl.
    *H03L 1/00*    (2006.01)

(52) U.S. Cl. .................... 331/176; 331/108 C; 331/185; 331/183; 331/175; 331/116 R

(58) Field of Classification Search .................. 331/176, 331/185, 183, 108 C, 175, 74, 116 R
    See application file for complete search history.

(56) References Cited

U.S. PATENT DOCUMENTS

| | | | |
|---|---|---|---|
| 3,658,678 | A | 4/1972 | Gregor et al. |
| 3,767,839 | A | 10/1973 | Beal |
| 4,305,041 | A | 12/1981 | Frerking |
| 4,604,678 | A | 8/1986 | Hagner |
| 4,642,716 | A | 2/1987 | Wakabayashi et al. |
| 4,646,035 | A | 2/1987 | Chapelle et al. |

(Continued)

FOREIGN PATENT DOCUMENTS

CN    1497835 A    5/2004

(Continued)

OTHER PUBLICATIONS

Claim Recitation for U.S. Appl. No. 11/486,557, filed Aug. 4, 2009, 3 pages.

(Continued)

*Primary Examiner* — Arnold Kinkead

(57) ABSTRACT

A crystal oscillator emulator integrated circuit includes a first temperature sensor configured to sense a first temperature of the crystal oscillator emulator integrated circuit. The memory is configured to (i) store calibration parameters and (ii) select at least one of the calibration parameters based on the first temperature. A semiconductor oscillator is configured to generate an output signal, wherein (i) the output signal has a frequency and an amplitude and (ii) the frequency is based on the at least one of the calibration parameters. An amplitude adjustment module is configured to (i) compare the amplitude to a predetermined amplitude and (ii) generate a control signal to adjust the amplitude based on the comparison.

17 Claims, 42 Drawing Sheets

U.S. PATENT DOCUMENTS

| | | | |
|---|---|---|---|
| 4,893,097 A | 1/1990 | Zwack |
| 5,081,431 A | 1/1992 | Kubo et al. |
| 5,164,328 A | 11/1992 | Dunn et al. |
| 5,225,771 A | 7/1993 | Leedy |
| 5,309,090 A | 5/1994 | Lipp |
| 5,321,738 A | 6/1994 | Ha |
| 5,485,127 A | 1/1996 | Bertoluzzi et al. |
| 5,554,884 A | 9/1996 | McArthur |
| 5,574,408 A | 11/1996 | Zwack |
| 5,604,468 A | 2/1997 | Gillig |
| 5,655,288 A | 8/1997 | Onishi |
| 5,659,270 A | 8/1997 | Millen et al. |
| 5,694,740 A | 12/1997 | Martin et al. |
| 5,809,336 A | 9/1998 | Moore et al. |
| 5,822,170 A | 10/1998 | Cabuz et al. |
| 5,835,256 A | 11/1998 | Huibers |
| 5,856,766 A | 1/1999 | Gillig et al. |
| 5,877,042 A | 3/1999 | Mattson et al. |
| 5,888,851 A | 3/1999 | Motonami et al. |
| 5,892,408 A | 4/1999 | Binder |
| 5,896,650 A | 4/1999 | Nishide et al. |
| 5,914,168 A | 6/1999 | Wakamatsu et al. |
| 5,939,785 A | 8/1999 | Klonis et al. |
| 5,963,289 A | 10/1999 | Stefanov et al. |
| 6,046,840 A | 4/2000 | Huibers |
| 6,093,882 A | 7/2000 | Arimoto |
| 6,114,005 A | 9/2000 | Nagai et al. |
| 6,160,458 A | 12/2000 | Cole et al. |
| 6,225,871 B1 | 5/2001 | Chien |
| 6,329,749 B1 | 12/2001 | Mori et al. |
| 6,455,927 B1 | 9/2002 | Glenn et al. |
| 6,468,584 B1 | 10/2002 | Yamaura et al. |
| 6,503,780 B1 | 1/2003 | Glenn et al. |
| 6,517,399 B1 | 2/2003 | Ito et al. |
| 6,534,341 B2 | 3/2003 | Farnworth |
| 6,542,044 B1 | 4/2003 | Berquist et al. |
| 6,598,148 B1 | 7/2003 | Moore et al. |
| 6,624,921 B1 | 9/2003 | Glenn et al. |
| 6,661,302 B1 | 12/2003 | Rathore et al. |
| 6,718,816 B2 | 4/2004 | Freehill et al. |
| 6,753,208 B1 | 6/2004 | MacIntyre |
| 6,803,829 B2 | 10/2004 | Duncan et al. |
| 6,850,125 B2 | 2/2005 | Norman et al. |
| 6,856,014 B1 | 2/2005 | Ehmke et al. |
| 7,042,301 B2 | 5/2006 | Sutardja |
| 7,064,617 B2 | 6/2006 | Hein et al. |
| 7,145,402 B2 | 12/2006 | Mattila et al. |
| 7,148,763 B2 | 12/2006 | Sutardja |
| 7,187,241 B2 | 3/2007 | Hein et al. |
| 7,253,495 B2 | 8/2007 | Sutardja |
| 7,301,408 B2 | 11/2007 | Sutardja |
| 7,307,775 B2 | 12/2007 | Patel et al. |
| 7,760,036 B2 | 7/2010 | Sutardja |
| 7,760,039 B2 | 7/2010 | Sutardja |
| 7,768,361 B2 | 8/2010 | Sutardja |
| 7,786,817 B2 | 8/2010 | Sutardja |
| 7,791,424 B2 | 9/2010 | Sutardja |
| 2001/0004979 A1 | 6/2001 | Han et al. |
| 2002/0027296 A1 | 3/2002 | Badehi |
| 2002/0073533 A1 | 6/2002 | Park |
| 2002/0086456 A1 | 7/2002 | Cunningham et al. |
| 2002/0100967 A1 | 8/2002 | Gaku et al. |
| 2003/0025566 A1 | 2/2003 | Rogers |
| 2003/0034851 A1 | 2/2003 | Norman et al. |
| 2003/0054588 A1 | 3/2003 | Patel et al. |
| 2004/0071029 A1 | 4/2004 | Sutardja |
| 2004/0104449 A1 | 6/2004 | Yoon et al. |
| 2004/0218292 A1 | 11/2004 | Huibers |
| 2004/0218293 A1 | 11/2004 | Huibers |
| 2004/0223088 A1 | 11/2004 | Huibers |
| 2004/0227578 A1 | 11/2004 | Hamalainen |
| 2004/0233392 A1 | 11/2004 | Huibers |
| 2005/0007557 A1 | 1/2005 | Huibers |
| 2005/0030109 A1 | 2/2005 | Kim |
| 2005/0030490 A1 | 2/2005 | Huibers |
| 2005/0074919 A1 | 4/2005 | Patel et al. |
| 2005/0151592 A1 | 7/2005 | Partridge et al. |
| 2005/0164127 A1 | 7/2005 | Reid et al. |
| 2005/0218917 A1 | 10/2005 | Huber et al. |
| 2006/0046350 A1 | 3/2006 | Jiang et al. |
| 2006/0113639 A1 | 6/2006 | Sutardja |
| 2006/0124915 A1 | 6/2006 | Buettner et al. |
| 2006/0249840 A1 | 11/2006 | Sutardja |
| 2006/0255457 A1 | 11/2006 | Sutardja |
| 2006/0262623 A1 | 11/2006 | Sutardja |
| 2006/0267170 A1 | 11/2006 | Sutardja |
| 2006/0267194 A1 | 11/2006 | Sutardja |
| 2007/0176690 A1 | 8/2007 | Sutardja |
| 2007/0176705 A1 | 8/2007 | Sutardja |
| 2007/0182500 A1 | 8/2007 | Sutardja |
| 2007/0188253 A1 | 8/2007 | Sutardja |
| 2007/0188254 A1 | 8/2007 | Sutardja |
| 2008/0029878 A1 | 2/2008 | Knechtel |
| 2008/0042767 A1 | 2/2008 | Sutardja |
| 2008/0096313 A1 | 4/2008 | Patel et al. |
| 2008/0315333 A1 | 12/2008 | Combi et al. |
| 2009/0014867 A1 | 1/2009 | Krawiec |

FOREIGN PATENT DOCUMENTS

| | | |
|---|---|---|
| DE | 42 09 843 A1 | 11/1993 |
| DE | 10322751 B3 | 9/2004 |
| EP | 0 766 376 A1 | 2/1997 |
| EP | 01411630 A1 | 4/1997 |
| EP | 0 878 909 A | 11/1998 |
| JP | 56-111253 | 9/1981 |
| JP | 04205704 A | 7/1992 |
| JP | 5-183072 A | 7/1993 |
| JP | 8-102506 A | 4/1996 |
| JP | 60-3140 A | 1/1997 |
| JP | 11-266546 | 9/1999 |
| JP | 2002201358 A | 7/2002 |
| JP | 2003123644 | 4/2003 |
| JP | 2004/023634 A | 1/2004 |
| WO | WO 99/17358 | 4/1999 |
| WO | WO 01/99149 A2 | 12/2001 |
| WO | WO 03/073629 A1 | 9/2003 |
| WO | WO 2004105117 | 12/2004 |
| WO | WO 2005042401 | 5/2005 |

OTHER PUBLICATIONS

Clark T.C. Nguyen et al.; "Micromachined Devices for Wireless Communications;" Proceedings of the IEEE; Aug. 8, 1998; 14 pages.

Communication dated Aug. 18, 2005 for Application No. 04020779.7-2206; 3 pages.

Communication for Application No. 03 017 477.5-1233—Dated Jun. 30, 2004; 5 pages.

Curtis Barrett; Fractional/integer-N PLL Basics; Technical Brief SWRA029; Aug. 1999; 55 pages.

First Office Action for Chinese Patent Application No. 200610126947.2 dated Jun. 19, 2009; 3 pages.

First Office Action for Chinese Patent Application No. 200610126949.1 dated Oct. 23, 2009; 4 pages.

Notification of Transmittal of the Austrian Patent Office Service and Information Center (TRF) Search Report and the Written Opinion, or the Declaration dated May 9, 2008 in reference to Application No. 200605916-6 (8 pgs).

Notification of Transmittal of the Austrian Patent Office Service and Information Center (TRF) Search Report and the Written Opinion, or the Declaration dated Sep. 12, 2008 in reference to Application No. 200605918-2 (7 pgs).

Notification of Transmittal of the International Search Report and the Written Opinion of the International Searching Authority, or the Declaration dated Aug. 6, 2008 in reference to PCT/US2007/022168 (23 pgs).

Notification of Transmittal of the International Search Report and the Written Opinion of the International Searching Authority, or the Declaration dated Aug. 6, 2008 in reference to PCT/US2007/022117 (19 pgs).

Official Action including the Written Opinion and Search Report from the Intellectual Property Office of Singapore dated Sep. 21, 2007 for Application No. SG 200605915-8; 11 pages.

Official Communication from the European Patent Office dated Apr. 27, 2007 for Application No. 04 020 779.7-2206; 3 pages.

Official Communication from the European Patent Office dated Dec. 4, 2006 for Application No. 03 017 477.5-1233; 3 pages.

Organized Translation of Final Rejection from the Japanese Patent Office dated May 23, 2007; 9 pages.

Rizwan Murji et al.; "A Low-Power, 10 GHZ Back-Gated Tuned Voltage Controlled Oscillator with Automatic Amplitude and Temperature Compensation;" Circuits and Systems; May 23, 2004; 4 pages.

Roberto Gaddi et al.; "Reconfigurable MEMs-enabled LC-tank for Mult-Band CMOS Oscillator;" Microwave Symposium Digest; Jun. 12, 2005; 4 pages.

Second Office Action for Chinese Patent Application No. 200610126947.2 dated Oct. 30, 2009; 9 pages.

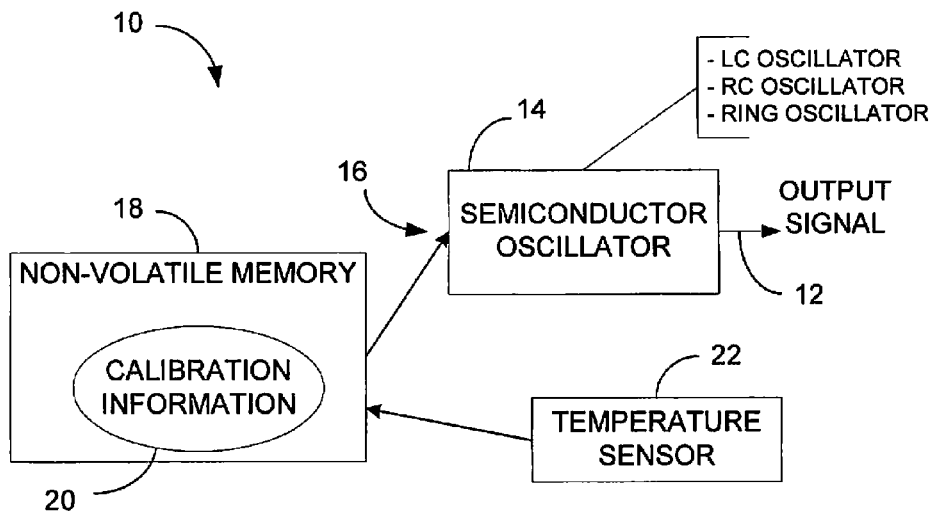
FIG. 1
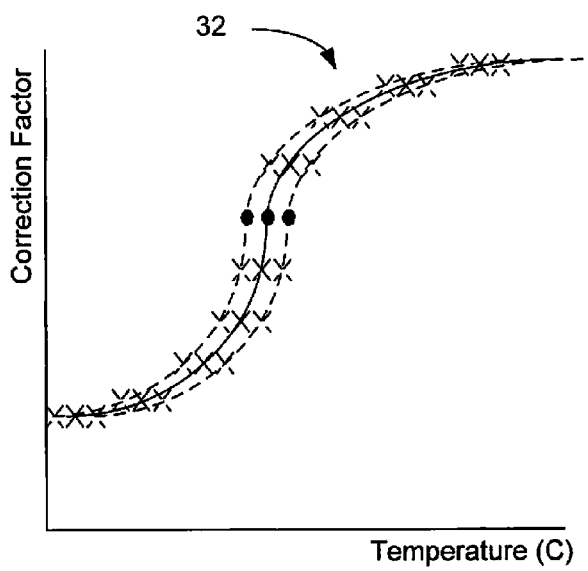
FIG. 2             FIG. 3

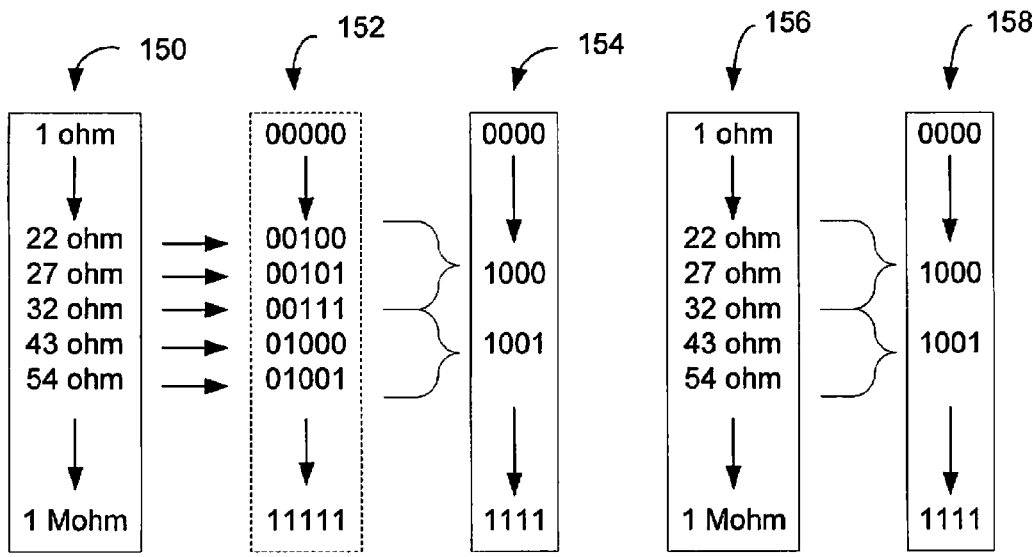
FIG. 7A  FIG. 7B
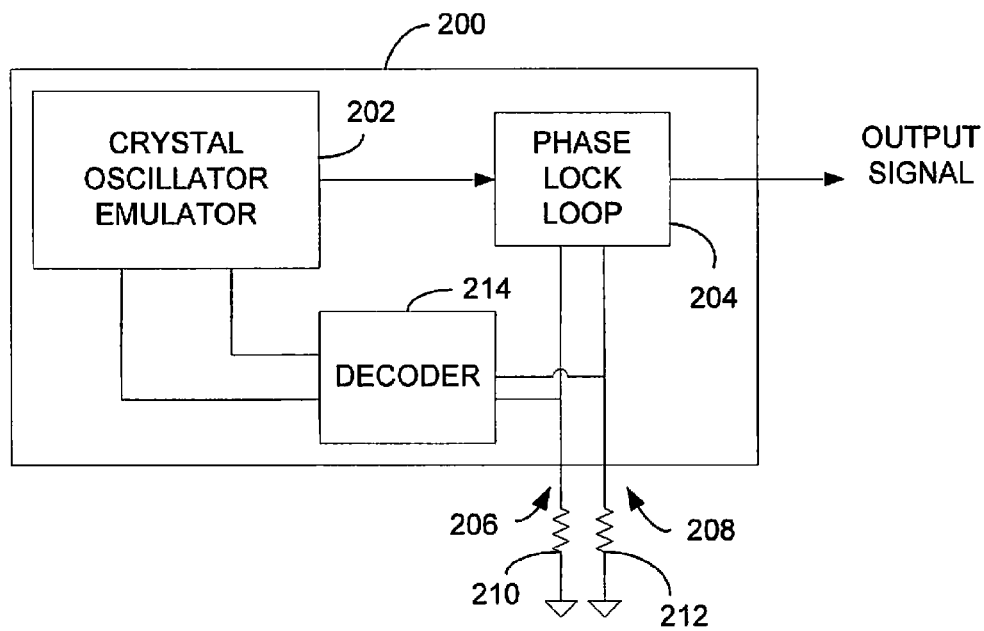
FIG. 8

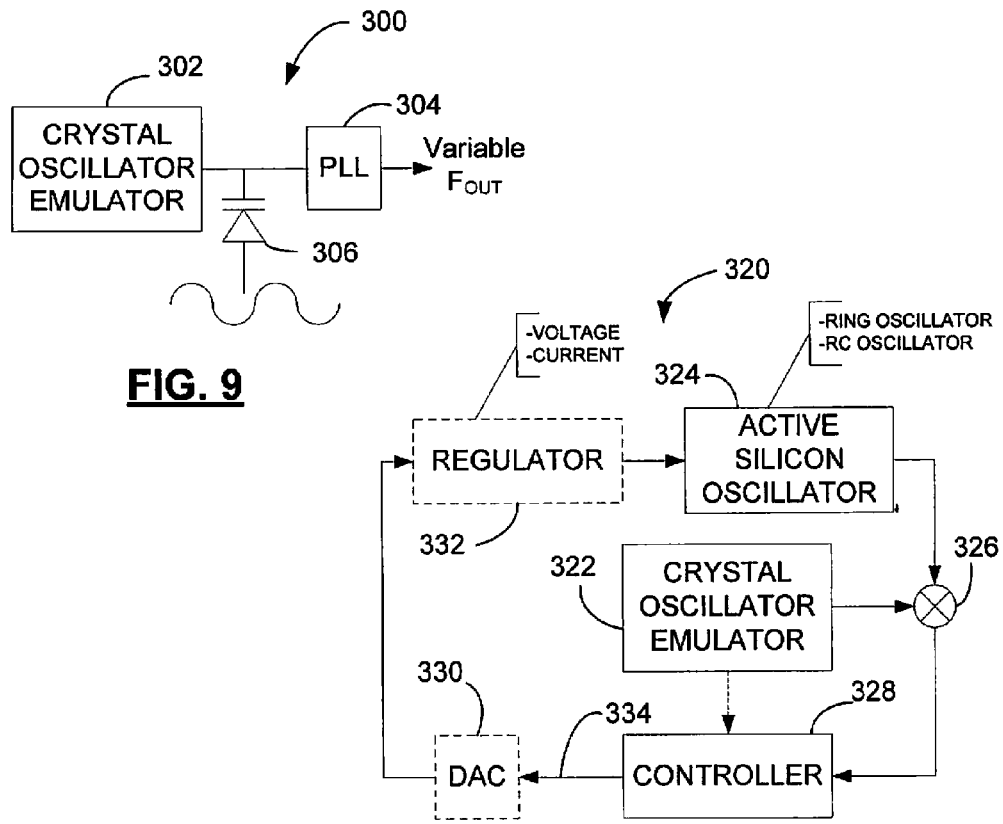
FIG. 9
FIG. 11
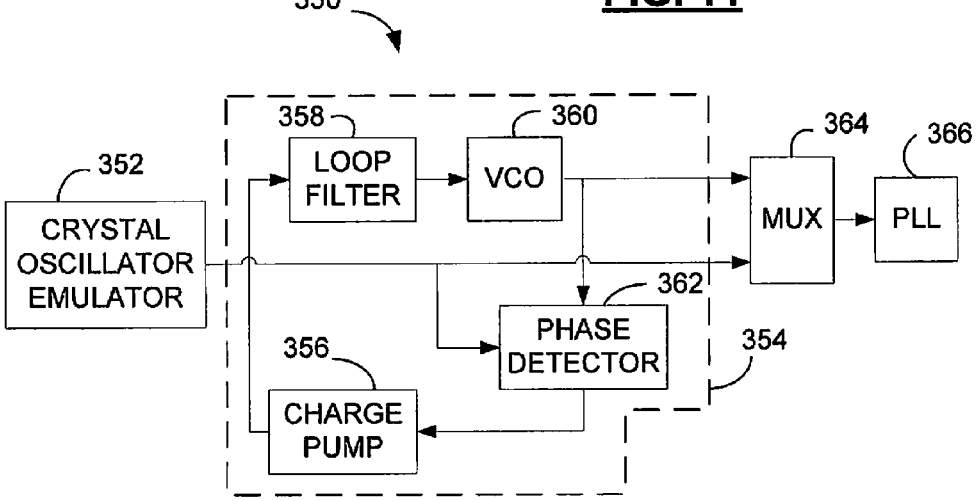
FIG. 12

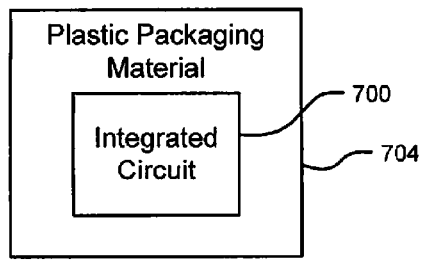
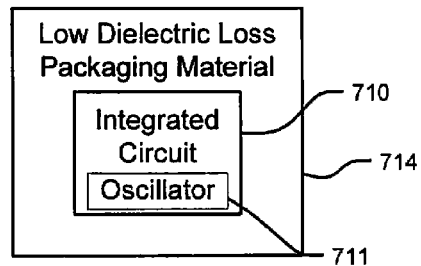
FIG. 20
Prior Art
FIG. 21
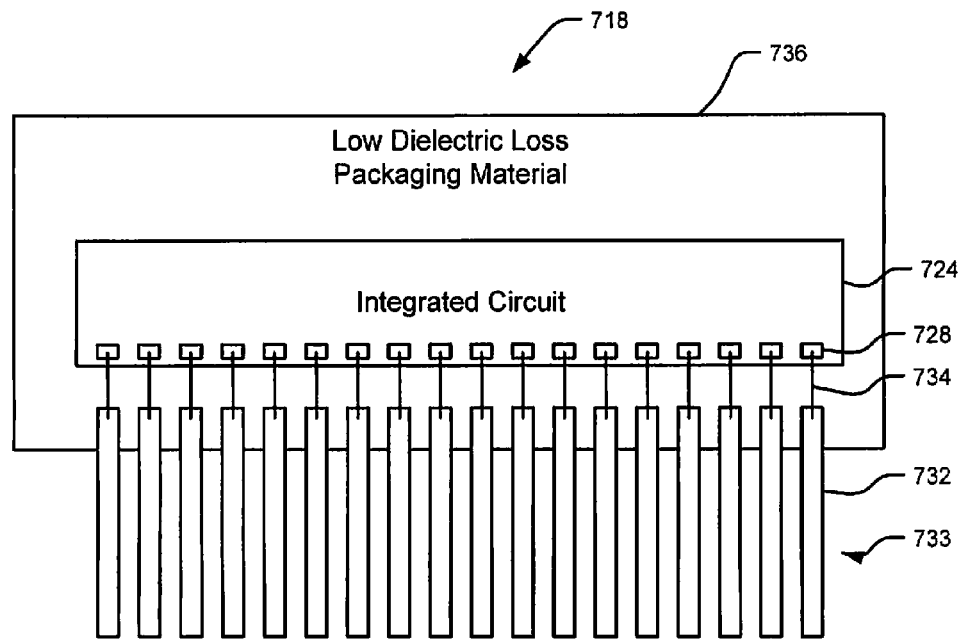
FIG. 22

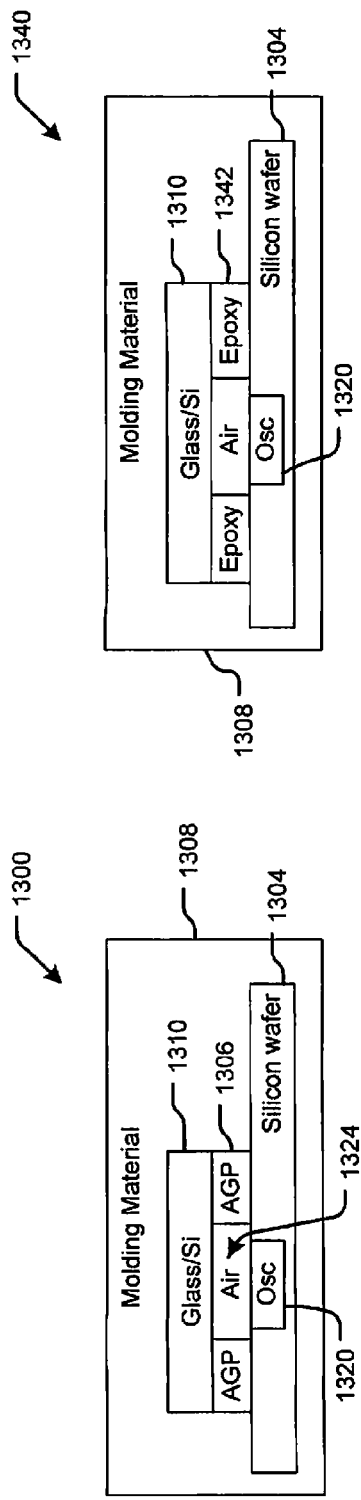
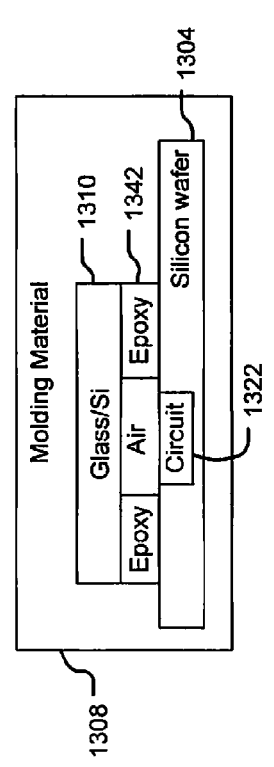
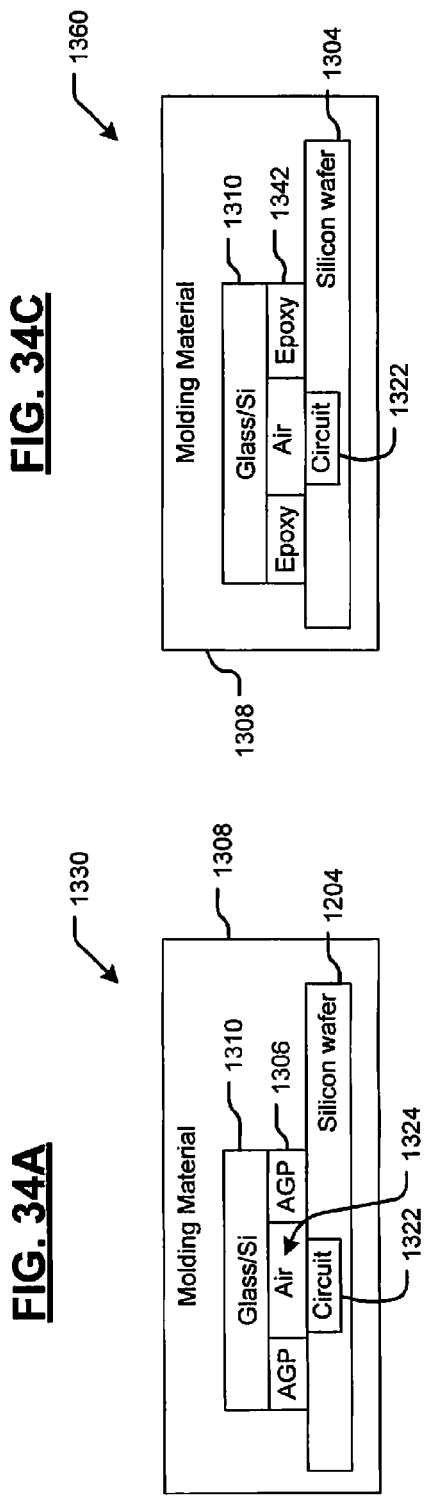
FIG. 34A
FIG. 34B
FIG. 34C
FIG. 34D

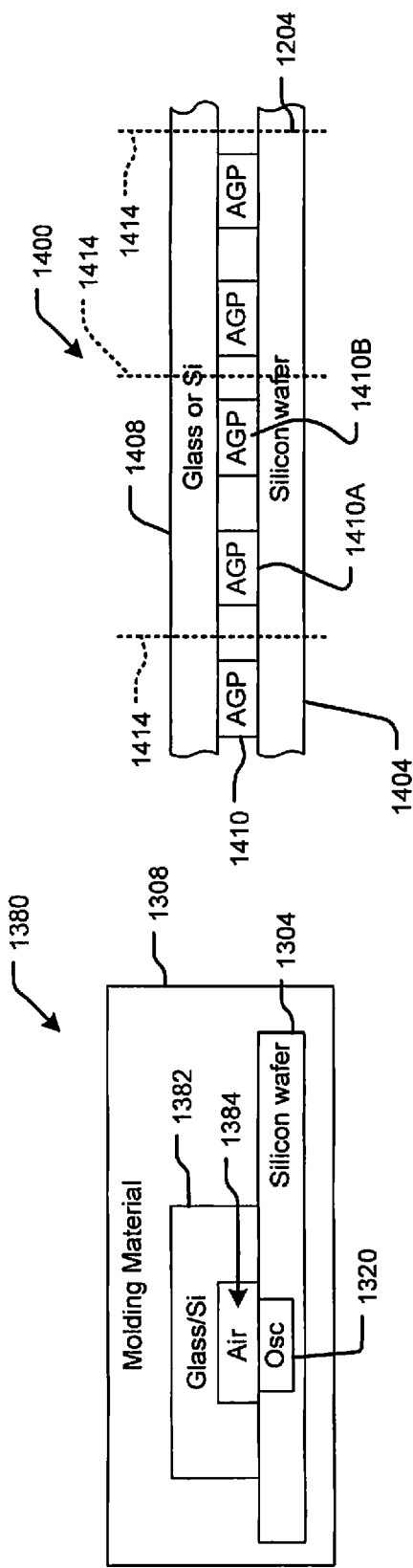
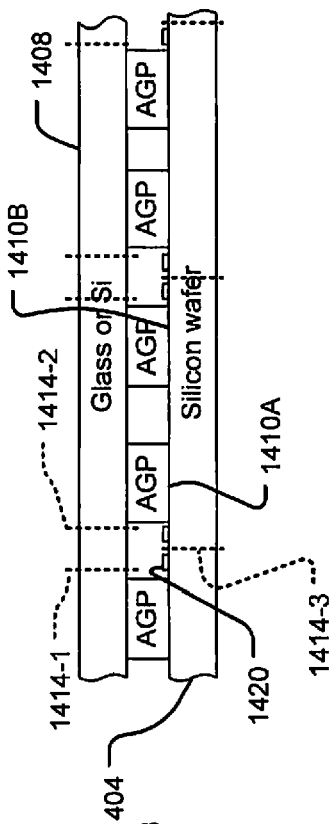
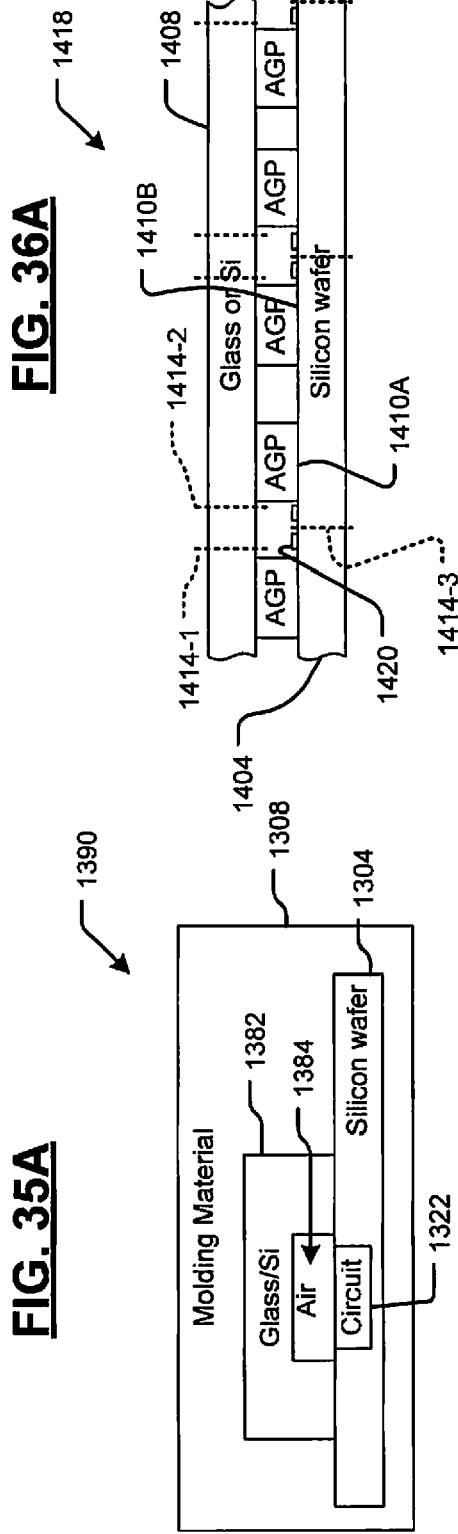
FIG. 36A
FIG. 36B
FIG. 35A
FIG. 35B

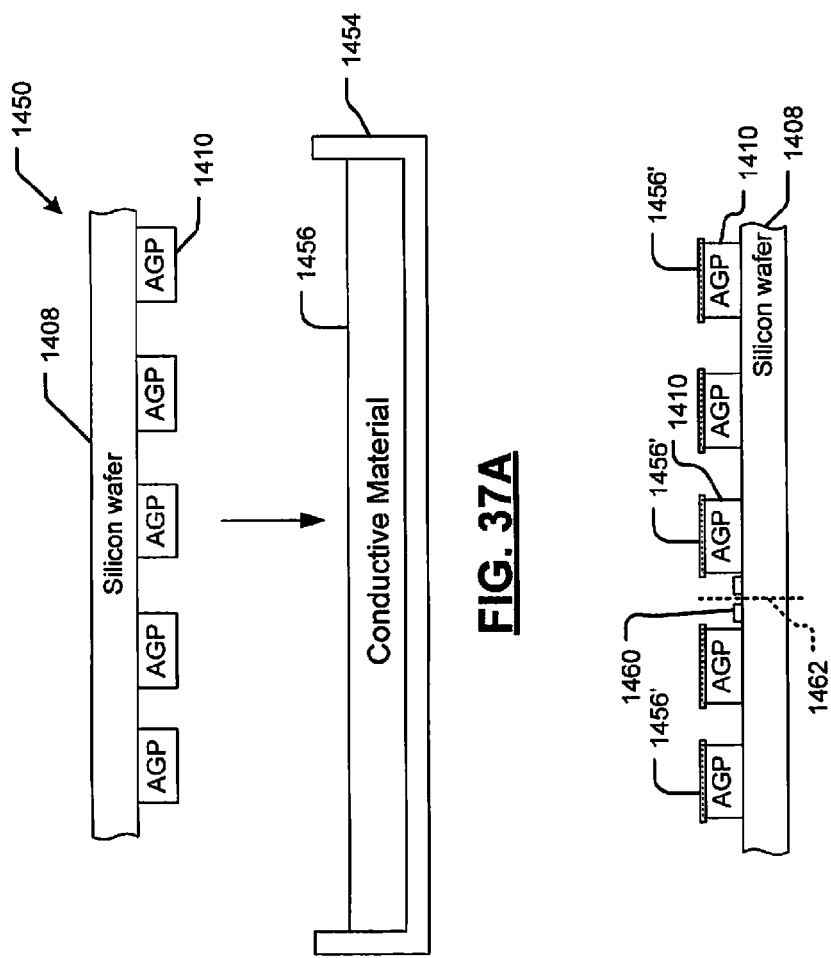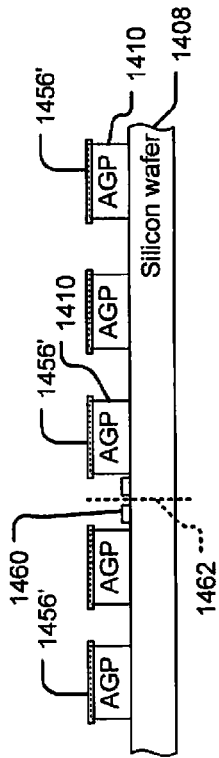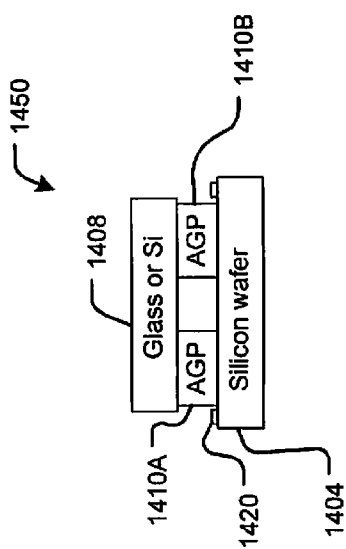

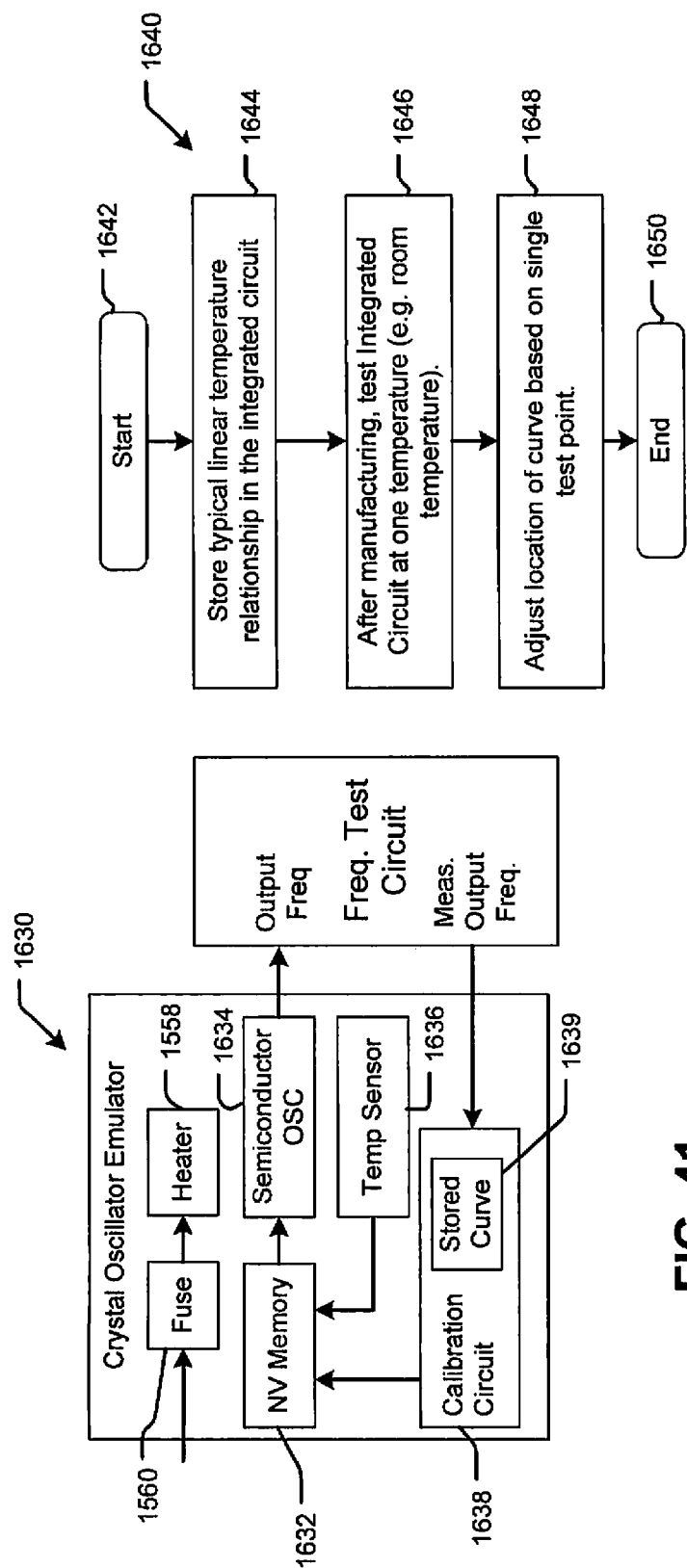

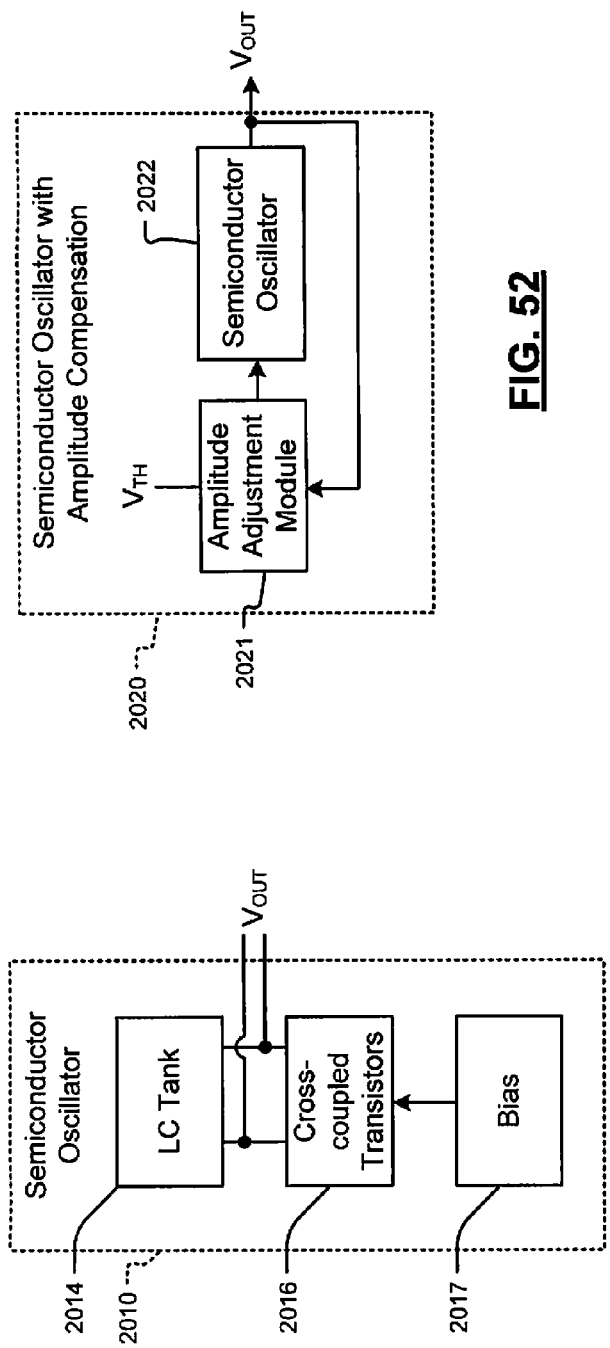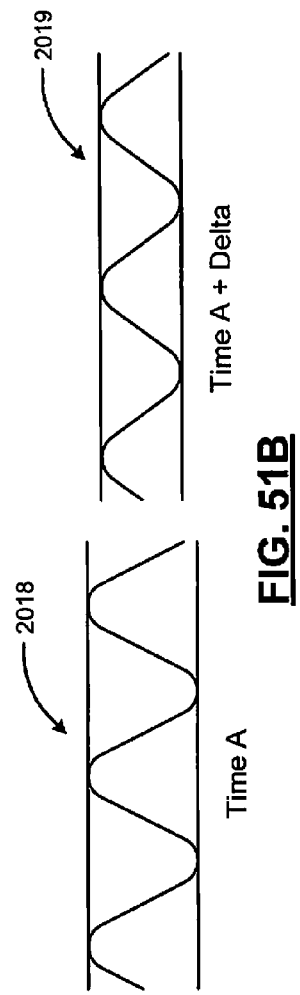

CRYSTAL OSCILLATOR EMULATOR

CROSS-REFERENCE TO RELATED APPLICATIONS

This application is a continuation of U.S. Non-Provisional application Ser. No. 11/732,304 (now U.S. Pat. No. 7,791,424), filed Apr. 3, 2007, which is a continuation of U.S. Non-Provisional application Ser. No. 11/649,433 (now U.S. Pat. No. 7,768,360), filed Jan. 4, 2007 and claims the benefit of U.S. Provisional Application No. 60/869,807, filed Dec. 13, 2006, 60/868,807, filed Dec. 6, 2006, and 60/829,710, filed on Oct. 17, 2006, and is a continuation-in-part of U.S. Non-Provisional application Ser. No. 11/328,979, filed Jan. 10, 2006 now abandoned, which claims the benefit of U.S. Provisional Application Nos. 60/714,454, filed Sep. 6, 2005, 60/730,568, filed Oct. 27, 2005, and 60/756,828, filed Jan. 6, 2006, and is a continuation-in-part of U.S. Non-Provisional patent application Ser. No. 10/892,709 (now U.S. Pat. No. 7,148,763), filed Jul. 16, 2004, which is a continuation-in-part of U.S. Non-Provisional application Ser. No. 10/272,247 (now U.S. Pat. No. 7,042,301), filed Oct. 15, 2002, the contents of which are hereby incorporated by reference in their entirety.

TECHNICAL FIELD

This invention relates to integrated circuits, and more particularly to integrated circuits with crystal oscillator emulators.

BACKGROUND

Precision frequency references are required in many types of electronic devices such as cellular phones and other handheld devices. Crystal oscillators are typically used to provide the precision frequency reference in these electronic devices. However, crystal oscillators have several inherent disadvantages including large bulky size, fragility, and high cost. In addition, the size and cost of crystal oscillators is related to the resonant frequency so that as the frequency increases, the size decreases, and the cost and fragility may rapidly increase. As the size of electronic devices continues to decrease, the use of crystal oscillators becomes more problematic due to the size, fragility, and cost limitations.

Semiconductor oscillators have been a poor alternative to crystal oscillators and are generally unsuitable for use as a precision frequency reference due to excessive variation in the oscillating frequency, especially with changes in temperature.

SUMMARY OF THE INVENTION

A crystal oscillator emulator integrated circuit, comprises a first temperature sensor that senses a first temperature of the integrated circuit; memory that stores calibration parameters and that selects at least one of the calibration parameters based on the first temperature; a semiconductor oscillator that generates an output signal having a frequency that is based on the calibration parameters; and an adaptive calibration circuit that adaptively adjusts a calibration approach for generating the calibration parameters based on a number of temperature test points input thereto.

In other features, a select input selects the frequency of the output signal frequency as a function of an external passive component. The first temperature is a die temperature adjacent to the semiconductor oscillator. A heater adjusts the first temperature. A disabling circuit disables the heater after the calibration parameters are stored. The heater operates in response to the first temperature sensor.

In other features, when test data consists of a single temperature test point, the adaptive calibration circuit employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration circuit employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration circuit adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. When test data comprises three temperature test points, the adaptive calibration circuit adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. The memory includes one time programmable memory.

A crystal oscillator emulator integrated circuit, comprising: first temperature sensing means for sensing a first temperature of the integrated circuit; storing means for storing calibration parameters and for selecting at least one of the calibration parameters based on the first temperature; semiconductor oscillating means for generating an output signal having a frequency that is based on the calibration parameters; and adaptive calibration means for adaptively adjusting a calibration approach for generating the calibration parameters based on a number of temperature test points input thereto.

In other features, the method includes a select input that selects the frequency of the output signal frequency as a function of an external passive component. The first temperature is a die temperature adjacent to the semiconductor oscillating means. The method includes heating means for adjusting the first temperature; and disabling means for disabling the heating means after the calibration parameters are stored.

In other features, the heating means operates in response to the first temperature sensing means. When test data consists of a single temperature test point, the adaptive calibration means employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration means employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration means adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. When test data comprises three temperature test points, the adaptive calibration means adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. The storing means includes one time programmable memory.

A method comprising: sensing a first temperature of an integrated circuit; storing calibration parameters; selecting at least one of the calibration parameters based on the first temperature; providing a semiconductor oscillator that generates an output signal having a frequency that is based on the calibration parameters; and adaptively adjusting a calibration approach for generating the calibration parameters based on a number of temperature test points input thereto.

In other features, the method includes selecting the frequency of the output signal frequency as a function of an external passive component. The first temperature is a die temperature adjacent to the semiconductor oscillator. The method includes selectively adjusting the first temperature using a heater; and disabling the heater after the calibration parameters are stored. The heater operates in response to a first temperature sensor.

In other features, when test data consists of a single temperature test point, the method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data. When test data comprises three temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data. The memory includes one time programmable memory.

An integrated circuit comprises a crystal oscillator emulator that comprises: a first temperature sensor that senses a first temperature of the integrated circuit; memory that stores calibration parameters that are addressed based on the first temperature; and a semiconductor oscillator that generates an output signal having a frequency that is based on the calibration parameters, wherein the integrated circuit does not include other circuits unrelated to operation of the crystal oscillator emulator.

In other features, the crystal oscillator emulator further comprises a select input that selects the frequency of the output signal as a function of an external passive component. The crystal oscillator emulator further comprises a heater that selectively adjusts the first temperature. The heater operates in response to the first temperature sensor. The heater is selected from a group consisting of transistor heaters and resistive heaters. A calibration circuit communicates with the memory and generates the calibration parameters.

An integrated circuit comprises a microelectromechanical (MEMS) or film bulk acoustic resonator (FBAR) resonator circuit that generates a reference frequency; a temperature sensor that senses a temperature of the integrated circuit; memory that stores calibration parameters and that selects at least one of the calibration parameters as a function of the sensed temperature; and a phase locked loop module that receives the reference signal, that comprises a feedback loop having a feedback loop parameter and that selectively adjusts the feedback loop parameter based on the at least one of the calibration parameters.

In other features, the phase locked loop module comprises a fractional phase locked loop module and the feedback loop parameter includes a ratio of a scaling factor. The fractional phase locked loop module comprises: a phase frequency detector module that communicates with the MEMS or FBAR resonator circuit and that receives the reference frequency; a charge pump module that communicates with the phase frequency detector module; a voltage controlled oscillator that communicates with the charge pump module and that generates an output frequency; and a scaling module that communicates with the voltage controlled oscillator and the phase frequency detector module, that selectively divides the output frequency by first and second scaling factors and that selectively adjusts a ratio of the first and second scaling factors based on the at least one of the calibration parameters.

In other features, the first and second scaling factors are divisors equal to N and N+1, respectively, and wherein N is an integer greater than zero. The phase locked loop module comprises a Delta Sigma fractional phase locked loop module and the feedback loop parameter includes modulation of a scaling divisor. The Delta Sigma fractional phase locked loop module comprises: a phase frequency detector module that communicates with the MEMS or FBAR resonator circuit and that receives the reference frequency; a charge pump module that communicates with the phase frequency detector module; a voltage controlled oscillator that communicates with the charge pump module and that generates an output frequency; a scaling module that communicates with the voltage controlled oscillator and the phase frequency detector module and that selectively divides the output frequency by first and second scaling factors; and a Sigma Delta modulator that adjusts modulation of the scaling module between the first and second scaling factors based on the at least one of the calibration parameters.

In other features, the first and second scaling factors are divisors equal to N and N+1, respectively, and where N is an integer greater than zero. The MEMS or FBAR resonator circuit comprises: a semiconductor oscillator that generates resonator drive signal having a drive frequency; and a MEMS or FBAR resonator that receives the resonator drive signal.

An integrated circuit comprises microelectromechanical (MEMS) or film bulk acoustic resonator (FBAR) resonator means for generating a reference frequency; temperature sensing means for sensing a temperature of the integrated circuit; storing means for storing calibration parameters and for selecting at least one of the calibration parameters as a function of the sensed temperature; and phase locked loop means for receiving the reference signal, for providing a feedback loop having a feedback loop parameter and for selectively adjusting the feedback loop parameter based on the at least one of the calibration parameters.

In other features, the phase locked loop means comprises a fractional phase locked loop and the feedback loop parameter includes a ratio of a scaling factor. The fractional phase locked loop comprises: phase frequency detector means that communicates with the MEMS or FBAR resonator means for receiving the reference frequency; charge pump means for communicating with the phase frequency detector means; voltage controlled oscillating means that communicates with the charge pump means for generating an output frequency; and scaling means that communicates with the voltage controlled oscillating means and the phase frequency detector means, for selectively dividing the output frequency by first and second scaling factors and for selectively adjusting a ratio of the first and second scaling factors based on the at least one of the calibration parameters.

In other features, the first and second scaling factors are divisors equal to N and N+1, respectively, and wherein N is an integer greater than zero. The phase locked loop means comprises a Delta Sigma fractional phase locked loop and the feedback loop parameter includes modulation of a scaling divisor. The Delta Sigma fractional phase locked loop comprises: phase frequency detector means that communicates with the MEMS or FBAR resonator means for receiving the reference frequency; charge pump means for communicating with the phase frequency detector means; voltage controlled oscillating means that communicates with the charge pump means for generating an output frequency; scaling means that communicates with the voltage controlled oscillating means and the phase frequency detector means for selectively dividing the output frequency by first and second scaling factors; and Sigma Delta modulating means for adjusting modulation of the scaling means between the first and second scaling factors based on the at least one of the calibration parameters.

In other features, the first and second scaling factors are divisors equal to N and N+1, respectively, and where N is an integer greater than zero. The MEMS or FBAR resonator means comprises semiconductor oscillating means for generating resonator drive signal having a drive frequency; and MEMS or FBAR resonating means for receiving the resonator drive signal.

A method comprises providing a microelectromechanical (MEMS) or film bulk acoustic resonator (FBAR) resonator that generates a reference frequency; sensing a temperature of the integrated circuit; storing calibration parameters; selecting at least one of the calibration parameters as a function of the sensed temperature; providing a phase locked loop that receives the reference signal and that comprises a feedback loop having a feedback loop parameter; and selectively adjusting the feedback loop parameter based on the at least one of the calibration parameters.

In other features, the phase locked loop comprises a fractional phase locked loop and the feedback loop parameter includes a ratio of a scaling factor. The method includes providing a phase frequency detector that communicates with the MEMS or FBAR resonator and that receives the reference frequency; and providing a charge pump that communicates with the phase frequency detector.

In other features, the method includes generating an output frequency; and selectively dividing the output frequency by first and second scaling factors; and selectively adjusting a ratio of the first and second scaling factors based on the at least one of the calibration parameters.

In other features, the first and second scaling factors are divisors equal to N and N+1, respectively, and wherein N is an integer greater than zero. The phase locked loop comprises a Delta Sigma fractional phase locked loop and the feedback loop parameter includes modulation of a scaling divisor.

In other features, the method includes providing a phase frequency detector that communicates with the MEMS or FBAR resonator and that receives the reference frequency; and providing a charge pump module that communicates with the phase frequency detector. The method includes generating an output frequency; selectively dividing the output frequency by first and second scaling factors; and adjusting modulation between the first and second scaling factors based on the at least one of the calibration parameters. The first and second scaling factors are divisors equal to N and N+1, respectively, and where N is an integer greater than zero.

An integrated circuit comprises a microelectromechanical (MEMS) or film bulk acoustic resonator (FBAR) resonator circuit that generates a reference frequency and that includes: a semiconductor oscillator that generates resonator drive signal having a drive frequency; and a MEMS or FBAR resonator that receives the resonator drive signal. A temperature sensor senses a temperature of the integrated circuit. Memory stores calibration parameters and that selects at least one of the calibration parameters as a function of the sensed temperature, wherein the drive frequency is based on the calibration parameters.

In other features, a heater that adjusts the temperature to a predetermined temperature; and a disabling circuit that disables the heater after the calibration parameters are stored in the memory. An adaptive calibration module adaptively adjusts a calibration approach for generating the calibration parameters based on a number of temperature test points input thereto. A select input selects the drive frequency as a function of an external passive component. The heater is selected from a group consisting of transistor heaters and resistive heaters.

In other features, when test data consists of a single temperature test point, the adaptive calibration module employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration module employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration module adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. When the test data comprises three temperature test points, the calibration module adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. The memory includes one time programmable memory.

An integrated circuit comprises microelectromechanical (MEMS) or film bulk acoustic resonator (FBAR) means for generating a reference frequency and that includes: semiconductor oscillating means for generating a resonator drive signal having a drive frequency; and MEMS or FBAR resonator means for receiving the resonator drive signal and for resonating. Temperature sensing means senses a temperature of the integrated circuit. Storing means stores calibration parameters and selects at least one of the calibration parameters as a function of the sensed temperature, wherein the drive frequency is based on the calibration parameters.

In other features, heating means adjusts the temperature to a predetermined temperature and disabling means disables the heating means after the calibration parameters are stored in the storing means. Adaptive calibration means adaptively adjusts a calibration approach for generating the calibration parameters based on a number of temperature test points input thereto. Select input means for selecting the drive frequency as a function of an external passive component. The heating means is selected from a group consisting of transistor heaters and resistive heaters.

In other features, when test data consists of a single temperature test point, the adaptive calibration means employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration means employs at least one of a slope of a predetermined temperature characteristic line and a curvature of predetermined temperature characteristic curve, and adjusts a location of the at least one of the predetermined temperature characteristic line and the predetermined temperature characteristic curve based on the test data. When test data consists of two temperature test points, the adaptive calibration means adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. When the test data comprises three temperature test points, the adaptive calibration means adjusts at least one of a slope of a predetermined temperature characteristic line and a curvature of a predetermined temperature characteristic curve, and adjusts a location of the at least one of the predetermined temperature characteristic line and the predetermined temperature characteristic curve based on the test data. The storing means includes one time programmable memory.

A method comprises providing a microelectromechanical (MEMS) or film bulk acoustic resonator (FBAR) resonator circuit that generates a reference frequency and that includes: a semiconductor oscillator that generates resonator drive signal having a drive frequency; and a MEMS or FBAR resonator that receives the resonator drive signal. The method includes sensing a temperature of the integrated circuit; storing calibration parameters; and selecting at least one of the calibration parameters as a function of the sensed temperature, wherein the drive frequency is based on the calibration parameters.

The method includes adjusting the temperature to a predetermined temperature; and disabling the heater after the calibration parameters are stored in the memory. The method includes adaptively adjusting a calibration approach for generating the calibration parameters based on a number of temperature test points input thereto. The method includes selecting the drive frequency as a function of an external passive component. The heater is selected from a group consisting of transistor heaters and resistive heaters.

In other features, when test data consists of a single temperature test point, to method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data. When test data comprises three temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data. The memory includes one time programmable memory.

A crystal oscillator emulator integrated circuit comprises a first temperature sensor that senses a first temperature of the integrated circuit; memory that stores calibration parameters and that selects at least one of the calibration parameters based on the first temperature; a semiconductor oscillator that generates an output signal having a frequency that is based on the calibration parameters; a heater that adjusts the first temperature to a predetermined temperature; and a disabling circuit that disables the heater after the calibration parameters are stored in the memory.

In other features, an adaptive calibration circuit adaptively adjusts a calibration approach for generating the calibration parameters based on a number of temperature test points input thereto. A select input selects the frequency of the output signal frequency as a function of an external passive component. The heater operates in response to the first temperature sensor. The heater is selected from a group consisting of transistor heaters and resistive heaters. The memory includes one time programmable memory.

A crystal oscillator emulator integrated circuit, comprises first temperature sensing means for sensing a first temperature of the integrated means; storing means for storing calibration parameters and for selecting at least one of the calibration parameters based on the first temperature; semiconductor oscillating means for generating an output signal having a frequency that is based on the calibration parameters; heating means for adjusting the first temperature to a predetermined temperature; and disabling means for disabling the heating means after the calibration parameters are stored in the storing means.

In other features, adaptive calibration means adaptively adjusts a calibration approach for generating the calibration parameters based on a number of temperature test points input thereto. Select input means selects the frequency of the output signal frequency as a function of an external passive component. The heating means operates in response to the first temperature sensing means. The heating means is selected from a group consisting of transistor heaters and resistive heaters. The storing means includes one time programmable storing means.

A method comprises sensing a first temperature of an integrated circuit; storing calibration parameters; selecting at least one of the calibration parameters based on the first temperature; providing a semiconductor oscillator that generates an output signal having a frequency that is based on the calibration parameters; adjusting the first temperature to a predetermined temperature using a heater; and disabling the heater after the calibration parameters are stored in the memory.

In other features, the method includes adaptively adjusting a calibration approach for generating the calibration parameters based on a number of temperature test points input thereto. The method includes selecting the frequency of the output signal frequency as a function of an external passive component. The method includes operating the heater in response to the first temperature. The heater is selected from a group consisting of transistor heaters and resistive heaters.

A method comprises providing an integrated circuit that includes a semiconductor oscillator that generates an output signal having a frequency; sensing a first temperature of the integrated circuit; adjusting the first temperature to a predetermined temperature using a heater; measuring a frequency of the output signal using an external device; calculating and storing calibration parameters based on the frequency; and disabling the heater after the calibration parameters are stored in the memory.

In other features, the method includes sensing a temperature of the integrated circuit using a temperature sensor integrated with the integrated circuit; and selecting at least one of the calibration parameters based on the temperature, wherein the frequency of the output signal of the semiconductor oscillator is based on the selected one of the calibration parameters. The method includes adaptively adjusting a calibration approach for generating the calibration parameters based on a number of temperature test points input thereto. The method includes selecting the frequency of the output signal frequency as a function of an external passive component. The heater is selected from a group consisting of transistor heaters and resistive heaters.

In other features, when test data consists of a single temperature test point, the method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises employing at least one of a slope of a predetermined temperature characteristic line and a curvature of predetermined temperature characteristic curve; and adjusting a location of the at least one of the predetermined temperature characteristic line and the predetermined temperature characteristic curve based on the test data. When test data consists of two temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data. When test data comprises three temperature test points, the method further comprises adjusting at least one of a slope of a predetermined temperature characteristic line and a curvature of a predetermined temperature characteristic curve; and adjusting a location of the at least one of the predetermined temperature characteristic line and the predetermined temperature characteristic curve based on the test data.

A crystal oscillator emulator integrated circuit comprises a first temperature sensor that senses a first temperature of the integrated circuit. Memory stores calibration parameters and selects at least one of the calibration parameters based on the first temperature. A semiconductor oscillator generates an output signal having a frequency, which is based on the calibration parameters, and an amplitude. An amplitude adjustment module compares the amplitude to a predetermined amplitude and generates a control signal that adjusts the amplitude based on the comparison.

In other features, the semiconductor oscillator includes a resonating circuit. The semiconductor oscillator includes a bias adjusting circuit that receives the control signal and that generates a bias signal that biases the resonating circuit to adjust the amplitude based on the control signal. The bias signal includes a voltage bias signal. The bias signal includes a current bias signal. The resonating circuit includes an inductive-capacitive (LC) circuit and cross-coupled transistors that communicate with the LC circuit.

In other features, a select input selects the frequency of the output signal frequency as a function of an external passive component. A heater adjusts the first temperature. A disabling circuit disables the heater after the calibration parameters are stored. The heater operates in response to the first temperature sensor. The semiconductor oscillator is selected from a group consisting of inductive-capacitive (LC) oscillators, resistive capacitive (RC) oscillators and ring oscillators.

A crystal oscillator emulator integrated circuit comprises first temperature sensing means for sensing a first temperature of the integrated circuit; storing means for storing calibration parameters and for selecting at least one of the calibration parameters based on the first temperature; semiconductor oscillating means for generating an output signal having a frequency, which is based on the calibration parameters, and an amplitude; and amplitude adjustment means for comparing the amplitude to a predetermined amplitude and for generating a control signal that adjusts the amplitude based on the comparison.

In other features, the semiconductor oscillator means includes resonating means for resonating. The semiconductor oscillator means includes bias adjusting means for receiving the control signal and for generating a bias signal that biases the resonating means to adjust the amplitude based on the control signal. The bias signal includes a voltage bias signal. The bias signal includes a current bias signal. The resonating means includes inductive-capacitive (LC) resonating means for resonating, and cross-coupled transistors that communicate with the LC resonating means.

In other features, selecting means selects the frequency of the output signal frequency as a function of an external passive component. Heating means adjusts the first temperature. Disabling means disables the heater after the calibration parameters are stored. The heating means operates in response to the first temperature sensing means. The semiconductor oscillator means is selected from a group consisting of inductive-capacitive (LC) oscillating means, resistive capacitive (RC) oscillating means and ring oscillating means.

A method for operating a crystal oscillator emulator integrated circuit comprises sensing a first temperature of the integrated circuit; storing calibration parameters; selecting at least one of the calibration parameters based on the first temperature; providing a semiconductor oscillator that generates an output signal having a frequency, which is based on the calibration parameters, and an amplitude; comparing the amplitude to a predetermined amplitude; and generating a control signal that adjusts the amplitude based on the comparison.

In other features, the semiconductor oscillator includes a resonating circuit. The method includes generating a bias signal that biases the resonating circuit to adjust the amplitude based on the control signal. The bias signal includes a voltage bias signal. The bias signal includes a current bias. The method includes providing an inductive-capacitive (LC) circuit; and providing cross-coupled transistors that communicate with the LC circuit. The method includes selecting the frequency of the output signal frequency as a function of an external passive component. The method includes providing a heater that adjusts the first temperature; and disabling the heater after the calibration parameters are stored. The method includes operating the heater in response to the first temperature. The method includes selecting the semiconductor oscillator from a group consisting of inductive-capacitive (LC) oscillators, resistive capacitive (RC) oscillators and ring oscillators.

The semiconductor oscillator may comprise an inductance that includes one of Gold or Copper.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DESCRIPTION OF DRAWINGS

FIG. 1 is a block diagram showing an aspect of a crystal oscillator emulator.

FIG. 2 is a table showing a relationship between temperature and correction factor.

FIG. 3 is a graph showing a relationship between temperature and correction factor.

FIGS. 7A and 7B are diagrams showing relationships between an external impedance value and a digital value.

FIG. 8 is a block diagram of an aspect of an oscillator assembly for generating an output having a periodic waveform.

FIG. 9 is a block diagram of an aspect of a spread spectrum generator.

FIG. 11 is a block diagram of an aspect of a low power oscillator.

FIG. 12 is a block diagram of another aspect of a low power oscillator.

FIG. 20 is a functional block diagram illustrating an integrated circuit that is encapsulated in a packaging material according to the prior art;

FIG. 21 is a functional block diagram illustrating an integrated circuit with a temperature compensated on-chip semiconductor oscillator that is encapsulated in a packaging material having a low dielectric loss according to the present invention;

FIG. 22 illustrates one exemplary implementation of the integrated circuit package of FIG. 21 in further detail;

FIGS. 34A-34D are side cross-sectional views of alternate integrated circuit packages including annealed glass paste and/or epoxy portions and a glass or silicon layer that create an air gap;

FIGS. 35A-35B are side cross-sectional views of alternate integrated circuit packages including a "C"-shaped glass or silicon layer that creates an air gap;

FIGS. 36A-36C are side cross-sectional views of a wafer including multiple integrated circuit packages including annealed glass paste and/or epoxy portions and a glass or silicon layer that create air gaps;

FIGS. 37A-37B are side-cross-sectional views of integrated circuit packages including annealed glass paste and/or epoxy portions that have been coated with a conductive material.

FIG. 41 is a functional block diagram illustrating a crystal oscillator emulator having a calibration circuit that performs calibrations using one or more temperature test points;

FIG. 42 is a flow chart illustrating steps performed during calibration using a single temperature test point;

FIG. 51A is a functional block diagram of a semiconductor LC oscillator according to the prior art;

FIG. 51B illustrates amplitude drift as a function of time;

FIGS. 52, 53A and 53B are functional block diagrams of exemplary semiconductor oscillators according to the present disclosure;

Like reference symbols in the various drawings indicate like elements.

DETAILED DESCRIPTION

Figure 4:
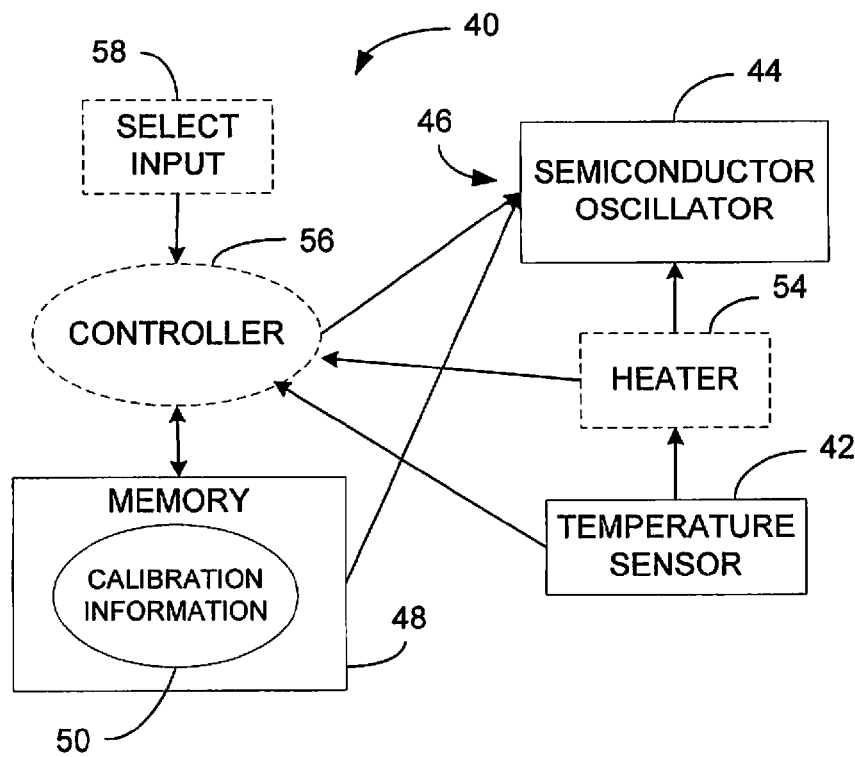
FIG. 4 is a block diagram showing an aspect of a crystal oscillator emulator.

FIG. 1 shows an aspect of a crystal oscillator emulator 10 for generating an output signal 12 having a precise frequency. The crystal oscillator emulator 10 may be constructed on a single semiconductor die using any process including a Complementary-Metal-Oxide-Semiconductor (CMOS) process.

The crystal oscillator emulator 10 may include a semiconductor oscillator 14 to generate the output signal 12. Any type of semiconductor oscillator may be used including LC oscillators, RC oscillators, and ring oscillators. The semiconductor oscillator 12 includes a control input 16 to vary the frequency of the output signal. The control input 16 may be any electrical input that effects a controlled change in the output signal frequency such as the supply voltage of a ring oscillator and a voltage input to a varactor of an LC oscillator.

A non-volatile memory 18 includes calibration information 20 for controlling the output signal frequency as a function of temperature. Any type of non-volatile memory may be employed including content addressable memory (CAM). The calibration information 20 may include a correction factor to be applied to the control input 16 of the semiconductor oscillator 14 to control the output signal frequency. The calibration information 20 may be a function of a change in temperature from a calibration temperature to an operating temperature, as well as being a function of absolute temperature.

A temperature sensor 22 may sense the temperature of the semiconductor die. Preferably, the temperature sensor is located on the semiconductor die in the vicinity of the semiconductor oscillator 14. Any type of temperature sensor 22 may be used including thermistors and infrared detectors. The temperature sensor 22 may be configured to measure a change in temperature from a baseline temperature or the present temperature.

FIG. 2 shows a storage technique 30 for storing the calibration information 20 in the non-volatile memory 18. The storage technique 30 may be any form of database including CAM, indexing schemes, look-up tables, and hash tables.

FIG. 3 shows a series of exemplary graphs 32 of correction factor values versus temperature for maintaining a constant output signal frequency for the crystal oscillator emulator 10. The data for constructing the curve may be attained in any manner including device-level testing and batch-mode testing.

Exemplary device-level testing may include testing each device to determine correction factors to be applied to the semiconductor oscillator to maintain a constant output frequency with changes in temperature. In one scheme, a baseline value for the semiconductor oscillator control input is determined for a predetermined frequency and at a predetermined temperature of the semiconductor die of the device such as the lowest operating temperature. The baseline value may be measured directly or interpolated from measurement of another device characteristic. Baseline values may also be measured for each potential output frequency. Also, baseline values for each potential output frequency may be extrapolated from the baseline value for the predetermined frequency such as by using a known circuit relationship. The baseline values for each potential output frequency may be stored as absolute values or as a ratio, a frequency factor, to compute the baseline values from a single baseline value.

The temperature of the semiconductor die is then increased from about the lowest operating temperature to about the maximum operating temperature in discrete steps. The number of discrete steps is preferably limited to about six temperature levels to reduce testing costs, but any number of discrete steps may be used. Preferably, an on-chip heater is used to heat the semiconductor die, but any means of varying the temperature of the semiconductor die may be employed. At each discrete step, the semiconductor die temperature and the correction factor for maintaining the output at a constant frequency may be measured.

The correction factor is preferably a ratio to be applied to the baseline value to obtain an adjusted value for the control input. The calibration factor may range from any baseline value such as 1. Preferably, a single correction factor is computed for each temperature step, to be applied to the semiconductor oscillator to maintain the output signal at any one of a multitude of predetermined frequencies. For example, if a correction factor of 1.218 is determined to correspond to a change in temperature of 45 C, then the control input of the semiconductor oscillator may be adjusted as a function of the correction factor such as by changing the control input in proportion to the correction factor. In another alternative, the correction factor may be applied to the baseline value corresponding to the desired output frequency to generate a calibrated value to which the control input is adjusted. In another alternative, correction factors may be measured corresponding to each of several output frequencies at each temperature step.

Batch-mode testing of crystal oscillator emulators 10 to obtain calibration information 20 may advantageously decrease costs by reducing the number of measurements for a batch of semiconductor dies. In batch-mode testing, the testing results for a subset of crystal oscillator emulators 10 from the same batch of semiconductor dies may be used for all of the devices in the batch. The subset of crystal oscillator emulators that are tested may range from one to any proportion of the total quantity of devices. For example, a single crystal oscillator emulator 10 may be tested and the resulting batch calibration information stored in each of the devices in the batch. In addition, each of the crystal oscillator emulators 10 may be tested for a subset of calibration information such as the output frequency at a baseline temperature. The subset of device specific calibration information may be used to modify the batch calibration information stored in each device.

FIG. 4 shows another aspect of a crystal oscillator emulator 40. The crystal oscillator emulator 40 is similar to crystal oscillator 10 in function with similar corresponding elements numbered in the range of 40-52, except that crystal oscillator emulator 40 may also include one or more of a heater 54, a controller 56, and a select input 58 alone or in combination.

The heater 54 may be located on the semiconductor die in the vicinity of the semiconductor oscillator 44 to provide a source of local heating. Any type of heater 54 may be used including transistor heaters and resistive heaters. The heater 54 may be operated in response to an input from the temperature sensor 52 to control the temperature of the semiconductor die. The heater 54 may increase the semiconductor die temperature to a level that corresponds to one of the temperature levels for which correction factors have been determined. In addition, a package having a high thermal impedance may enclose the crystal oscillator emulator 40.

In one case, the heater 54 may increase the semiconductor die temperature to the maximum operating temperature. Here, during device or batch level testing only the correction factor corresponding to the maximum operating temperature would have to be determined, leading to reduced costs.

The heater 54 may also be controlled to raise the semiconductor die temperature to one of several predetermined temperature levels for which correction factors have been determined. A second temperature sensor may sense an external temperature such as an ambient temperature or an assembly temperature. The heater 54 then may increase the semiconductor die temperature to the nearest of the predetermined temperature levels while continuously changing the control input during the temperature transition using extrapolated values computed from the correction factors.

The controller 56 may add extra functionality by for example controlling the heater 54 in response to multiple temperature sensors or manipulating the calibration information 50 to derive values for the control input that correspond to intermediate temperatures. The controller 56 may be any type of entity including a processor, logic circuitry, and a software module.

The select input 58 may be used for selecting specific output frequencies from within a range of output frequencies. The output frequency may be selected as a function of the impedance of an external component connected to the select input. The external component may be used directly as a portion of the semiconductor oscillator to select the output frequency, or indirectly such as selecting values of impedance within a predetermined range may correspond to predetermined output frequencies. The external component may be any component, but is preferably a passive component such as a resistor or capacitor.

Figure 5:
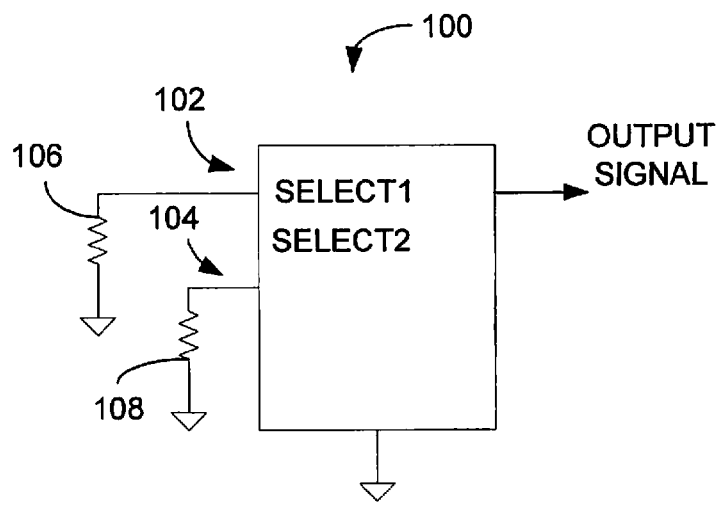
FIG. 5 is a two-dimensional view of an aspect of a crystal oscillator emulator connected to external impedances.

FIG. 5 shows an aspect of a crystal oscillator emulator 100 having, for example, two select pins 102 and 104 to connect to two external impedances 106 and 108. One or more pins may be used to interface to the external component(s). The crystal oscillator emulator 100 probes or derives information from the external components connected to the select pins 102 and 104. The derived information may have three or more predetermined level ranges that correspond to selected levels of the emulator characteristics. For example, a single pin connected to an external resistor may be used to select any one of 16 output frequency levels. The resistance of the external resistor is preferably selected to be one of 16 predetermined standard values. Each of the 16 values of resistance corresponds to one of the 16 output frequency levels. In addition, low precision passive components are preferably used as the external components to reduce cost and inventory. Each external component may have multiple, N, predetermined nominal values that each correspond to the selection of a predetermined characteristic level. If one pin is used, then N different characteristic levels may be selected. If two pins are used, then N*N different characteristic levels may be selected, and so forth for an increasing number of selection pins. The types of device characteristics that for example may be selected include output frequency, frequency tolerance, and baseline correction factor. For example, the crystal oscillator emulator 100 may have a single select pin 102 connected to an external resistor that may have a nominal value selected from a group of 16 predetermined values. Each of the 16 predetermined values has a measured value range which corresponds to one of 16 predetermined output frequency levels possibly ranging from 1 MHz to 100 MHz.

The external impedances 106 and 108 are preferably resistors, capacitors, or combinations of resistors and capacitors, but may be any component that exhibits predominantly an inductance, resistance, capacitance, or combination thereof. The external impedances 106 and 108 may be connected directly or indirectly from any energy source such as Vdd and ground or any suitable reference to the pins 102 and 104. For example, the external impedance 106 may be connected through a resistor/transistor network to Vdd and through a capacitor network to the select pin 102.

The crystal oscillator emulator 100 may determine a predetermined select value corresponding to the measured value of the impedance connected to a select pin. Preferably, the impedance is selected to have a standard value such as nominal resistance values corresponding to resistors having a 10% tolerance (e.g. 470, 560, 680, . . . ) to reduce device and inventory costs. To account for measurement tolerances and the tolerance of the external impedance, a range of impedance values may correspond to a single select value. The select value is preferably a digital value, but may also be an analog value. For example, values of measured resistance from 2400 ohms to 3000 ohms may be associated with a digital value corresponding to 2. While values of measured resistance from 3001 ohms to 4700 ohms are associated with a digital value corresponding to 3. The measured resistance includes variations due to tolerances of the external impedance and the internal measurement circuit. The impedance measured at each select pin is used to determine a corresponding digital value. The range of digital values may include 3 or more digital values and preferably range from 10 to 16 digital values per select pin. The digital values corresponding to each select pin may be used in combination to describe memory addresses. For example, a device having three select pins each to interface to impedance values that are mapped into one of 10 digital values, may describe 1000 memory addresses or lookup table values. The contents of the storage locations corresponding to the memory addresses are used to set a value for an output or internal characteristic of the device. Another exemplary device may include two select pins, each configured to interface to external impedances that are mapped to a digital value within a range of 10 values. The digital values in combination may describe 100 memory addresses or lookup table values that may each contain data for setting a characteristic of the crystal oscillator emulator 100.

Figure 6:
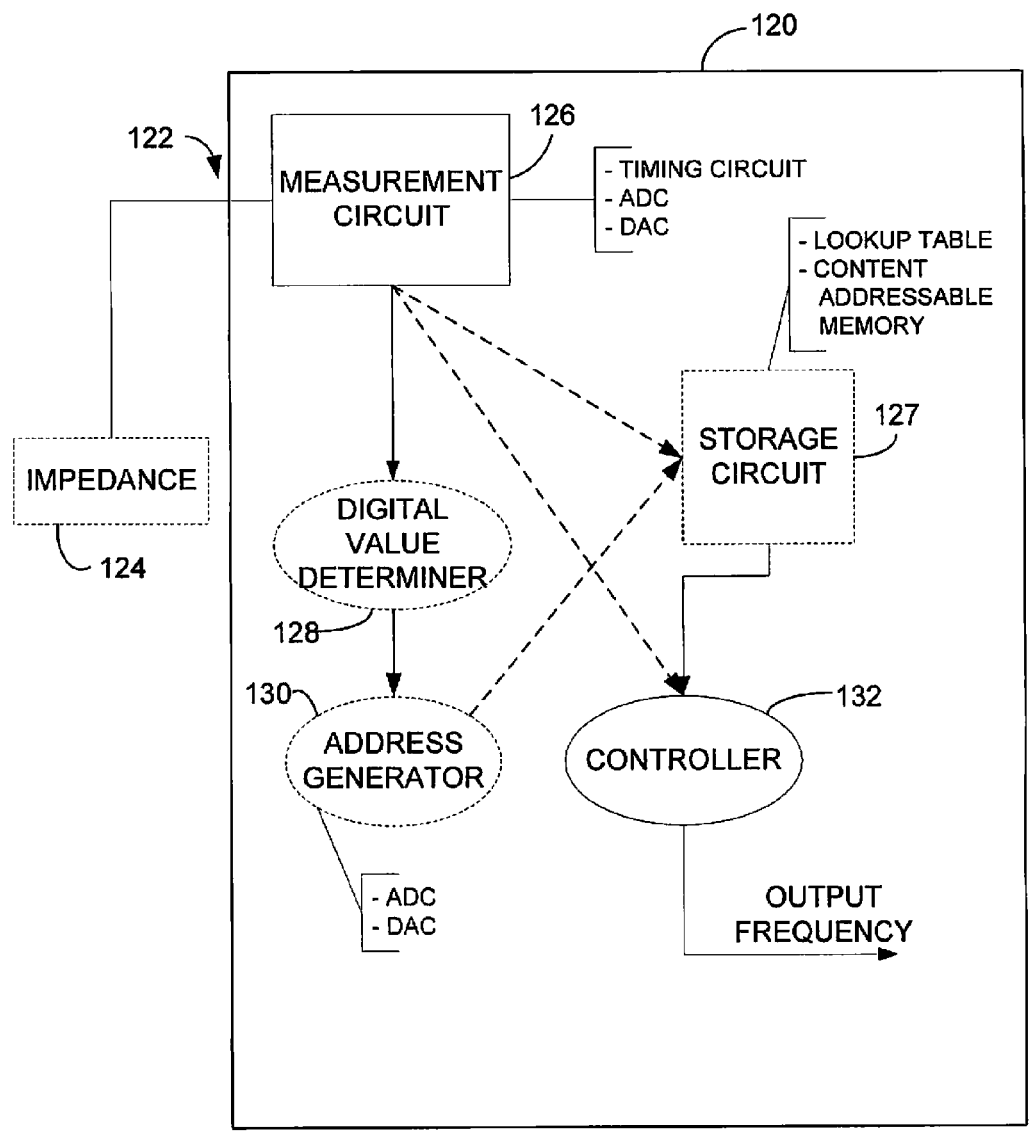
FIG. 6 is a detailed block diagram of an aspect of a crystal oscillator emulator connected to an external impedance.

FIG. 6 shows a block diagram of an aspect of a crystal oscillator emulator 120. The crystal oscillator emulator 120 includes a select pin 122 to interface to an external impedance 124 that is used for selecting a configuration of the crystal oscillator emulator 120. The external impedance 124 is similar in function and scope to the external impedances 116 and 118.

A measurement circuit 126 connected to the select pin 122 measures an electrical characteristic that is a function of the external impedance 124. For example, a current may be supplied to the external impedance and the voltage that is developed across the external impedance 124 then measured. Also, a voltage may be impressed across the external impedance 124 and then measure the current. Any measurement technique for measuring passive components may be used to measure the electrical characteristic including dynamic as well as static techniques. Exemplary measurement techniques include timing circuits, analog to digital converters (ADCs), and digital to analog converters (DACs). Preferably, the measurement circuit has a high dynamic range. The measurement circuit 126 may generate an output having a value corresponding to the value of the external impedance 124. The output may be either digital or analog. The same output value preferably represents a range of external impedance values to compensate for value variations such as tolerances in the external impedance value, interconnect losses, and measurement circuit tolerances due to factors including process, temperature, and power. For example, all measured external impedance values ranging from greater than 22 up to 32 ohms may correlate to a digital output value of "0100". While measured external impedance values ranging from greater than 32 up to 54 ohms may correlate to a digital output value of "0101". The actual external impedance values are a subset of the measured external impedance value to account for the value variations. For example, in the above cases the actual external impedance values might be from 24 to 30 ohms and from 36 to 50 ohms. In each case an inexpensive low precision resistor may be selected to have a value centered within the range, such as 27 ohms and 43 ohms. In this way, inexpensive low precision components may be used to select amongst a range of high precision outputs. The select value may be used directly as a variable value to control a device characteristic of the crystal oscillator emulator 120. The variable value may also be determined indirectly from the select value.

A storage circuit 127 may include variable values that may be selected as a function of the select value. The storage circuit 127 may be any type of storage structure including content addressable memory, static and dynamic memory, and look-up tables.

For the case that the measurement circuit 126 generates output values that have a one-to-one correspondence to the external impedance values, a digital value determiner 128 may then set the output value to a select value that corresponds to a range of external impedance values.

FIG. 7A shows a relationship between groups of impedance values 150 and associated select values 154. The groups of impedance values 150 may have a one-to-one correspondence to groups of digital output values 152 which are converted to the select values 154 associated with each of the groups of impedance values 150. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. The spacing between the groups of impedance values is preferably based on geometric progression, however any mathematical relationship may be used to establish spacing between the groups such as logarithmic, linear, and exponential. The spacing between impedance groups may be based on any impedance value of the groups including a nominal value, an average value, a mean value, a starting value, and an ending value. Factors that influence selection of the impedance range of the groups and the spacing may include various tolerances such as the tolerance of the external impedance, the tolerance of internal voltage and current sources, and the tolerance of the measurement circuit. The tolerances may for example be caused by process, temperature, and power variations.

FIG. 7B shows a relationship between ranges of impedance values 156 and associated select values 158. The ranges of impedance values 156 have a direct correspondence to the select values 158. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. This direct correspondence between the ranges of impedance values 156 and associated select values 158 may be implemented by, for example, a nonlinear analog to digital converter (not shown).

Referring back to FIG. 6, an address generator 130 may determine memory locations corresponding to the digital output values associated with external impedances connected to the select pins. The memory locations may be grouped in any manner such as a list for a single select pin, a lookup table for two select pins, and a third order table for three select pins.

A controller 132 may set a device characteristic of the crystal oscillator emulator 120 as a function of the variable value. The variable value may be generated directly by the measurement circuit, determined indirectly from the select value, and determined from the contents of a memory location corresponding to the external impedance values connected to the select pins.

The select pin 124 may also be used for implementing an additional function such as power down (PD), power enable, mode selection, reset, and synchronous operation. In this aspect, the select pin 124 becomes a multi-purpose select pin 124 for configuring the crystal oscillator emulator 120 as well as implementing the additional function.

In one aspect, a first range of impedance values connected to the multi-purpose select pin 124 may be used to configure the crystal oscillator emulator 120, while operation of the additional function may be controlled by a voltage or current impressed on the multi-purpose select pin 124, or impedance values outside the first range of impedance values.

FIG. 8 shows an aspect of an oscillator assembly 200 to generate an output having a periodic waveform. The oscillator assembly 200 includes a crystal oscillator emulator 202 to drive a phase lock loop (PLL) 204. The crystal oscillator emulator 202 may be similar in function and structure to the aspects of the crystal oscillator emulators described above. The oscillator assembly 200 may include any type of PLL 204 such as digital PLLs and analog PLLs.

Multi-purpose select pins 206 and 208 may be used for selection of the operating parameters for the PLL 204 such as the divider factor. The multi-purpose select pins 206 and 208 may also be used for control and operation of the crystal oscillator emulator 202 such as output frequency selection and reception of a reference clock for calibration. External resistors 210 and 212 may be connected to the multi-purpose select pins 206 and 208 to select the operating frequency. The ranges of values of the external resistors 210 and 212 correspond to the selection of different operating frequencies. Each external resistor 210 and 212 may be used to select one of 16 predetermined operating frequencies. In combination, the external resistors 210 and 212 may select from amongst 256 operating frequencies. To control multiple functions, each of the multi-purpose select pins 206 and 208 may receive signals within different voltage ranges. For example, one multi-purpose select pin 206 may connect to an external resistor 210 across which a voltage in the range of 0 to 2 volts may be developed to determine the resistance, and the multi-purpose select pin 206 may also receive a reference clock signal operating in a range of 2 to 3 volts. A decoder 214 may detect signals on the multi-purpose select pins 206 and 208.

FIG. 9 shows a spread spectrum oscillator 300 for generating an output signal having a variable frequency. The spread spectrum oscillator 300 includes a crystal oscillator emulator 302 connected to a PLL 304. A frequency control device connected to the crystal oscillator emulator 302 may dynamically control the output frequency of the crystal oscillator emulator 302. The frequency control device may be any device or technique including a varactor, controlling the bias current source of the semiconductor oscillator, and controlling the control input voltage applied to the resonant capacitors of the semiconductor oscillator.

Figure 10:
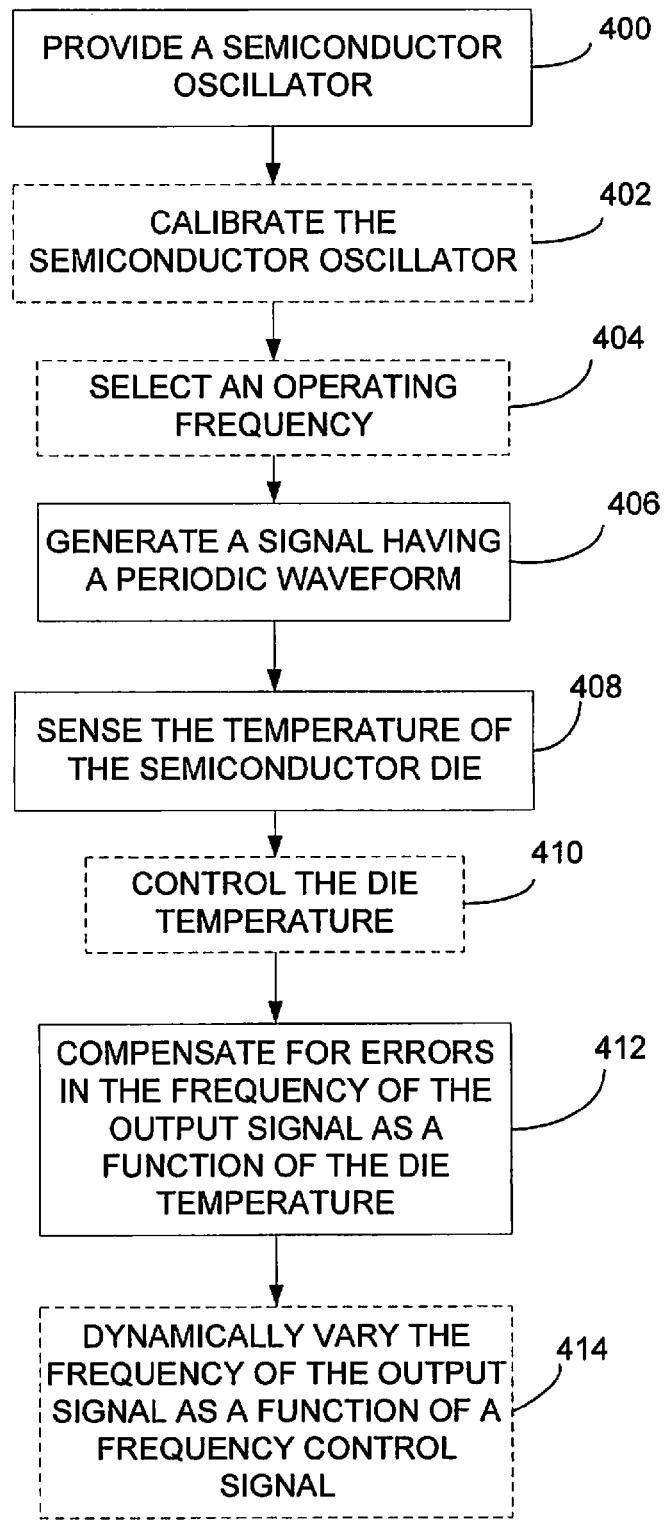
FIG. 10 is a flow diagram of an operation for emulating a crystal oscillator.

FIG. 10 shows the operation of an aspect of a crystal oscillator emulator. At block 400, a semiconductor oscillator is provided for generating an output signal having a periodic waveform. Continuing to block 402, the semiconductor oscillator may be calibrated to generate a constant frequency over a predetermined range of temperature. In one aspect, the calibration may include varying the temperature of the semiconductor die over a predetermined temperature range and measuring calibration information for maintaining a constant output frequency. The die temperature may be measured in the vicinity of the semiconductor oscillator. The calibration information may include control input values versus die temperatures for maintaining a constant output frequency. The calibration information may be stored in non-volatile memory on the semiconductor die. At block 404, an operating frequency may be determined by probing an external component. Continuing to block 406, the semiconductor oscillator generates an output signal having an operating frequency. At block 408, the temperature of the semiconductor die is determined in the vicinity of the semiconductor oscillator. Continuing to block 410, the semiconductor die may be heated or cooled to control the die temperature to one or more predetermined temperature levels. At block 412, the control input may be controlled as a function of the die temperature to compensate for changes in the operating frequency of the output signal caused by temperature changes. The stored calibration information may be used to control the control input. The calibration information may be used directly for die temperatures that correspond to stored temperatures. For other die temperatures, the control input value may be extrapolated from the stored calibration information. Continuing to block 414, the frequency of the output signal may be dynamically varied as a function of a frequency control signal.

FIG. 11 shows an aspect of a low power oscillator 320 for generating a periodic signal. The low power oscillator 320 includes a crystal oscillator emulator 322 to calibrate an active silicon oscillator 324. The crystal oscillator emulator 322 is normally in the off state to reduce power consumption. At predetermined intervals, the crystal oscillator emulator 322 is switched to the powered on state to calibrate the active silicon oscillator 324. The active silicon oscillator 324 consumes less power than the crystal oscillator emulator 322, so operating the active silicon oscillator 324 continuously while only operating the crystal oscillator emulator 322 intermittently reduces the overall power consumption of the low power oscillator 320. Any type of active silicon oscillator may be used including ring oscillators and RC oscillators. The crystal oscillator emulator 324 may be configured in accordance with any of the aspects of the invention as described and shown in this specification.

A summer 326 may determine the frequency error between the active silicon oscillator output and the crystal oscillator emulator output. A controller 328 may generate a control signal, based on the frequency error, to control the frequency of the active silicon oscillator 324. The controller 328 may also receive temperature information from the crystal oscillator emulator 322. The temperature information may include temperatures such as the temperature of the semiconductor and the ambient temperature. The controller 328 may include calibration information for the active silicon oscillator 324 similar to the calibration information for the crystal oscillator emulator 322. The frequency error may be used to set an initial value for the control signal and then the temperature information in combination with the active silicon oscillator calibration information may be used to update the control signal while the crystal oscillator emulator 322 is powered down. In one aspect, the temperature sensing circuit of the crystal oscillator emulator 322 may remain continuously powered so that continuous temperature information may be supplied to the controller 328. The control signal 334 may be either digital or analog. If the control signal is digital, a digital-to-analog converter (DAC) 330 may convert the control signal to analog.

A regulator 332 may, in response to the control signal 334, control the supply of power for the active silicon oscillator 324 to adjust the operating frequency. The supply of voltage and/or current to the active silicon oscillator 324 may be controlled. For example, the regulator 332 may control the voltage level of the supply voltage.

In operation, the active silicon oscillator 324 is normally in the on state generating a periodic output signal. The crystal oscillator emulator 322 is normally in the off state. In the off state, either all or a portion of the crystal oscillator emulator 322 may be powered off to conserve power. At a predetermined time, power is applied to the crystal oscillator emulator 322. The semiconductor oscillator of the crystal oscillator emulator 322 is then calibrated with the stored calibration information. The frequency of the output signal of the crystal oscillator emulator 322 is compared with the frequency of the output signal of the active silicon oscillator 324 to determine the frequency error of the active silicon oscillator 324. The control signal 334 changes in response to the frequency error, causing a shift in the supply voltage from the voltage regulator 332, leading to a change in the output frequency of the active silicon oscillator 324, reducing the frequency error.

FIG. 12 shows an aspect of another low power oscillator 350 for generating a periodic signal. The low power oscillator 350 includes a crystal oscillator emulator 352 in communication with a charge pump oscillator 354. The crystal oscillator emulator 352 is normally in the powered down state to reduce power consumption. During the powered down state, either all or a portion of the crystal oscillator emulator 352 may be powered down. At predetermined intervals, the crystal oscillator emulator 352 may be powered up and used to calibrate the charge pump oscillator 354. The predetermined intervals may be determined as a function of any circuit parameter such as operating time, temperature change of the semiconductor, ambient temperature change, temperature of the semiconductor, and supply voltage change.

The charge pump oscillator 354 may include a charge pump 356, loop filter 358, voltage controlled oscillator (VCO) 360, and phase detector 362. The charge pump oscillator 354 is similar in operation to conventional charge pump oscillators, except that the reference input of the phase detector 362 receives a reference clock signal from the crystal oscillator emulator 352.

A multiplexer 364 receives the output signals from the crystal oscillator emulator 352 and the charge pump oscillator 354. One of the output signals is selected and passed through the multiplexer 375 to a phase locked loop 366. The phase locked loop 366 generates an output signal as a function of the output signals from the crystal oscillator emulator 352 and the charge pump oscillator 354.

In operation, the charge pump oscillator 354 is normally in the on state generating a periodic output signal. The crystal oscillator emulator 352 is normally in the off state. In the off state, either all or a portion of the crystal oscillator emulator 352 may be powered off to reduce power consumption. At a predetermined time, power is applied to the crystal oscillator emulator 352. The semiconductor oscillator of the crystal oscillator emulator 352 is then calibrated with the stored calibration information. The output signal of the crystal oscillator emulator 352 is compared with the output signal of the charge pump oscillator 354 to determine the phase error of the charge pump oscillator 324. The VCO 360 is then controlled to reduce the phase error so that the output signal of the charge pump oscillator 354 is calibrated to the output signal of the crystal oscillator emulator 352. One of the output signals may then be selected and applied to the PLL 366.

Figure 13:
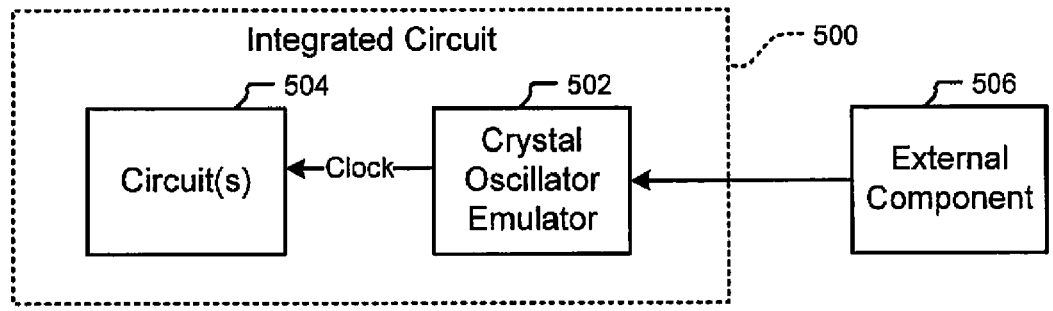
FIG. 13 is a functional block diagram of an integrated circuit including one or more circuits and a crystal oscillator emulator that generates a clock signal for the one or more circuits.
Figure 14:
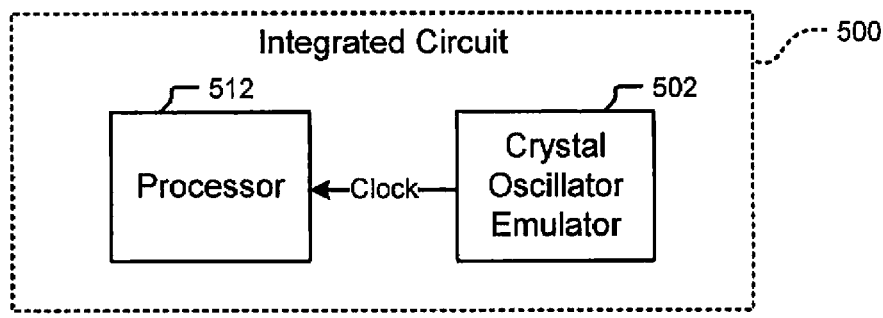
FIG. 14 is a functional block diagram of an integrated circuit including a processor and a crystal oscillator emulator that generates a clock signal for the processor.
Figure 15:
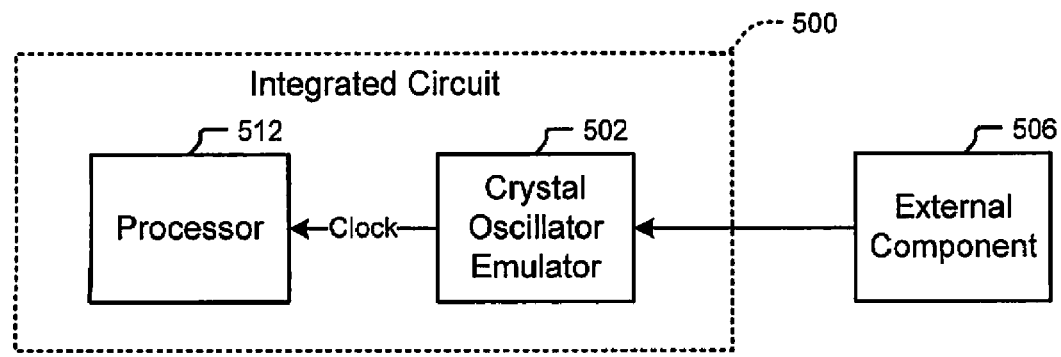
FIG. 15 is a functional block diagram of an integrated circuit including a processor and a crystal oscillator emulator that generates a clock signal for the processor and that employs an external component for setting clock speed.

Referring now to FIGS. 13-15, an integrated circuit 500 includes a crystal oscillator emulator 502 that generates a clock signal. One or more circuits 504 in the integrated circuit 500 receive the clock signals. The crystal oscillator emulator 502 can be implemented as described above in conjunction with FIGS. 1-12. The circuits 502 can include a processor 512 as shown in FIG. 14 or other circuits. An external component 506 can optionally be used to select the clock frequency of the crystal oscillator emulator 502 as shown in FIGS. 13 and 15.

Figure 16:
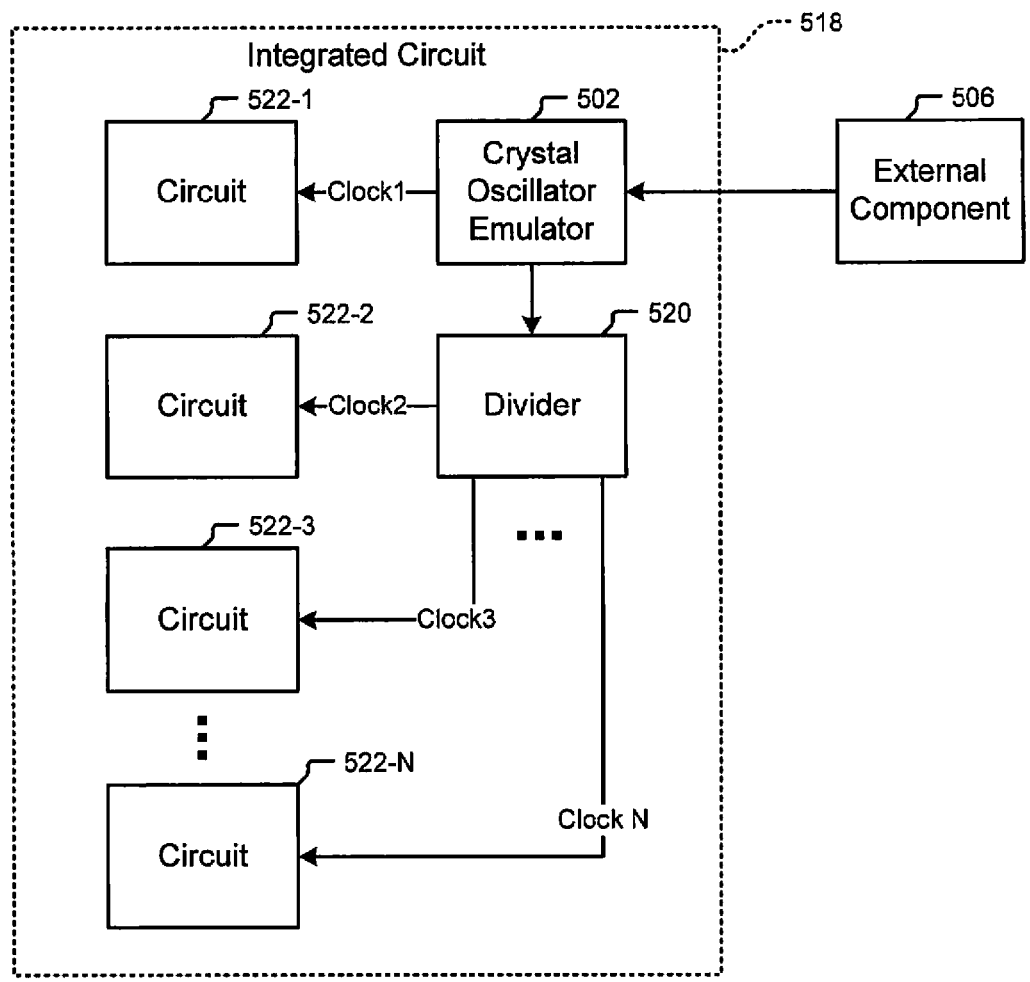
FIG. 16 is a functional block of an integrated circuit including one or more circuits, a crystal oscillator emulator and a clock divider that generates clock signals at one or more other clock frequencies.
Figure 17:
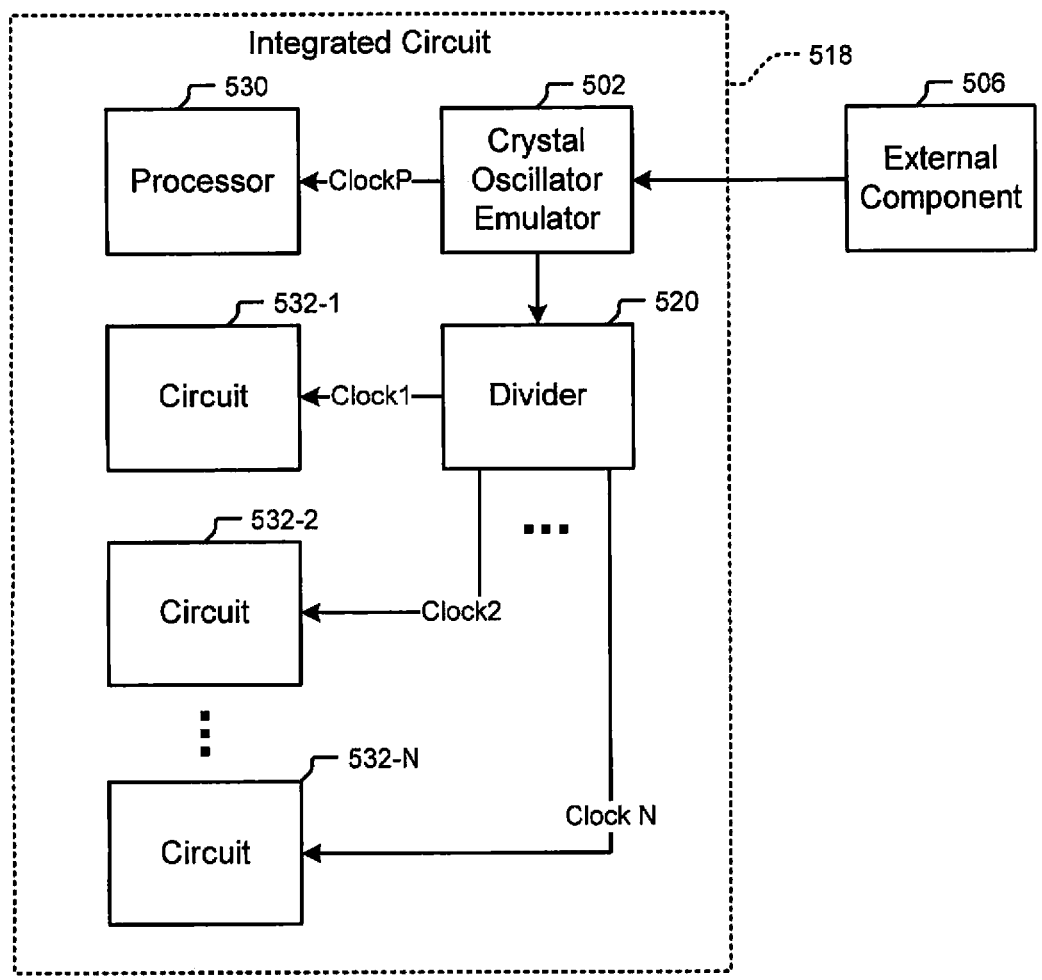
FIG. 17 is a functional block of an integrated circuit including a processor, one or more circuits, a crystal oscillator emulator and a clock divider that generates clock signals at other clock frequencies.
Figure 18:
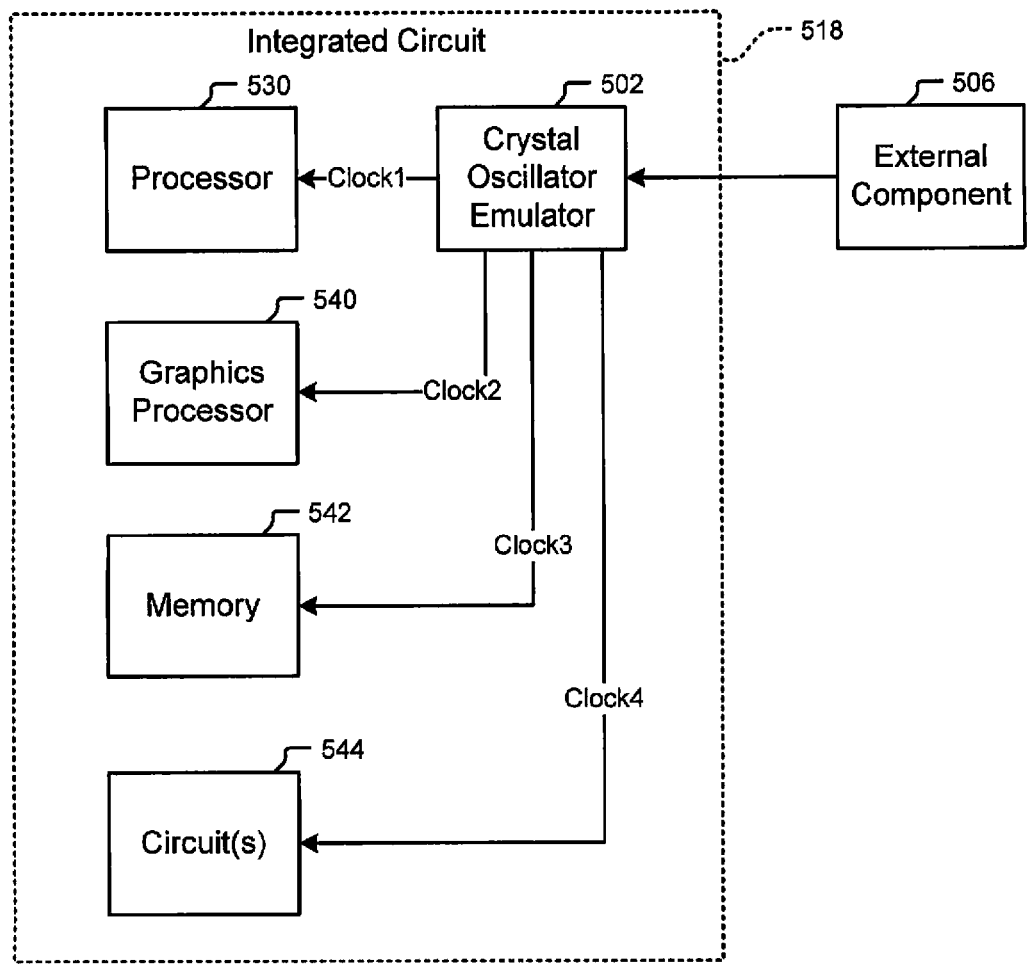
FIG. 18 is a functional block of an integrated circuit including a processor, a graphic processor, one or more circuits, memory and a crystal oscillator emulator that generates clock signals.

Referring now to FIGS. 16-18, an integrated circuit 518 includes a clock divider 520 that generates clock signals at other one or more other clock frequencies for circuits 522-1, 522-2, . . . , and 522-N (collectively circuits 522). The circuits 522 may be interconnected to each other in any manner. The clock divider 520 divides the clock by an integer such as X and/or multiplies the clock signal by Y for 1/X, Y and/or Y/X adjustments. The clock divider 520 may also use one or more additional ratios and/or divisors for producing different clock signals for other circuits 522. The clock divider 520 outputs N−1 clock signals as shown to N−1 circuits 522 in the integrated circuit 518.

In FIG. 17, one of the circuits includes a processor 530. The processor 530 can be connected to the clock divider 520 instead of and/or in addition to the crystal oscillator emulator 502. Additional circuits 532-1, 532-1, and 532-N communicate with the clock divider 520.

In FIG. 18, the crystal oscillator emulator 502 provides clock signals for a processor 530, a graphics processor 540, memory 542 and/or one or more circuits 544 in the integrated circuit 518. A clock divider (not shown) may also be provided. The processor 530, graphics processor 540, memory 542 and/or other circuits 544 may be interconnected in any suitable manner.

Figure 19:
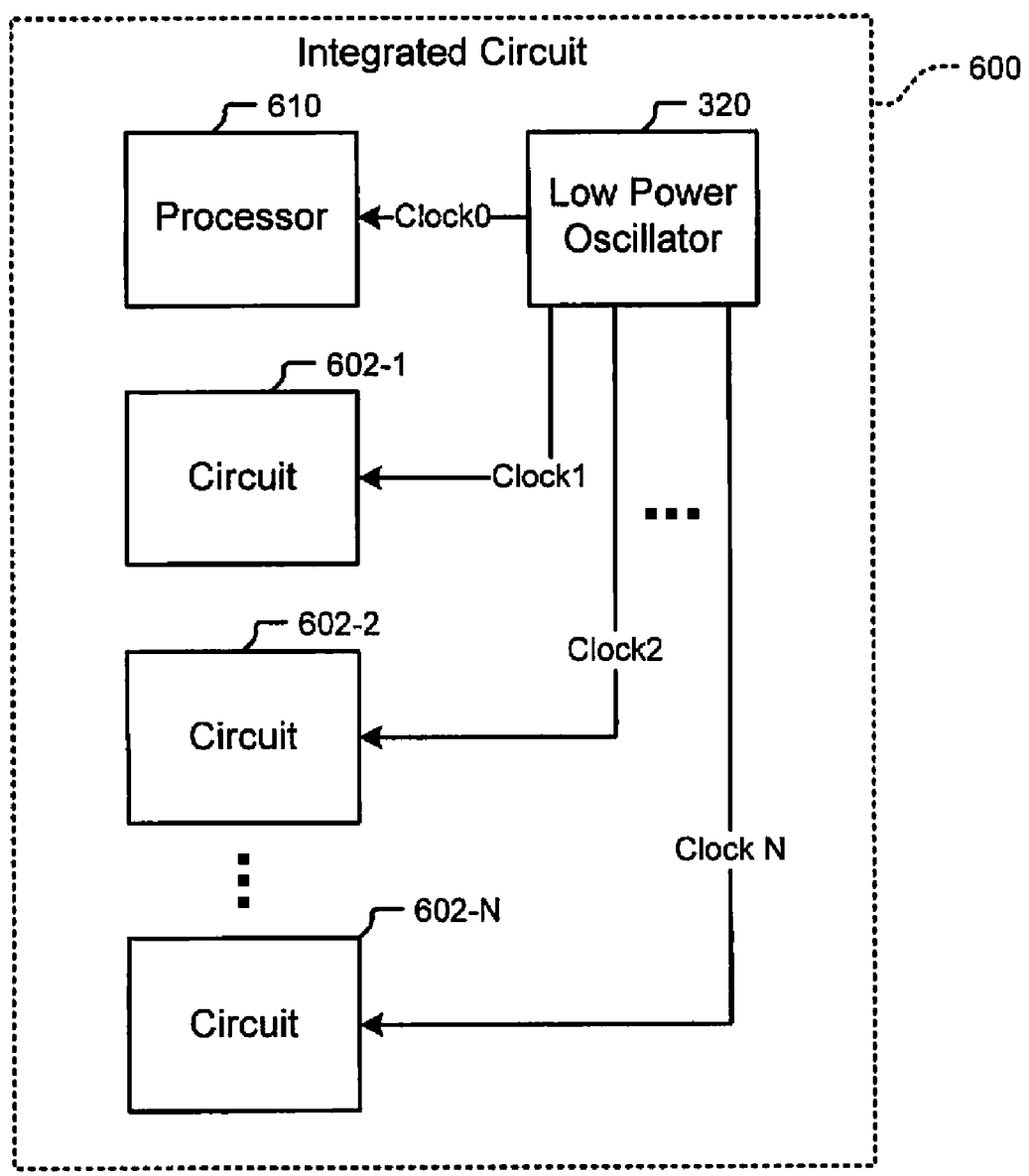
FIG. 19 is a functional block diagram of an integrated circuit including a processor and the low power oscillator of FIG. 11.

Referring now to FIG. 19, an integrated circuit 600 includes one or more circuits 602-1, 602-2, . . . , and 602-N (collectively circuits 602) and the low power oscillator 320, which operates as described above in conjunction with FIG.

11. One of the circuits may include a processor as shown at 610. A clock divider (not shown) may also be provided as described above.

Integrated circuits (IC) are typically encased in a packaging material. The packaging material may include plastic. The IC substrate may include pads that are connected to leads of a lead frame by bondwires. The IC substrate, the bondwires and portions of the leads may be encased in the plastic. The properties of the packaging material that is normally used in packaging the IC may change over time. The changes may cause an oscillation frequency of an on-chip oscillator to drift over time. The changes in the packaging may be due to changes in the dielectric loss of the packaging material over time. The changes in the packaging may also be due to water absorption of the packaging material at different humidity levels. As a result, the packaging material may limit the achievable calibrated accuracy.

Referring now to FIG. 20, an integrated circuit 700 is encapsulated in a packaging material 704 according to the prior art. As can be appreciated, characteristics of the packaging material 704 may change over time and/or as a function of environmental conditions. For example, when the packaging material 704 includes plastic material, the dielectric loss of the plastic material may change over time, which may have an adverse impact upon calibration accuracy. As used herein, the term dielectric loss refers to loss of energy that eventually produces a rise in temperature of a dielectric placed in an alternating electrical field. Heating is due to "molecular friction" of dipoles within the material as the dipoles try to reorient themselves with the oscillating (electrical) field of the incident wave. For example, when heating food in a microwave, the dipoles associated with water in the food vibrate and are heated. Some materials such as certain plastics are not suitable for use in microwaves since they absorb too much heat. These materials have high dielectric loss characteristics. Other materials such as other types of plastics experience little or no heating. These materials have lower dielectric loss characteristics. Since the circuits described herein may operate at microwave frequencies, low dielectric loss materials are preferred.

Water absorption of the plastic material over time may also adversely impact calibration accuracy. Since water has a high dielectric loss, increased water content in the packaging material tends to increase the dielectric loss of the packaging material. In other features, the packaging material may also be a low stress material. High stress materials tend to warp, which may affect circuit characteristics of adjacent circuits such as by changing channel lengths. As used herein, the term low stress refers to packaging materials that tend to be stable and not change the electrical characteristics of the integrated circuit due to changes in stress. In some implementations, the packaging material has a dielectric loss factor (DLF) that is less than or equal to Teflon at the relevant frequency of operation, such as greater than 1 GHz.

Referring now to FIG. 21, an integrated circuit 710 with an on-chip semiconductor oscillator 711 with temperature compensation is shown encapsulated in a packaging material 714 having a low dielectric loss according to the present invention. The packaging material 714 may be a plastic packaging material having low dielectric loss. As used herein, the term "low dielectric loss" refers to materials having a dielectric loss that is less than or equal to Teflon at a relevant operating frequency of the IC. The operating frequency of the IC may be above 1 GHz and/or 2.4 GHz. The packaging material 714 may also comprise Teflon®, Teflon® PolyChloroTriFluoroEthylene (PCTFE), Teflon® Teflon® fluorinated ethylene propylene copolymer (FEP), perfluoroalkoxy) (PFA), Tefzel® and Teflon® copolymer of ethylene and tetrafluoroethylene (ETFE), low dielectric loss plastic, high quality glass, air and/or other materials. Any other packaging materials having dielectric loss that is less than or equal to Teflon are contemplated. The packaging material also may have relatively low water absorption.

Referring now to FIG. 22, an exemplary implementation of the integrated circuit package of FIG. 21 is shown in further detail. An integrated circuit package 718 includes an integrated circuit 724 that includes pads 728. Leads 732 of a lead frame 733 are connected by bondwires 734 to the pads 728 of the integrated circuit. As can be appreciated, the integrated circuit includes an on-chip semiconductor oscillator with temperature compensation as described above. Portions of the leads 732, the bond wires 734 and the integrated circuit 724 are encapsulated in a packaging material 736. The packaging material 736 may be a plastic packaging material having low dielectric loss. As can be appreciated, other types of packaging such as ball grid array (BGA), flip chip and/or any other suitable packaging technique may be employed in this embodiment and/or others that precede or follow.

Figure 23:
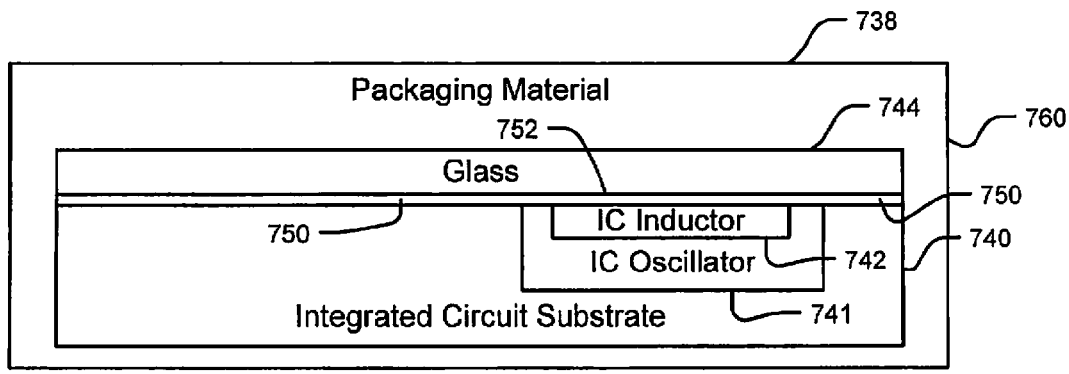
FIG. 23 is a side cross-sectional view of an alternate integrated circuit package including an on-chip semiconductor oscillator according to the present invention.

Referring now to FIG. 23, an alternate integrated circuit package 738 includes an on-chip, temperature-compensated semiconductor oscillator 741 according to the present invention. In this embodiment, the semiconductor oscillator 741 comprises an integrated circuit inductor 742. A glass layer 744 is bonded to the integrated circuit substrate 740 using a very thin epoxy layer 750. The epoxy layer 750 may have a low dielectric loss. The glass layer 744, the epoxy layer 750 and the integrated circuit substrate 740 are encapsulated in a packaging material 760. In this case, the dielectric loss of the packaging material is less critical due to the distance between the inductor 742 and the packaging material 760. Therefore, changes in the dielectric loss and/or other characteristics of the packaging material 760 are less critical as a function of time. However, the packaging material can be low dielectric loss material. While the glass layer is shown over the entire integrated circuit, the glass layer may be limited to a smaller region immediately adjacent to the semiconductor oscillator.

Figure 24:
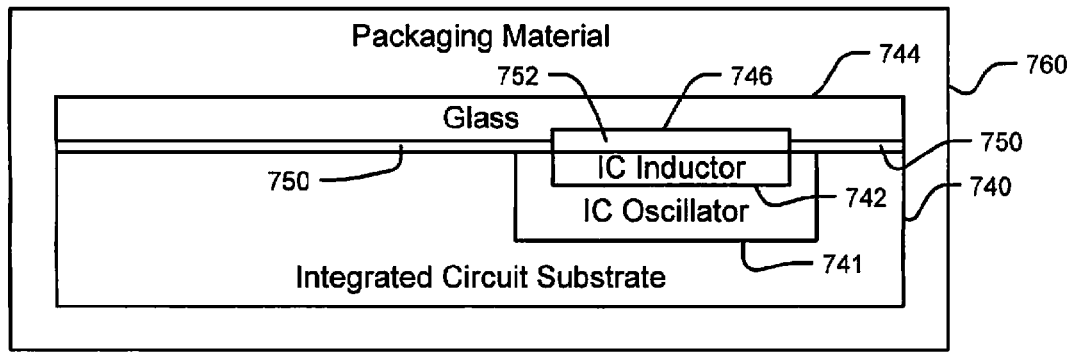
FIG. 24 is a side cross-sectional view of an alternate integrated circuit package including an on-chip semiconductor oscillator according to the present invention.
Figure 25:
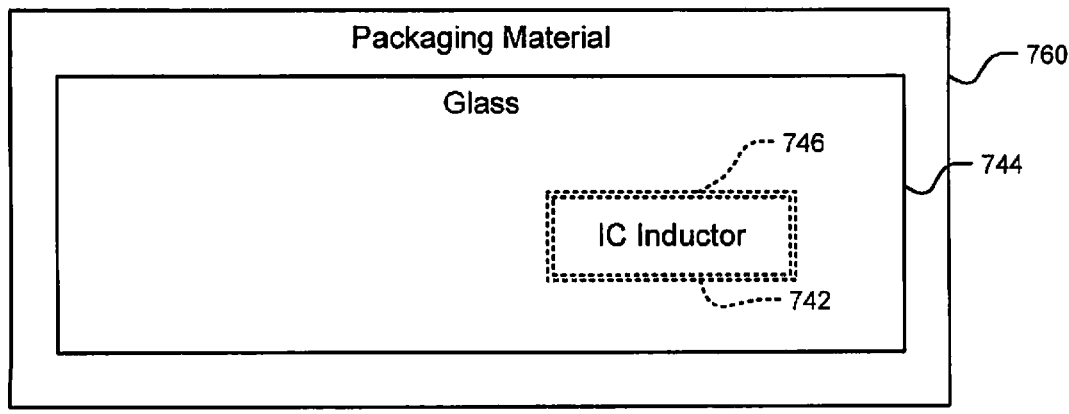
FIG. 25 is a plan cross-sectional view illustrating the integrated circuit package of FIG. 24 in further detail.

Referring now to FIGS. 24 and 25, an alternate integrated circuit package including an on-chip semiconductor oscillator according to the present invention is shown. This embodiment is similar to that shown and described above in conjunction with FIG. 23. However, the glass layer 744 defines a cavity 746. The cavity 746 is adjacent to, aligned with and extends over the inductor 742. An air cavity 752 is formed between the inductor 742 and the glass layer 744. A thin epoxy layer 750 is formed between the glass layer 744 and the integrated circuit substrate 740 in areas other than the cavity 746. The glass layer 744 may be etched to define the cavity and dipped in epoxy. Adjacently, the glass layer may include multiple layers of glass and at least one layer has a cavity formed therein.

Figure 26:
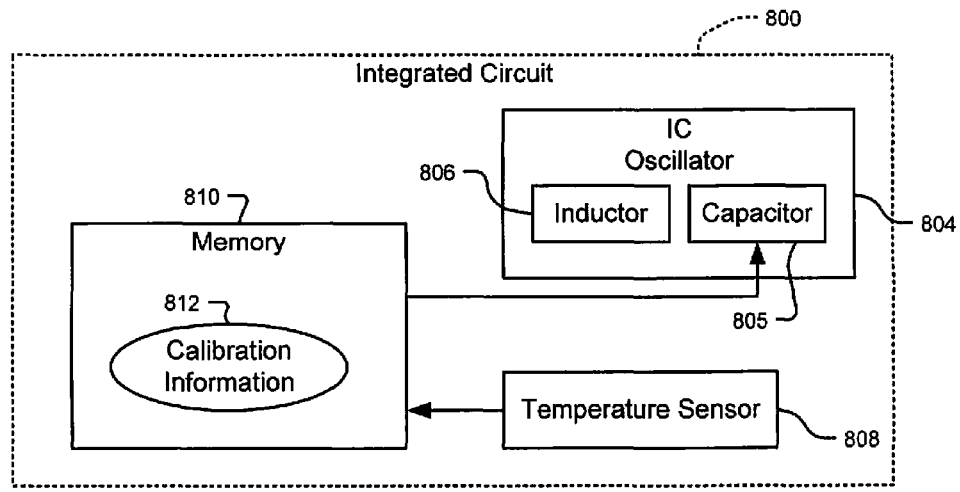
FIG. 26 is a functional block diagram illustrating tuning of a capacitor of an on-chip semiconductor oscillator based upon temperature compensation.

Referring now to FIG. 26, a capacitor of an on-chip semiconductor oscillator may be adjusted based upon temperature compensation as previously described above. As can be appreciated, however, there are other ways of adjusting the oscillating frequency independent from adjusting the capacitor and/or inductor of the semiconductor oscillator.

Figure 27:
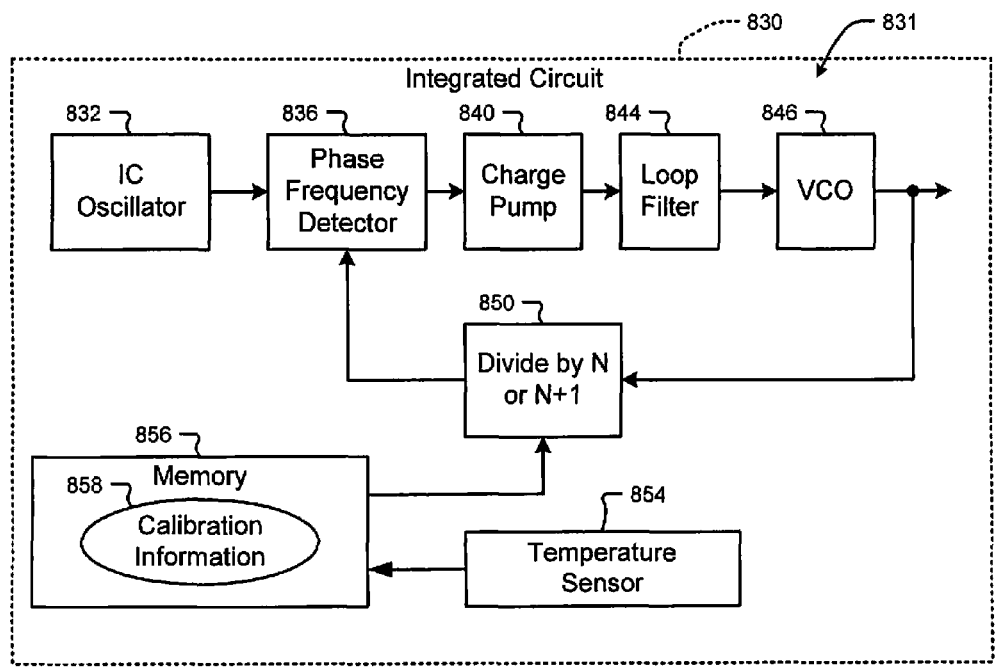
FIG. 27 is a functional block diagram of a fractional phase locked loop (PLL) that includes a temperature compensation input.

Referring now to FIG. 27, an integrated circuit 830 includes a fractional phase locked loop 831 with a temperature compensation input. The fractional phase locked loop 831 includes a phase frequency detector 836 that receives an output of the integrated circuit oscillator 832, which operates as described above. The phase frequency detector 836 generates a differential signal based on a difference between a reference frequency and a VCO frequency. The differential signal is output to a charge pump 840. An output of the charge pump 840 is input to an optional loop filter 844. An output of the loop filter 844 is input to a voltage controlled oscillator (VCO), which generates a VCO output having a frequency that is related to a voltage input thereto. An output of the VCO 846 is fed back to a scaling circuit 850. The scaling circuit 850 selectively divides the VCO frequency by N or N+1. While N and N+1 divisors are employed, the divisors may have other values.

An output of the scaling circuit 850 is fed back to the phase frequency detector 836. A temperature sensor 850 measures a temperature of the integrated circuit 830 in the region near the IC oscillator 832. The temperature sensor 850 outputs a temperature signal that is used to address calibration information 858 that is stored in memory 856. The selected calibration information is used to adjust the scaling circuit 850. The selected calibration information adjusts a ratio of the divisors N and N+1 that are used by the scaling circuit 844.

Figure 28:
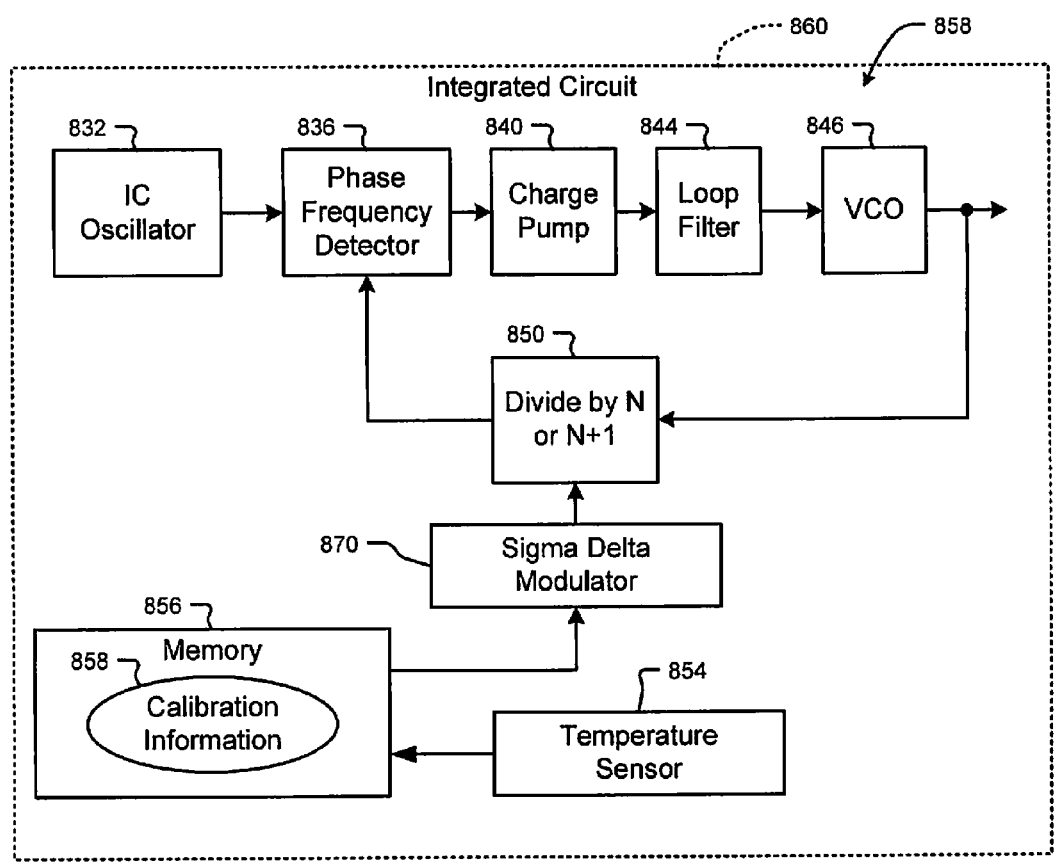
FIG. 28 is a functional block diagram of a Delta-Sigma fractional phase locked loop that includes a temperature compensation input.

Referring now to FIG. 28, a Delta-Sigma fractional phase locked loop 858 is shown for an integrated circuit 860 that includes a temperature compensation input. The selected calibration information is used to adjust an output of a Sigma Delta modulator 870. The selected calibration information may adjust a modulation between the divisors N and N+1 that are used by the scaling circuit 844.

Figure 29:
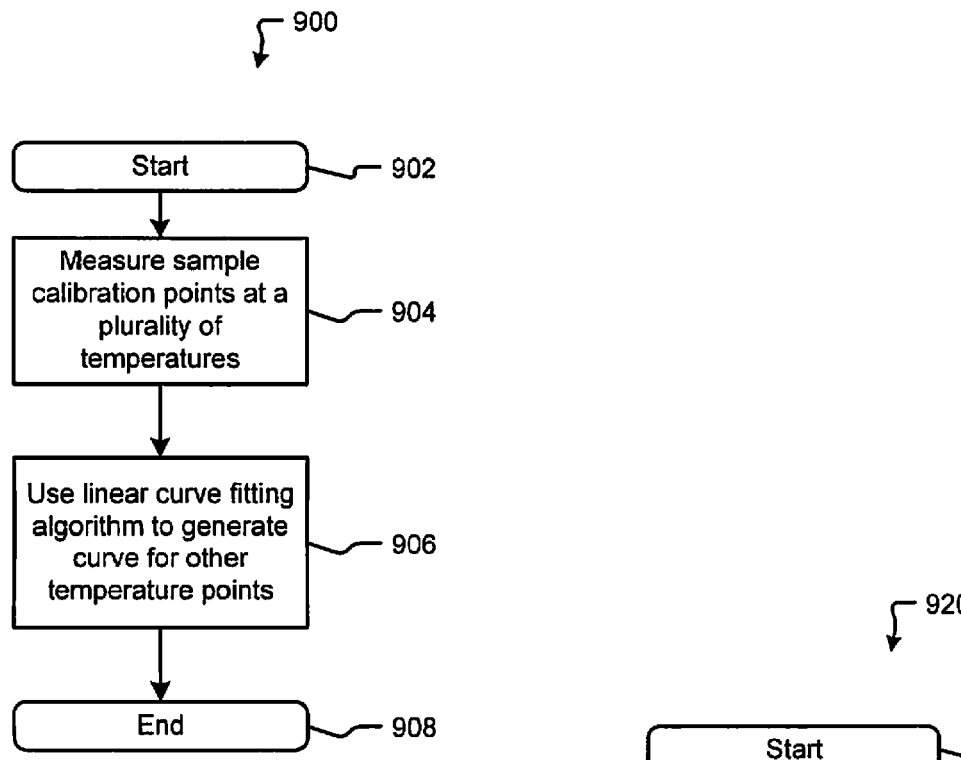
FIG. 29 is a flow chart illustrating steps for measuring sampling calibration points and using a linear curve fitting algorithm to generate calibration data between the sample calibration points.

Referring now to FIG. 29, a flow chart 900 illustrates steps for measuring sampling calibration points using a linear curve fitting algorithm to generate the calibration data. Control begins with step 902. In step 904, control measures sample calibration points at a plurality of temperatures. In step 906, linear curve fitting algorithms are used to generate curves for other temperature points between the sample points. In step 908, control ends.

Figure 30:
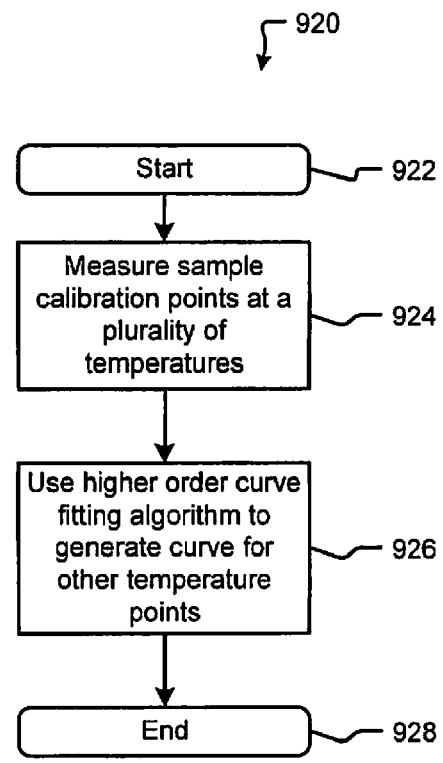
FIG. 30 is a flow chart illustrating steps for measuring sampling calibration points and using higher order curve fitting algorithms to generate calibration data between the sample calibration points.

Referring now to FIG. 30, a flow chart 920 illustrating steps for measuring sampling calibration points and using higher order curve fitting algorithms to generate the calibration data. The steps shown in FIG. 29 may be implemented using a computer that includes a processor and memory. Control begins with step 902. In step 924, control measures sample calibration points at a plurality of temperatures. In step 926, higher order curve fitting algorithms are used to generate curves for other temperature points between the sample points. In step 928, control ends.

Figure 31B:
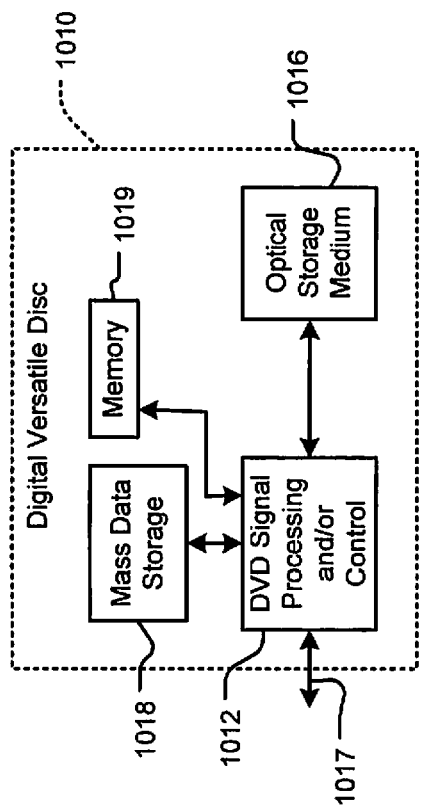
FIG. 31B is a functional block diagram of a digital versatile disk (DVD)
Figure 31A:
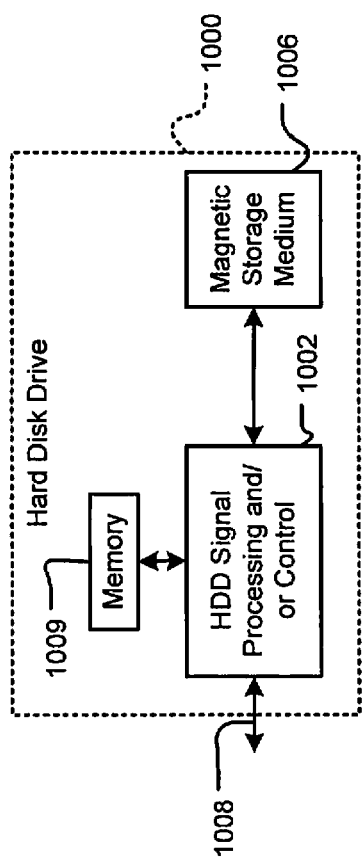
FIG. 31A is a functional block diagram of a hard disk drive.

Referring now to FIGS. 31A-31G, various exemplary implementations of the present invention are shown. Referring now to FIG. 31A, the present invention can be implemented in a hard disk drive 1000. The present invention may implement any integrated circuit such as either or both signal processing and/or control circuits, which are generally identified in FIG. 31A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Referring now to FIG. 31B, the present invention can be implemented in a digital versatile disc (DVD) drive 1010. The present invention may implement any integrated circuit such as either or both signal processing and/or control circuits, which are generally identified in FIG. 31B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 31A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 31D:
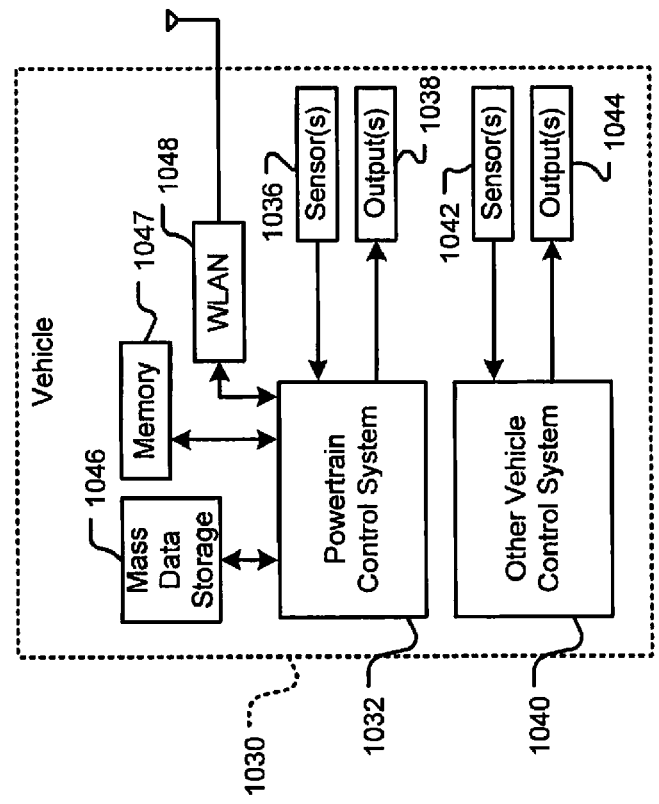
FIG. 31D is a functional block diagram of a vehicle control system.
Figure 31C:
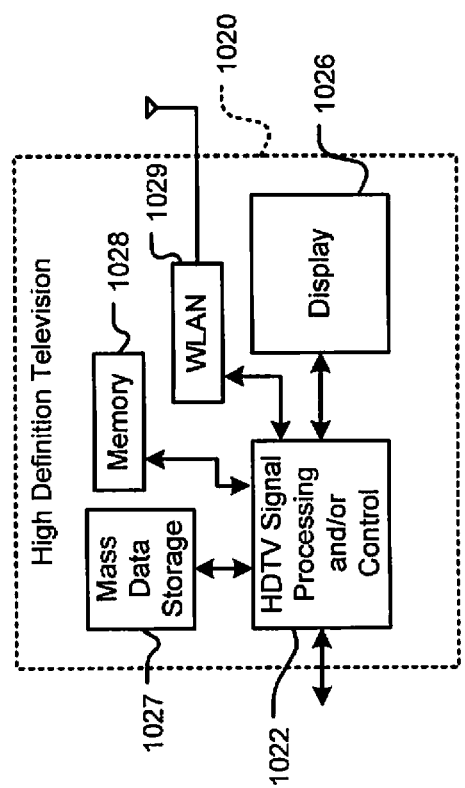
FIG. 31C is a functional block diagram of a high definition television.

Referring now to FIG. 31C, the present invention can be implemented in a high definition television (HDTV) 1020. The present invention may implement any integrated circuit such as either or both signal processing and/or control circuits, which are generally identified in FIG. 31E at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 31A and/or at least one DVD may have the configuration shown in FIG. 31B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Referring now to FIG. 31D, the present invention implements any integrated circuit in a control system of a vehicle 1030, a WLAN interface and/or mass data storage of the vehicle control system. In some implementations, the present invention implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 31A and/or at least one DVD may have the configuration shown in FIG. 31B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 31E:
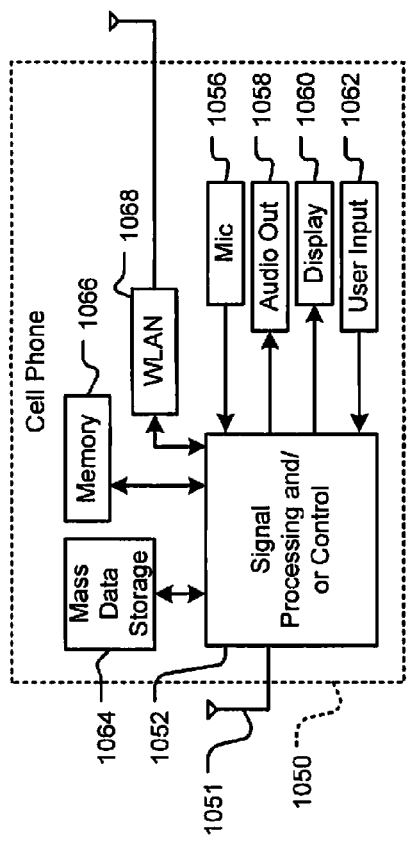
FIG. 31E is a functional block diagram of a cellular phone.

Referring now to FIG. 31E, the present invention can be implemented in a cellular phone 1050 that may include a cellular antenna 1051. The present invention may implement any integrated circuit such as either or both signal processing and/or control circuits, which are generally identified in FIG. 31E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 31A and/or at least one DVD may have the configuration shown in FIG. 31B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 31F:
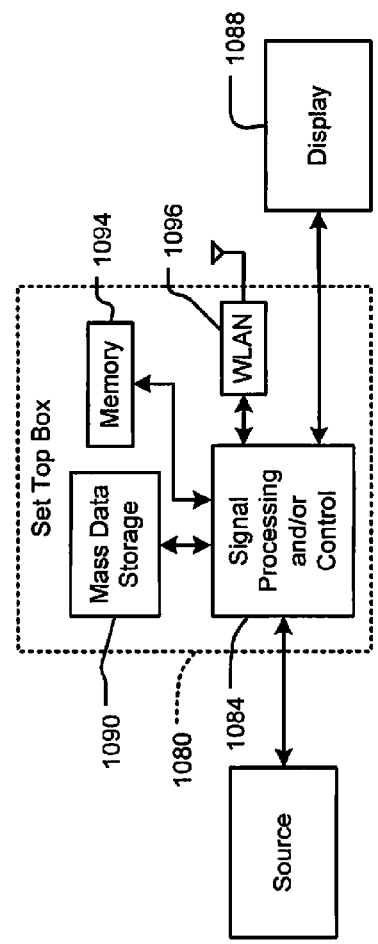
FIG. 31F is a functional block diagram of a set top box.

Referring now to FIG. 31F, the present invention can be implemented in a set top box 1080. The present invention may implement any integrated circuit such as either or both signal processing and/or control circuits, which are generally identified in FIG. 31F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 31A and/or at least one DVD may have the configuration shown in FIG. 31B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 31G:
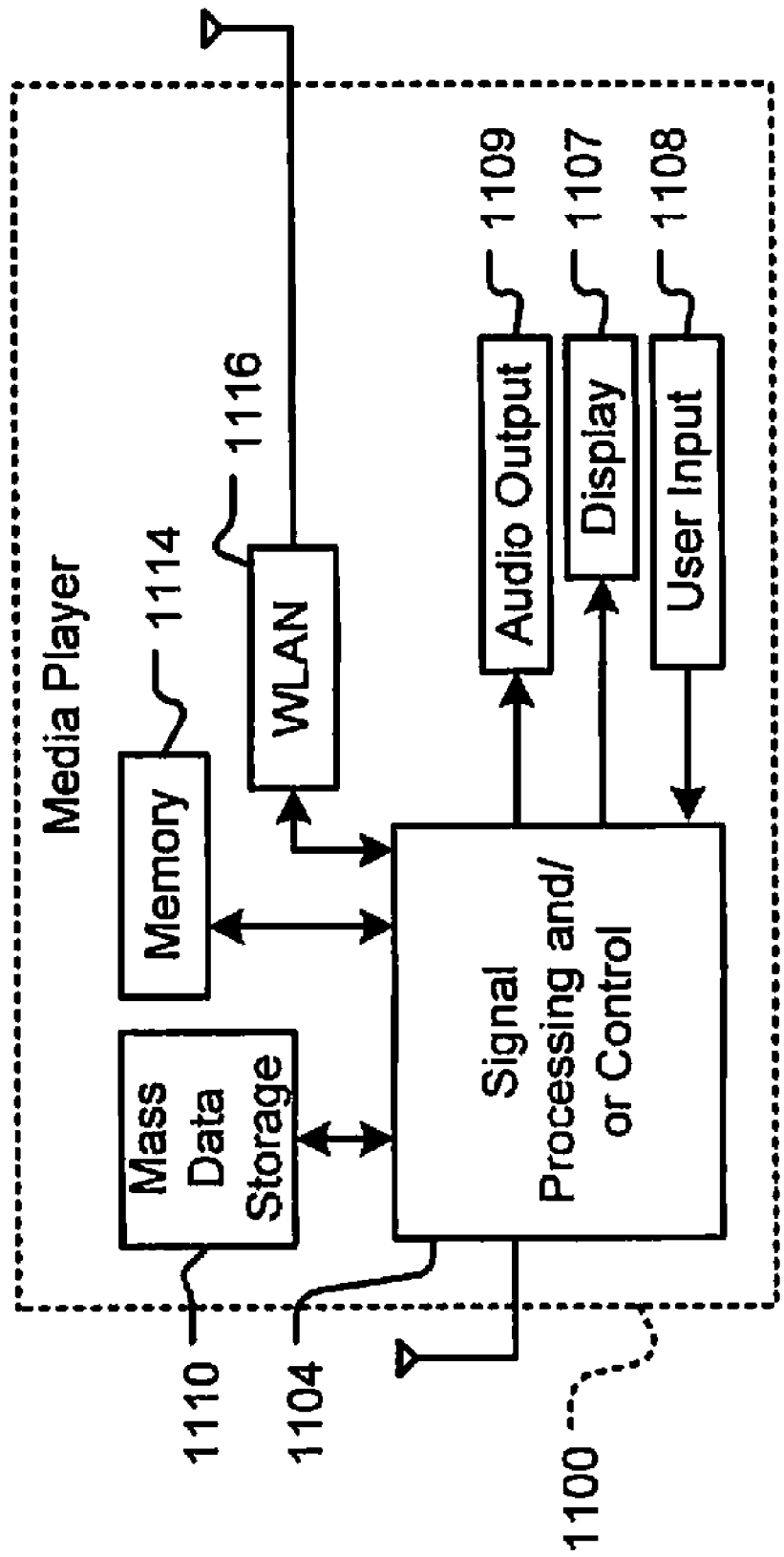
FIG. 31G is a functional block diagram of a media player.

Referring now to FIG. 31G, the present invention can be implemented in a media player 1100. The present invention may implement any integrated circuit such as either or both signal processing and/or control circuits, which are generally identified in FIG. 31G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 31A and/or at least one DVD may have the configuration shown in FIG. 31B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Figure 32C:
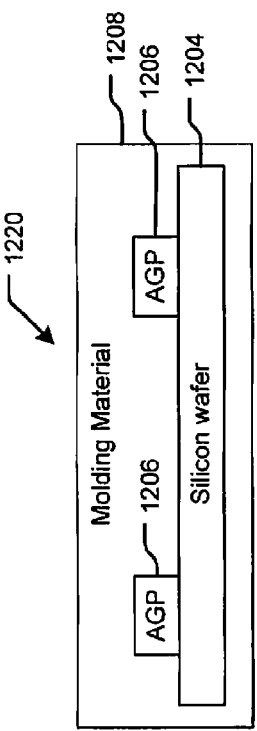
FIG. 32C is a side cross-sectional view of an alternate integrated circuit package including spaced annealed glass paste layers formed on selected portions of a silicon wafer.
Figure 32D:
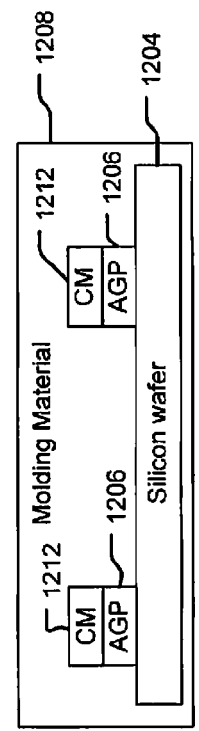
FIG. 32D is a side cross-sectional view of an alternate integrated circuit package including spaced annealed glass paste and/or epoxy layers and conductive material layers formed on selected portions of a silicon wafer.
Figure 32A:
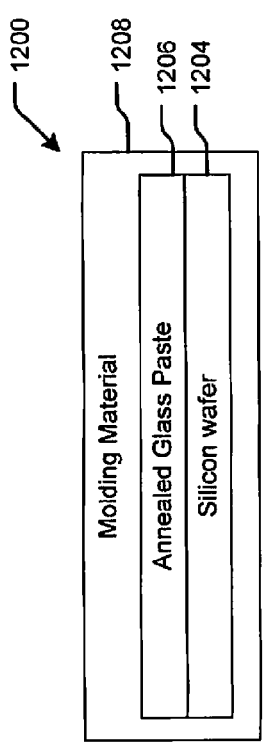
FIG. 32A is a side cross-sectional view of an alternate integrated circuit package including an annealed glass paste and/or epoxy layer formed on at least part of a silicon wafer.

Referring now to FIGS. 32A-32D, an integrated circuit package is shown that incorporates an annealed glass paste or epoxy as a layer and/or "islands" adjacent to one or more selected features of a silicon wafer. One or more "islands" of the annealed glass paste or epoxy layer can be made on portions of one or both sides of the silicon wafer. In FIG. 32A, an alternate integrated circuit package 1200 includes a silicon wafer 1204. An annealed glass paste layer or portions 1206 is/are formed on the silicon wafer 1204. A molding material 1208 may be used to encapsulate all or part of the silicon wafer 1204. The annealed glass paste layer 1206 also reduces the change in stress over time. The annealed glass paste layer 1206 tends to isolate all or part of the silicon wafer 1204 from variations in the dielectric properties such as dielectric loss of the molding material 1208.

The silicon wafer 1204 may include a semiconductor oscillator as described above. The annealed glass paste layer 1206 may include a glass paste having a relatively low annealing temperature. The low annealing temperature may be lower than a temperature that would damage the silicon wafer 1204.

The glass paste layer 1206 may include glass frit paste. The glass paste layer may be applied in any suitable manner. The glass paste layer may be applied using a screen printing approach, a dipping approach, a masking approach, and/or using any other suitable approach.

Figure 32B:
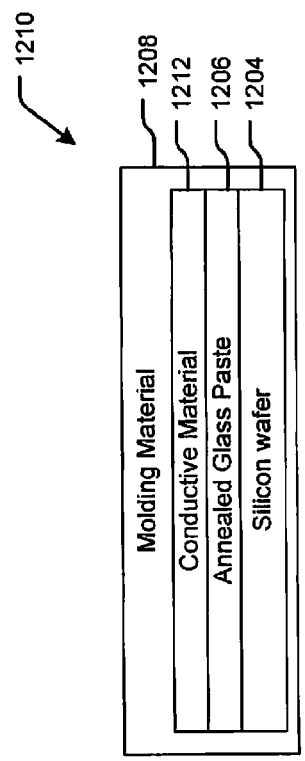
FIG. 32B is a side cross-sectional view of an alternate integrated circuit package including an annealed glass paste and/or epoxy layer formed on at least part of a silicon wafer and a conductive material layer formed on at least part of the annealed glass paste and/or epoxy layer.

In FIG. 32B, an alternate integrated circuit package 1210 includes a conductive material layer or coating 1212 that is applied to the glass paste or epoxy layer 1204. The conductive material layer 1212 may include a layer of conductive epoxy. The conductive material layer 1212 may be applied as a liquid and cured. The conductive material layer 1212 may include conductive epoxy paint. The conductive material layer 1212 may be applied in any suitable fashion including dipping the silicon wafer 1204 into a container such as a dish that contains the conductive material. The conductive material layer 1212 tends to reduce electro-magnetic interference from external devices.

In FIG. 32C, an integrated circuit package 1220 includes the annealed glass paste layer 1206, which is applied to selected portions of the silicon wafer 1204. In FIG. 32D, an integrated circuit package 1230 includes the annealed glass paste or epoxy portions 1206 and the conductive material 1212. The conductive material 1212 may cover the annealed glass paste layer 1206 while touching or not touching the silicon wafer 1204.

Figure 33A:
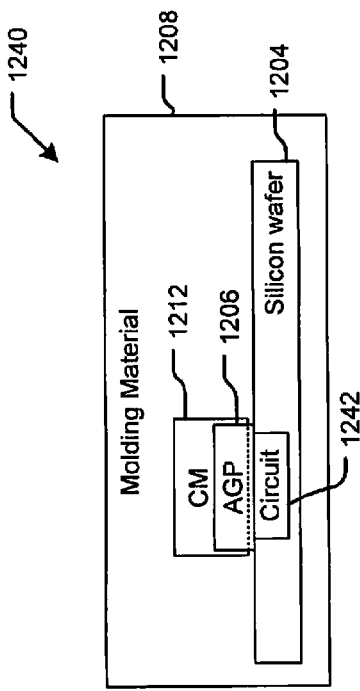
FIG. 33A is a side cross-sectional view of an alternate integrated circuit package including an annealed glass paste and/or epoxy layer and a conductive material layer adjacent to circuits of a silicon wafer.
Figure 33B:
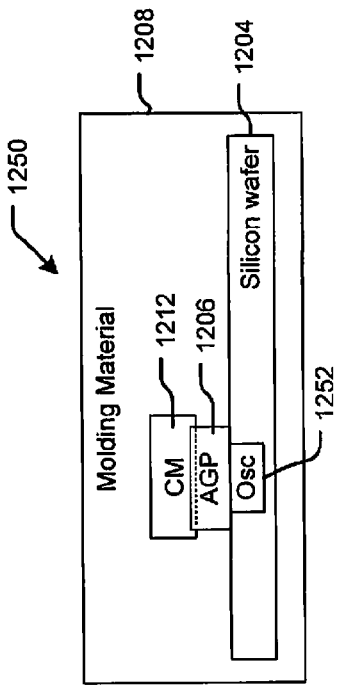
FIG. 33B is a side cross-sectional view of an alternate integrated circuit package including an annealed glass paste and/or epoxy layer and a conductive material layer adjacent to an oscillator of a silicon wafer.

Referring now to FIGS. 33A-33D, alternate integrated circuit packages are show. In FIG. 33A, an alternate integrated circuit package 1240 includes the annealed glass paste layer 1206 and the conductive material layer 1212, which are located adjacent to circuit components 1242 of the silicon wafer 1204. In FIG. 33B, an alternate integrated circuit package 1250 includes the annealed glass paste layer 1206 and conductive material layer 1212, which are located adjacent to an oscillator 1252 of the silicon wafer 1204.

Figure 33C:
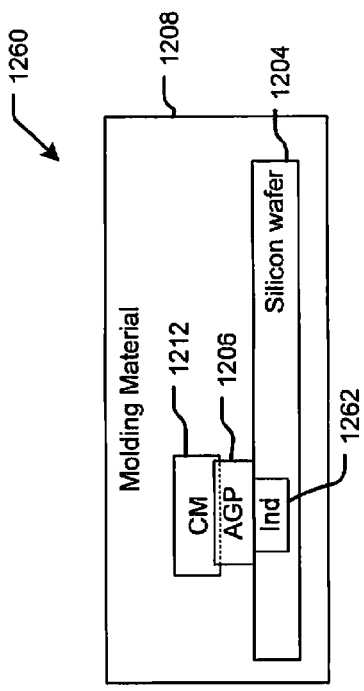
FIG. 33C is a side cross-sectional view of an alternate integrated circuit package including an annealed glass paste and/or epoxy layer and a conductive material layer adjacent to an inductor of a silicon wafer.
Figure 33D:
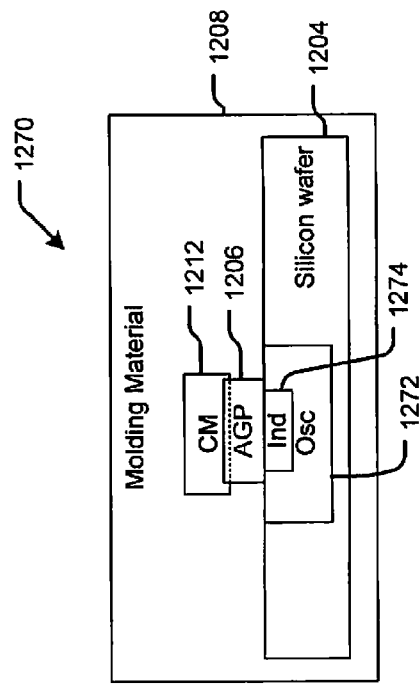
FIG. 33D is a side cross-sectional view of an alternate integrated circuit package including an annealed glass paste and/or epoxy layer and a conductive material layer adjacent to an inductor in an oscillator circuit of a silicon wafer.

In FIG. 33C, an alternate integrated circuit package 1260 includes the annealed glass paste layer 1206 and conductive material layer 1212, which are located adjacent to an inductor 1262 of the silicon wafer 1204. The inductor 1262 may be an on-chip inductor such as a spiral inductor. In FIG. 33D, an alternate integrated circuit package 1270 includes the annealed glass paste layer 1206 and conductive material layer 1212, which are located adjacent to oscillator circuit 1272 with an inductor 1274.

The annealed glass paste layer also tends to reduce the change in stress over time that can occur. The annealed glass paste layer isolates all or part of the silicon wafer from variations in the dielectric properties such as dielectric loss of the molding material. This can be particularly advantageous when attempting to calibrate using temperature as described above.

Referring now to FIGS. 34A-34D, alternate integrated circuit packages are shown that include annealed glass paste and/or epoxy portions and a glass or silicon layer that create an air gap above portions of a silicon wafer. In FIGS. 34A-34B, integrated circuit packages 1300 and 1330 include a silicon wafer 1304. Annealed glass paste portions 1306 are formed on the silicon wafer 1304 in a spaced apart relationship. The AGP portions 1306 may be formed as described above. A molding material 1308 may be used. Post-processing of the AGP portions 1306 may be performed such as polishing or other steps to provide a planar outer surface.

A glass or silicon layer 1310 is supported above the silicon wafer 1304 by the AGP portions 1306. Epoxy or other adhesive binding material may be used to attach the glass or silicon layer 1310 to the AGP portions 1306. AGP portions 1306 and the glass or silicon layer 1310 form an air gap 1324 above an oscillator 1320 in FIG. 34A and/or any other circuit 1322 in FIG. 34B. The air gap 1324 provides the material (air) having the lowest possible dielectric loss. In contrast, when crystal oscillators are used, the air is needed to allow the crystal to resonate—in other words, the air is used to allow mechanical oscillation.

In FIGS. 34C-34D, integrated circuit packages 1340 and 1360 include a silicon wafer 1304. Epoxy portions 1342 are formed on the silicon wafer 1304 in a spaced apart relationship. The epoxy portions 1342 may be formed as described above. Post-processing of the epoxy portions 1306 may be performed such as polishing or other steps to provide a planar outer surface. A glass or silicon layer 1310 is supported above the silicon wafer 1304 by the epoxy portions 1342. Epoxy or other adhesive binding material may be used to attach the glass or silicon layer 1310 to the epoxy portions 1342. The portions 1306 and the layer 1310 form an air gap 1324 above an oscillator 1320 in FIG. 34C and/or any other circuit 1322 in FIG. 34D.

Referring now to FIGS. 35A-35B, alternate integrated circuit packages are shown that include a glass or silicon portion that creates an air gap. In FIG. 35A, an integrated circuit package the 1380 includes a "C"-shaped glass or silicon portion 1382 that defines an air gap 1384. The "C"-shaped glass or silicon portion 1382 may include multiple sections that are joined together. The air gap 1384 is located above an oscillator 1320. In FIG. 35B, an integrated circuit package 1390 includes a "C"-shaped glass or silicon layer 1382 that defines an air gap 1384. The air gap 1384 is located above a circuit 1322.

Referring now to FIGS. 36A-36C, methods for making integrated circuit packages described above are shown. An integrated circuit structure 1400 includes a silicon wafer 1404, a plurality of spaced AGP and/or epoxy portions 1410A and 1410B (collectively portions 1410), and a glass or silicon layer 1408. The integrated circuit structure 1400 is cut into sections along dotted cutlines 1414 to create multiple integrated circuits, which can be packaged in a molding material (not shown) as described above.

In FIG. 36B, the silicon wafer 1404 may include one or more bond pads 1420. Cutting of the layer 1408 at 1414-1 and 1414-2 may be offset from the cutting of the silicon wafer at 1414-3 to provide clearance for attaching bondwires (not shown) to the bond pads 1420. In FIG. 36C, one of the integrated circuits 1450 is shown after being separated from the integrated circuit structure 1400.

Referring now to FIGS. 37A-37B, an integrated circuit package 1450 includes a silicon wafer with spaced annealed glass paste and/or epoxy portions 1410 that have been coated with a layer of conductive material 1456' are shown. In FIG. 37A, the portions 1410 are dipped into a container 1454 that contains the conductive material 1456. The silicon wafer 1408 may be diced along one or more cutlines 1462 and may include bond pads 1460 as shown.

Figure 38:
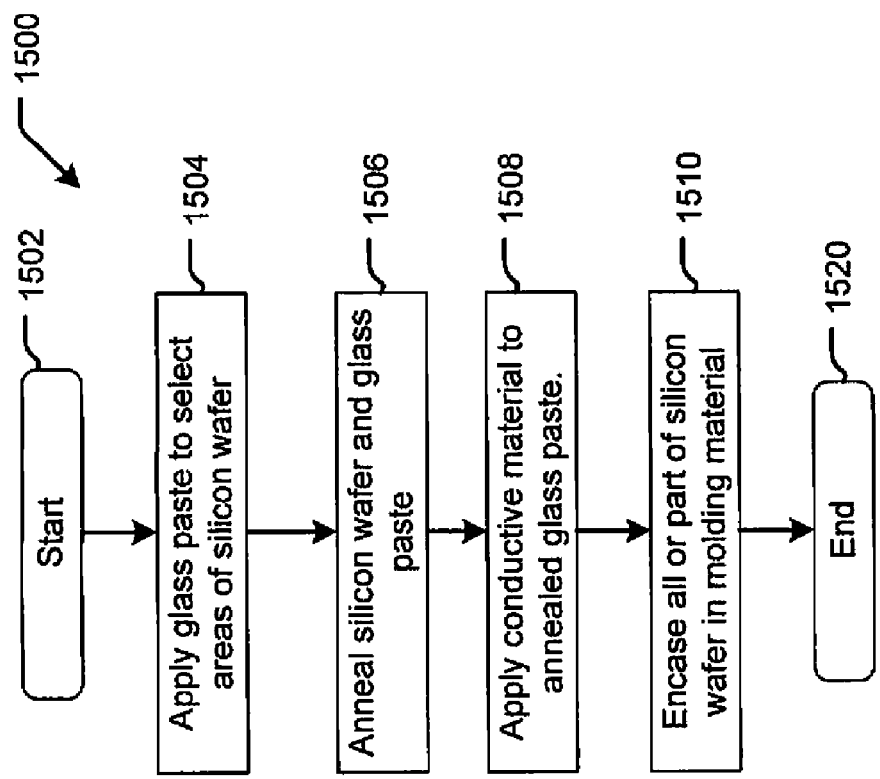
FIG. 38 illustrates exemplary steps of a method for fabricating the integrated circuit packaging of FIGS. 32A-32D.

Referring now to FIG. 38, steps of a method 1500 for fabricating the integrated circuit packaging of FIGS. 32A-33D are shown. Control begins in step 1502. In step 1504, a glass paste layer 1206 is applied to one or more surfaces of the silicon wafer 1204 and/or select areas of the silicon wafer 1204. In step 1506, the glass paste layer 1204 is annealed by placing the silicon wafer 1204 and the glass paste layer 1204 in an oven. The temperature of the oven may be set to a temperature that is sufficient to cure the glass paste layer 1204. For example, a temperature of around 400° C. for a predetermined period is sufficient to anneal the glass frit paste while not damaging the silicon wafer 1204. In step 1508, the conductive material layer 1212 is applied to the annealed glass paste layer 1204. In step 1510, all or part of the silicon wafer 1204 is encased in a molding material 1208 such as plastic, other materials described herein, and/or other suitable molding materials. In step 1520, control ends.

In each of the foregoing embodiments, the silicon wafer may be replaced by other wafers or other substrates and the annealed glass paste can be replaced by epoxy.

Figure 39:
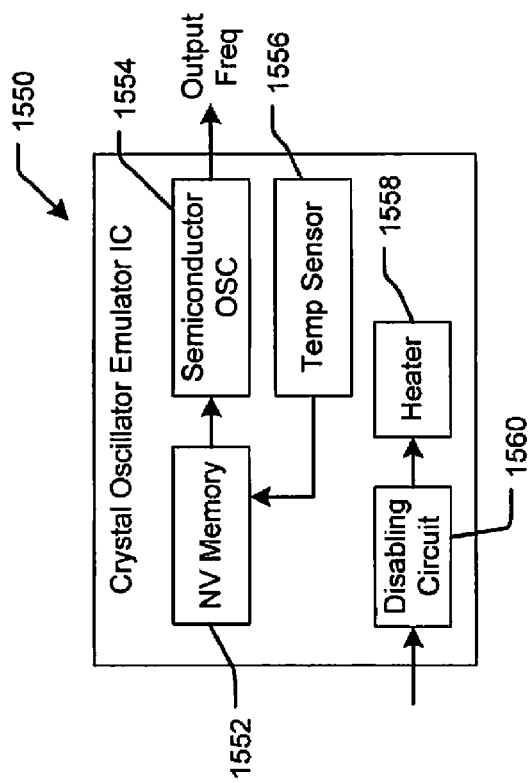
FIG. 39 is a functional block diagram of a crystal oscillator emulator integrated circuit.

Referring now to FIG. 39, a crystal oscillator emulator integrated circuit (IC) 1550 is shown. The crystal oscillator emulator IC 1550 may be a stand alone integrated circuit in that it is not integrated with other circuit functions. In other words, the crystal oscillator emulator does not include other circuits that are unrelated to the operation of the crystal oscillator emulator. As used herein, the term "unrelated" means that the integrated circuit does not include circuits other than those circuits that power the crystal oscillator emulator, output circuits that condition an output of the crystal oscillator emulator, and/or other circuits that generally support the operation of the crystal oscillator emulator. By providing the crystal oscillator emulator as a stand alone circuit, the crystal oscillator emulator can provide a reference frequency for any other circuit without requiring integration. The crystal oscillator emulator IC 1550 generates a stable reference frequency, as described further above and below.

The crystal oscillator emulator IC 1550 includes nonvolatile memory 1552 that stores calibration data based on temperature as described herein. A semiconductor oscillator 1554 provides a temperature compensated reference frequency. A temperature sensor 1556 senses a temperature of the integrated circuit 1550 and outputs the sensed temperature to the NV memory 1552. A heater 1558 may be selectively used during calibration to heat the IC 1550 to a predetermined temperature. A disabling circuit 1560 may be provided to disable the heater 1558 after calibration. For example only, the disabling circuit 1560 may be a one-time use circuit such as a fuse or an anti-fuse.

During testing at the factory after manufacture, the heater 1558 may be used to increase a temperature of the crystal oscillator emulator IC 1550 to one or more desired temperatures such as typical ambient operating temperature(s) that will be encountered during use. After data is collected at the temperature, the heater 1558 may be used to adjust the temperature of the crystal oscillator emulator IC 1550 to one or more additional temperatures for further testing and calibration.

After testing has been completed, the disabling circuit 1560 may be used to disable the heater 1558. Disabling of the heater 1558 may be performed at the factory. End users of the crystal oscillator emulator IC 1550 are not likely to have a suitable high accuracy reference frequency and therefore will likely be unable to perform accurate testing and calibration. Furthermore, it is also unlikely that the heater 1558 will be used during operation since it tends to decrease the efficiency of the IC 1550. As can be appreciated, while the foregoing description relates to the crystal oscillator emulator IC 1550, a similar approach may be used for any other crystal oscillator emulator described herein.

Figure 40:
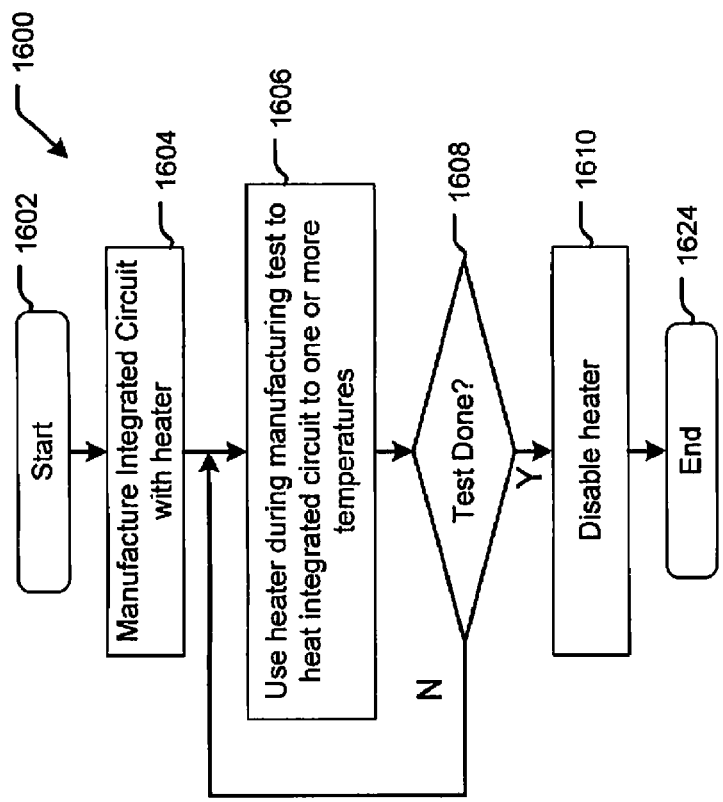
FIG. 40 is a flow chart illustrating steps performed during calibration of an integrated circuit including a crystal oscillator emulator.

Referring now to FIG. 40, steps 1600 performed during calibration of an integrated circuit including a crystal oscillator emulator are shown. The method begins in step 1602 and proceeds to step 1604. In step 1604, the integrated circuit is formed with a heater. In step 1606, the heater is used at the factory during calibration testing after manufacturing to heat the integrated circuit to one or more selected temperatures. After the testing has been completed as determined in step 1608, the heater may be disabled in step 1610. The method ends in step 1624.

Referring now to FIG. 41, a crystal oscillator emulator 1630 may include an adaptive calibration circuit 1638 that selectively calibrates the crystal oscillator emulator 1630 using C test points (where C is an integer greater than zero). The crystal oscillator emulator 1630 includes nonvolatile memory 1632, a semiconductor oscillator 1634, and a temperature sensor 1636 that operate as described above. The adaptive calibration circuit 1638 may selectively adapt the calibration approach based on the number of sample test points. The adaptive calibration circuit 1638 stores data relating to one or more temperature characteristic lines or curves that will be used during calibration. Alternatively, the calibration circuit may include an algorithm that generates slope and/or curvature data based on the temperature test points.

Figure 43:
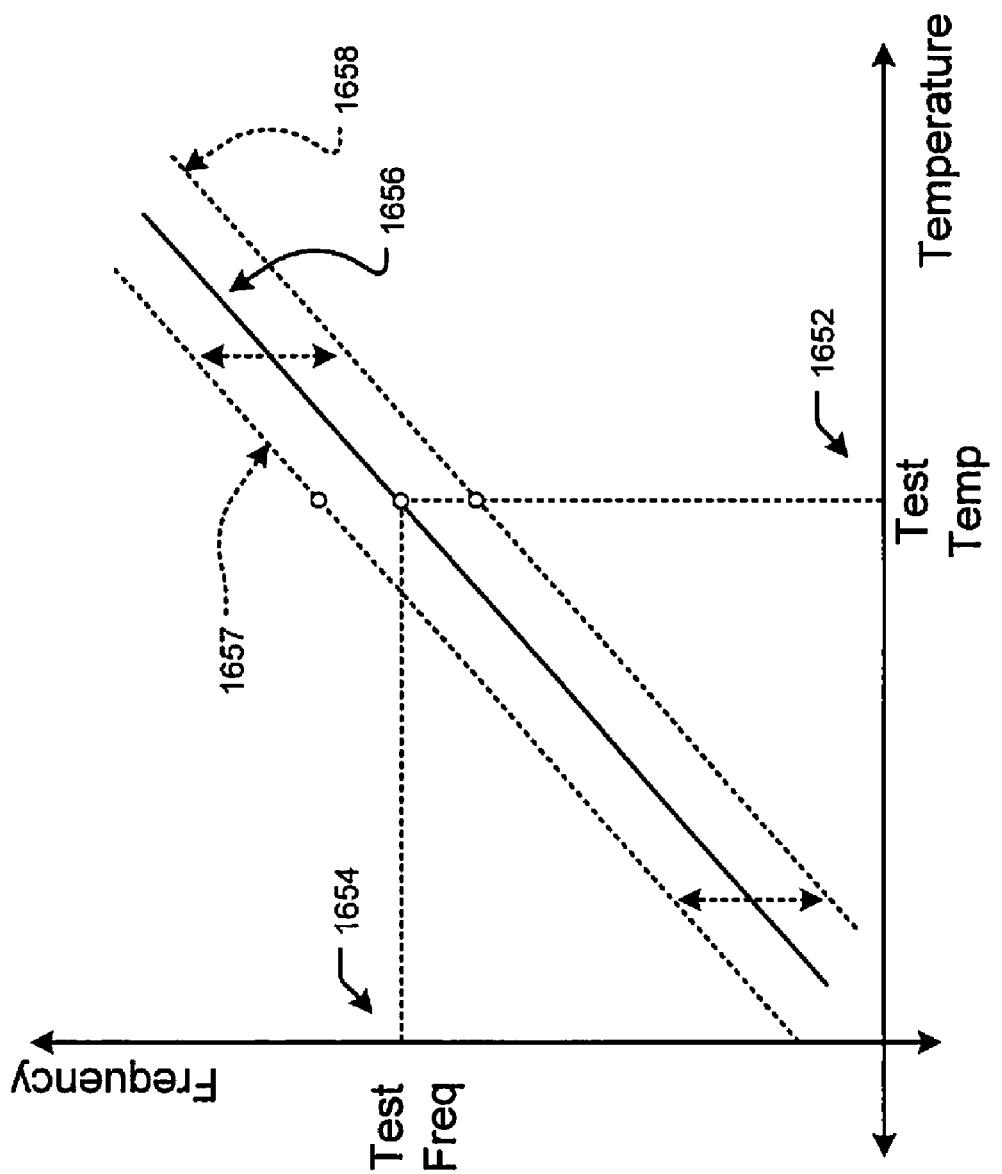
FIG. 43 is a graph illustrating frequency as a function of temperature and the location of a line or other curve using the single temperature test point.

Referring now to FIGS. 42-43, calibration using a single temperature calibration point is shown in further detail. In FIG. 42, steps 1640 performed during calibration using the single temperature calibration point are shown. The steps begin with step 1642 and proceed to step 1644 where a typical linear and/or non-linear temperature relationship is stored in the integrated circuit. For example only, a slope of a line may be assumed and the test point may be used to determine unknown y intercept. Alternatively, the curvature may be stored and the y-intercept may be determined.

In step 1646, after manufacturing the integrated circuit is tested at one temperature (for example only, at room temperature and/or the expected ambient operating temperature). In step 1648, the calibration circuit locates a y-intercept of a predetermined line or other curve using the single test point. The method ends in step 1650.

The adaptive calibration circuit 1638 may allow the entry of one or more temperature values. The adaptive calibration circuit 1638 may selectively adapt the type of curve fitting that is performed based on the number of sample points entered. For example, when one value is entered, the y intercept of the line or curve can be determined. When two values are entered, the y intercept of the line or curve can be determined and/or slope, curvature or other characteristics of the curve can be determined. When three or more values are entered, the y intercept of the line or curve can be determined and slope, curvature or other characteristics of the curve can be determined with higher accuracy.

The adaptive calibration circuit 1638 may be particularly useful since the process of heating and stabilizing the temperature of the integrated circuit including the crystal oscillator emulator may take a relatively long time. In other words, the time required to change the temperature of the integrated circuit including the crystal oscillator emulator from one steady-state temperature to another steady-state temperature may take on the order of days.

The time required to repeatedly perform this calibration process may significantly impact the overall cost of the IC. In other words, the cost will increase as the number of sampling points increase. By allowing the adaptive calibration circuit 1638 to automatically vary the calibration process based upon the number of sample points, a manufacturer can provide varying levels of accuracy using the same ICs.

In FIG. 43, frequency is shown as a function of temperature. The calibration circuit locates a line (shown) or other curve (not shown) using a single test point that includes a test temperature 1652 and a test frequency 1654. The test temperature 1652 may be measured by the temperature sensor 1636 and/or monitored externally. The test frequency 1654 may be measured and input to the IC by an external circuit that provides a high-accuracy reference frequency. Since only one temperature test point is used in this example, the adaptive calibration circuit 1638 automatically locates a predetermined line or curve 1656 using the single temperature test point. As can be seen, for other temperature test results, the location of the line or curve will be adjusted higher 1657 or lower 1658.

Figure 45:
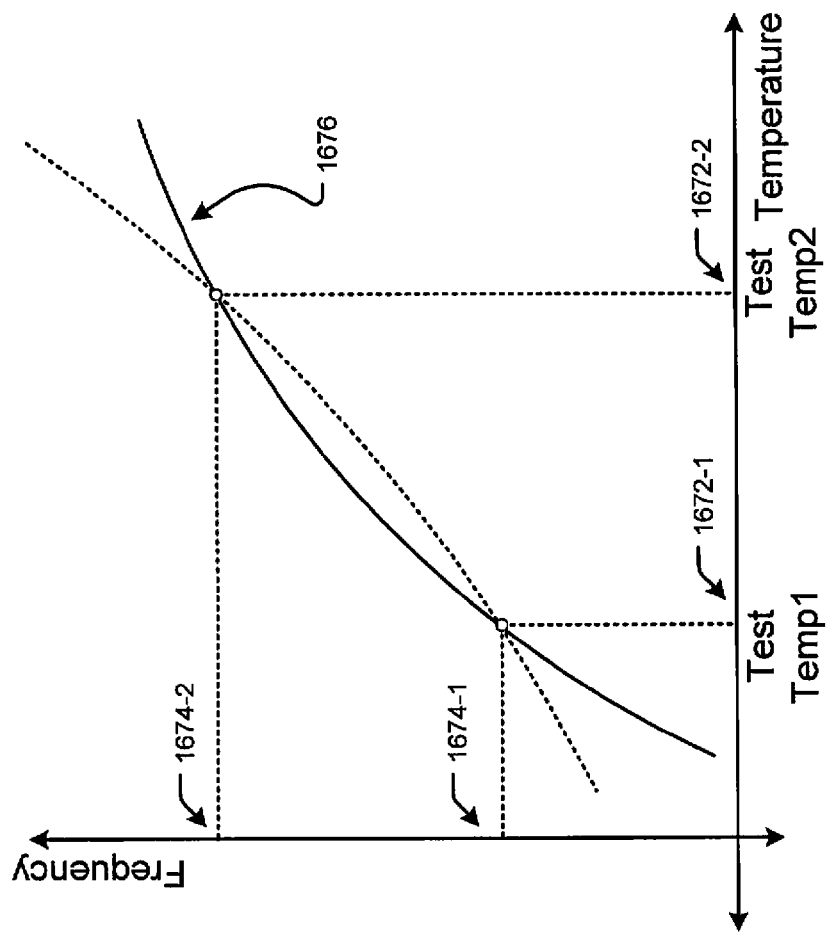
FIG. 45 is a graph illustrating frequency as a function of temperature and the location and/or definition of a line or curve using the two temperature test points.
Figure 44:
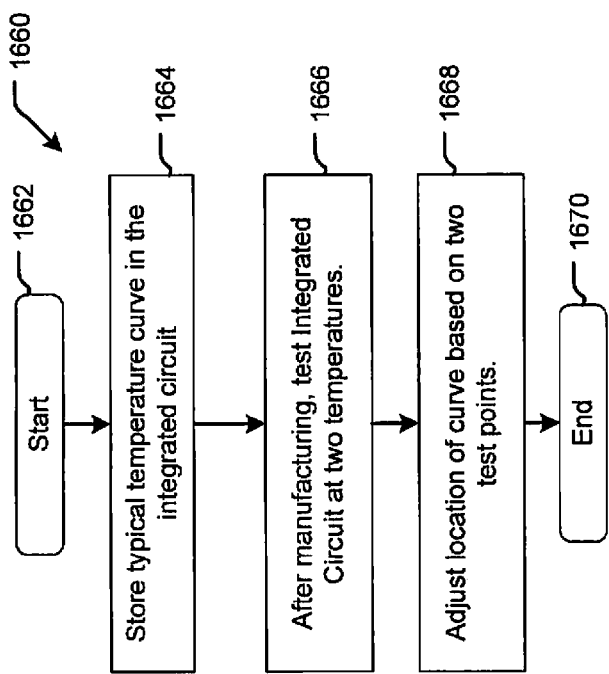
FIG. 44 is a flow chart illustrating steps performed during calibration using two temperature test points.

Referring now to FIGS. 44-45, calibration using two temperature test points is shown in further detail. In FIG. 44, steps 1660 performed during calibration using two temperature test points are shown. Control begins with step 1662 and proceeds to step 1664 where typical temperature characteristic lines and/or curves may optionally be stored in the integrated circuit. In step 1666, the integrated circuit is tested after manufacturing at two temperature test points. The temperature may be stabilized either externally (for example using a test chuck) and/or using the heater. In step 1668, a location of the line or curve is adjusted based on the two test points. A slope of a line or other characteristic of a curve may also be adjusted.

In FIG. 45, a graph illustrates frequency as a function of temperature. The adaptive calibration circuit 1638 locates and/or defines a line or curve 1676 using the two test points (test temperatures 1672-1 and 1672-2 and test frequencies 1674-1 and 1674-2). The adaptive calibration circuit 1638 may also use information such as a third temperature point that is a known value. For example, the curve may be a second order curve that always intercepts at a known frequency/temperature.

Figure 47:
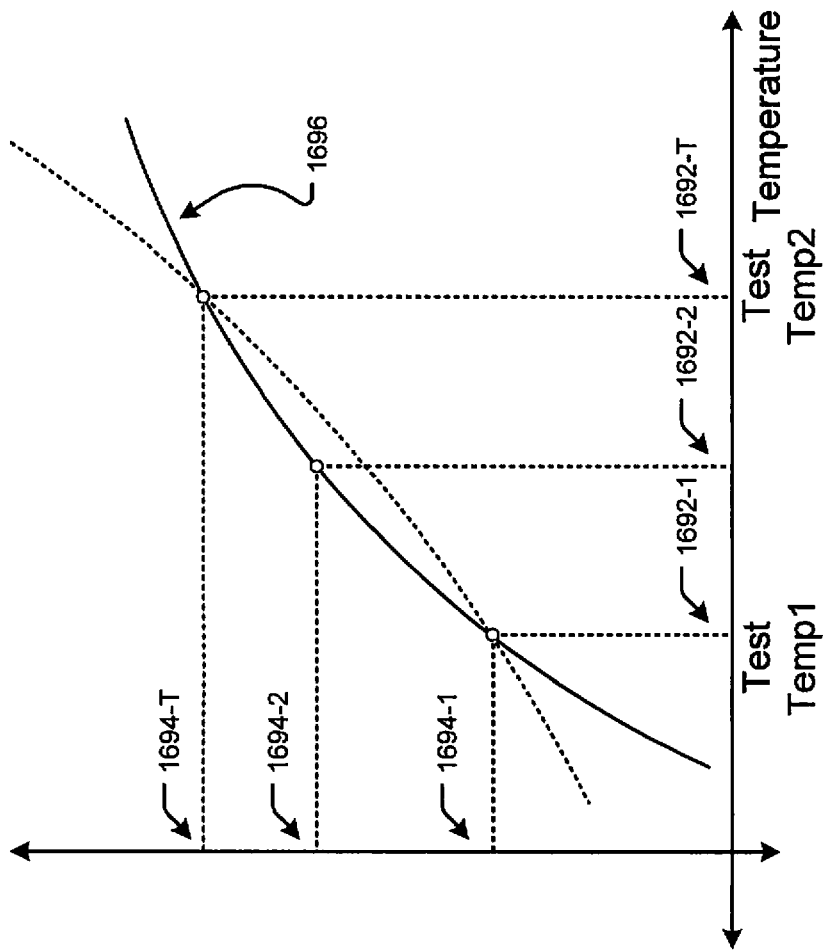
FIG. 47 is a graph illustrating frequency as a function of temperature and the location and/or definition of a curve using the three or more temperature test points.
Figure 46:
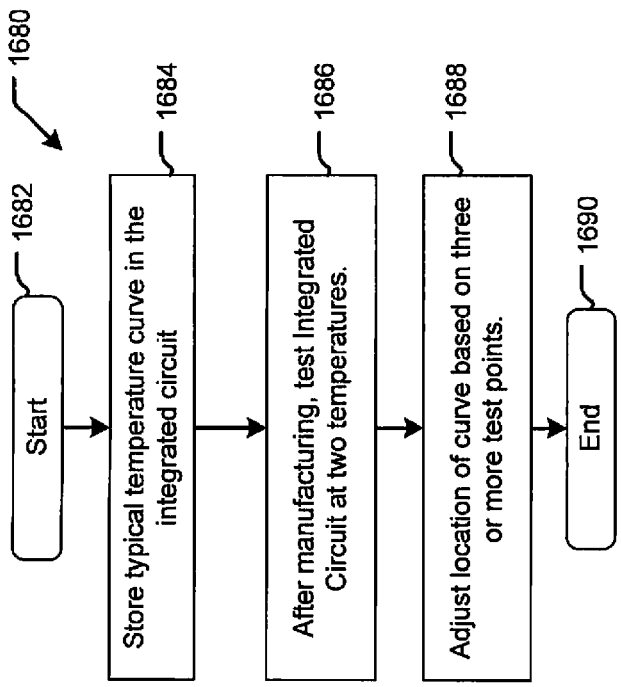
FIG. 46 is a flow chart illustrating steps performed during calibration using three or more temperature test points.

Referring now to FIGS. 46-47, calibration using three or more points is shown. In FIG. 46, steps 1680 performed during calibration using three test points are shown. Control begins with step 1682 and proceeds to step 1684 where typical temperature lines and/or curves may optionally be stored in the integrated circuit. In step 1686, the integrated circuit is tested after manufacturing at three or more temperature test points. The temperatures may be stabilized either externally (for example using a chuck) and/or using the heater. In step 1688, a location and other characteristics of the line or curve is adjusted based on the three temperature test points. The method ends in step 1690.

As can be appreciated, as the number of test points increase, the calibration circuit can perform more accurate estimation of the location and curvature of the temperature profile. However, as the number of sample points increase, the cost of the IC tends to increase.

In FIG. 47, a graph illustrates frequency as a function of temperature. The adaptive calibration circuit 1638 locates and/or defines a line or curve 1696 using the three or more test points (test temperatures 1692-1, 1692-2, ... 1692-T and test frequencies 1694-1, 1694-2, ... 1694-T). In this example, the adaptive calibration circuit 1638 may either locate a known line or curve using the test points and/or define a line or a curve using the temperature test points.

Figure 48A:
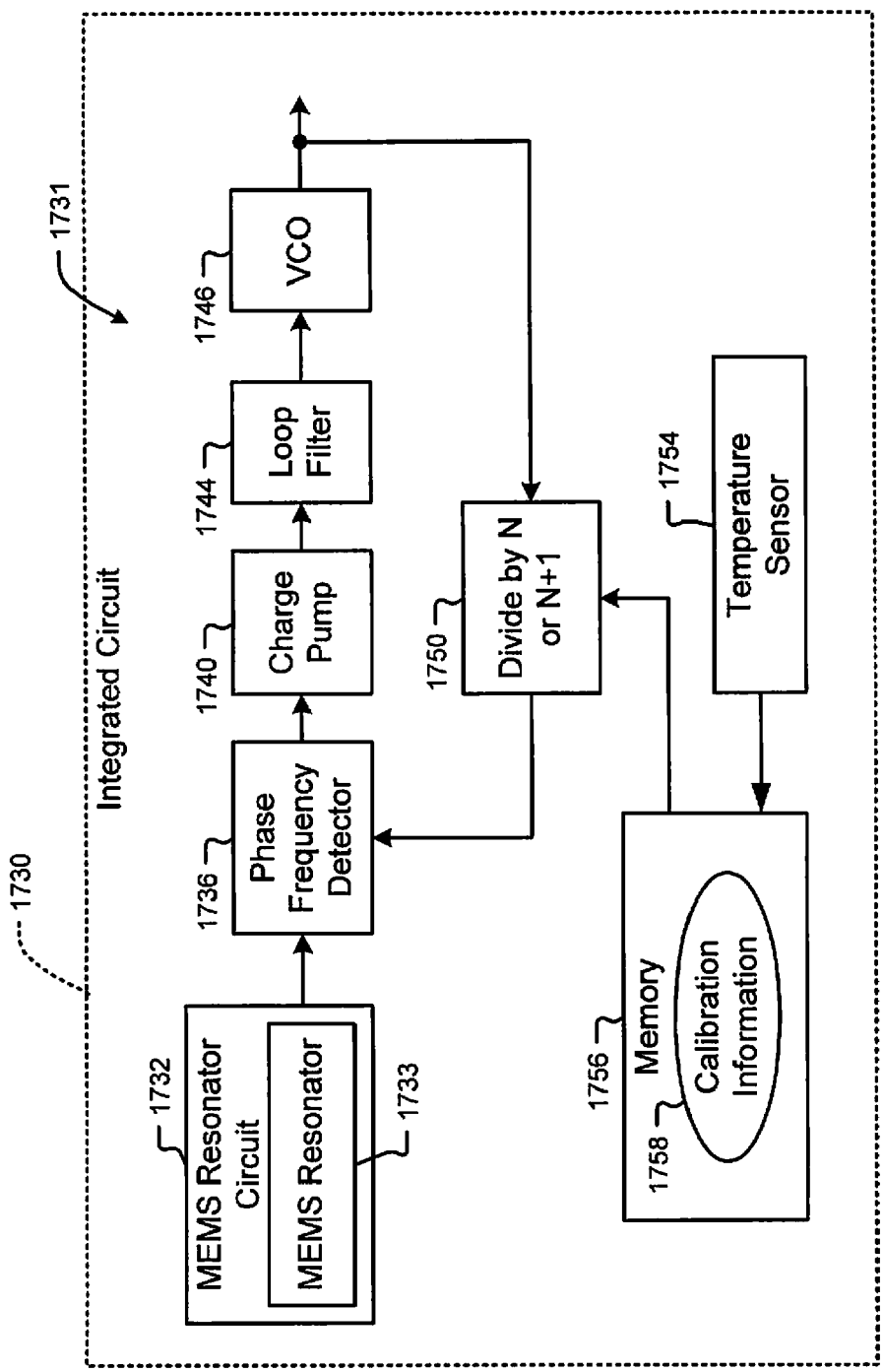
FIG. 48A is a functional block diagram of a fractional phase locked loop including a microelectromechanical (MEMS) resonator circuit.

Referring now to FIG. 48A, an integrated circuit 1730 includes a fractional phase locked loop 1731 with a temperature compensation input and reference frequency generated by a microelectromechanical (MEMS) resonator circuit 1732. The MEMS resonator circuit 1732 includes a MEMS resonator 1733 that is a mechanically resonating component formed in an integrated circuit.

The fractional phase locked loop 1731 includes a phase frequency detector 1736 that receives the reference frequency output of the MEMS resonator circuit 1732, which operates as described above and below. The phase frequency detector 1736 generates a differential signal based on a difference between the reference frequency generated by the MEMS resonator circuit 1732 and a VCO frequency.

The differential signal is output to a charge pump 1740. An output of the charge pump 1740 is input to an optional loop filter 1744. An output of the loop filter 1744 is input to a voltage controlled oscillator (VCO) 1746, which generates a VCO output having a frequency that is related to a voltage input thereto. An output of the VCO 1746 is fed back to a scaling circuit 1750. The scaling circuit 1750 selectively divides the VCO frequency by N or N+1. While N and N+1 divisors are employed, the divisors may have other values. An output of the scaling circuit 1750 is fed back to the phase frequency detector 1736.

A temperature sensor 1750 measures a temperature of the integrated circuit 1730 in the region near the IC oscillator 1732. The temperature sensor 1750 outputs a temperature signal that is used to address calibration information 1758 that is stored in memory 1756. The selected calibration information is used to adjust the scaling circuit 1750. The selected calibration information adjusts a ratio of the divisors N and N+1 that are used by the scaling circuit 1744.

Figure 48B:
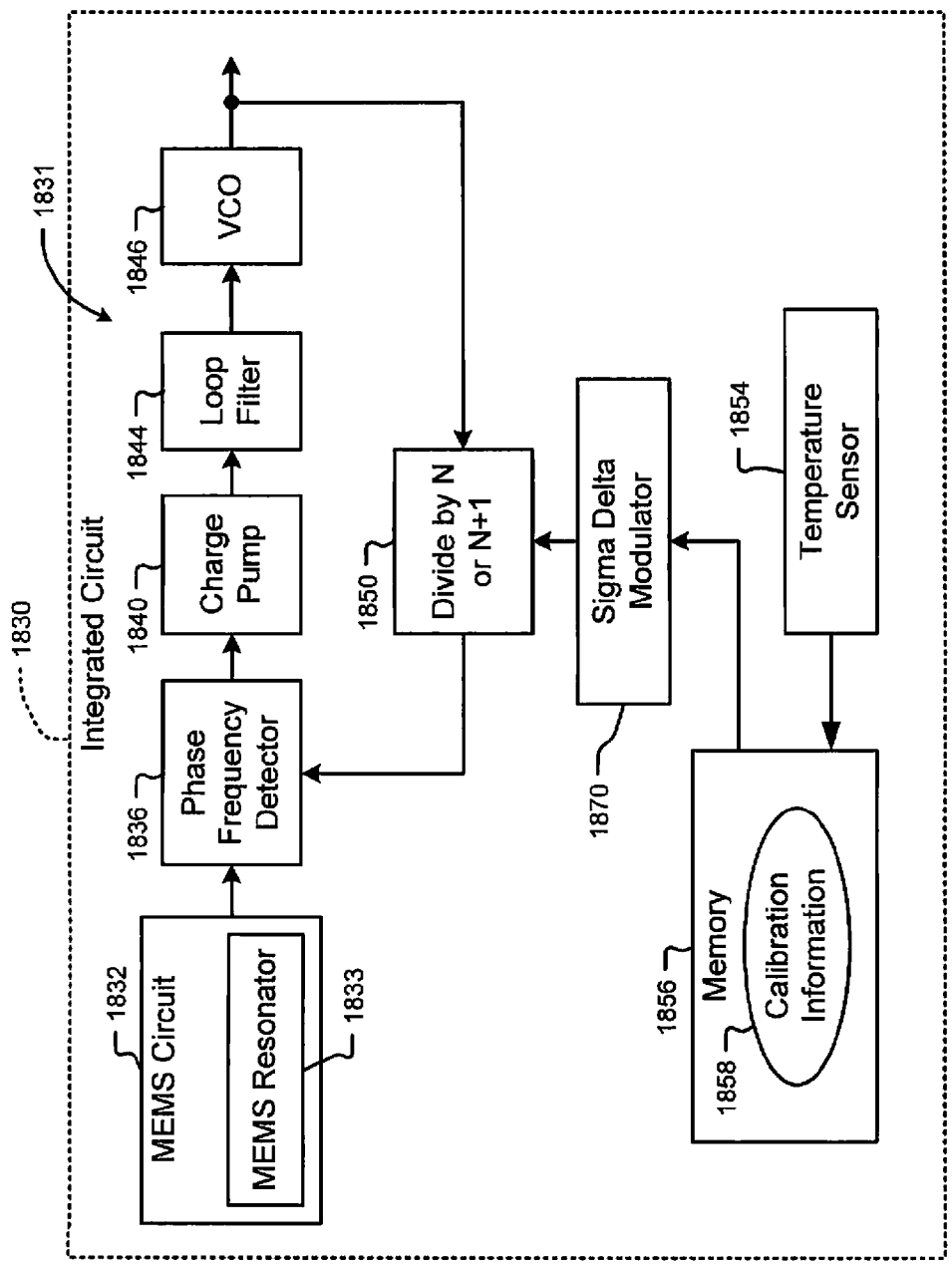
FIG. 48B is a functional block diagram of a Delta-Sigma phase locked loop including a MEMS resonator circuit.

Referring now to FIG. 48B, an integrated circuit 1830 includes a Delta-Sigma fractional phase locked loop 1831 with a temperature compensation input. The integrated circuit 1830 includes a microelectromechanical (MEMS) resonator circuit 1832 with a MEMS resonator 1833. The Delta-Sigma fractional phase locked loop 1831 includes a phase frequency detector 1836 that receives an output of the MEMS resonator circuit 1832, which generates a reference frequency. The phase frequency detector 1836 generates a differential signal based on a difference between the reference frequency and a VCO frequency.

The differential signal is output to a charge pump 1840. An output of the charge pump 1840 is input to an optional loop filter 1844. An output of the loop filter 1844 is input to a voltage controlled oscillator (VCO), which generates a VCO output having a frequency that is related to a voltage input thereto. An output of the VCO 1846 is fed back to a scaling circuit 1850. The scaling circuit 1850 selectively divides the VCO frequency by N or N+1. While N and N+1 divisors are employed, the divisors may have other values. An output of the scaling circuit 1850 is fed back to the phase frequency detector 1836.

A temperature sensor 1854 measures a temperature of the integrated circuit 1830. The temperature sensor 1854 outputs a temperature signal that is used to address calibration information 1858 that is stored in memory 1856. The selected calibration information is used to adjust the scaling circuit 1850. The selected calibration information adjusts modulation between the divisors N and N+1 that are used by the scaling circuit 1844.

The selected calibration information is used to adjust an output of a Sigma Delta modulator 1870. The selected calibration information may adjust modulation between the divisors N and N+1 that are used by the scaling circuit 1850.

Figure 49:
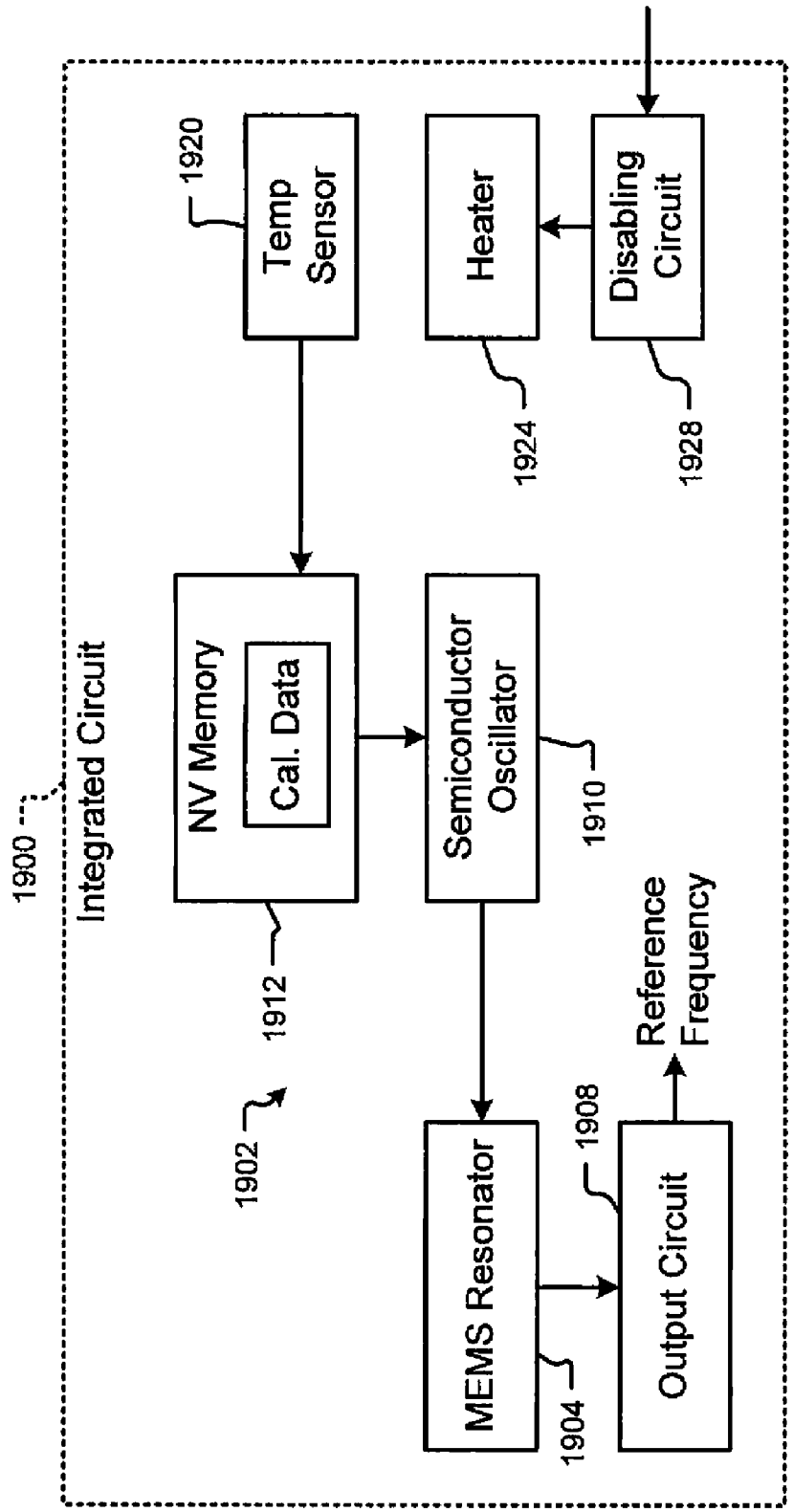
FIG. 49 is a functional block diagram of an exemplary MEMS resonator circuit with temperature compensation.

Referring now to FIG. 49, an integrated circuit 1900 includes a MEMS resonator circuit 1902. The MEMS resonator circuit 1902 includes a MEMS resonator 1904. The MEMS resonator circuit 1902 may include an output circuit 1908. For example only, the output circuit may include a parallel matching resistance or other circuit. A semiconductor oscillator 1910 may be used to generate a resonator drive signal that drives the MEMS resonator 1904.

Non-volatile memory 1912 may be used to configure the semiconductor oscillator 1910 and may perform temperature compensation using calibration data as previously described above. A temperature sensor 1920 may be used to sense a temperature of the integrated circuit 1900. The calibration data stored by the NV memory 1912 may be accessed based on the temperature sensed by the temperature sensor 1920. A heater 1924 may be used to heat the integrated circuit 1900 after manufacturing. A disabling circuit 1928 may be used to disable the heater 1924 after using the heater 1924 for calibration. For example only, the NV memory 1912 may be one time programmable (OTP) memory and the disabling circuit 1928 may include a one time breakable circuit such as a fuse or an anti-fuse.

Figure 50A:
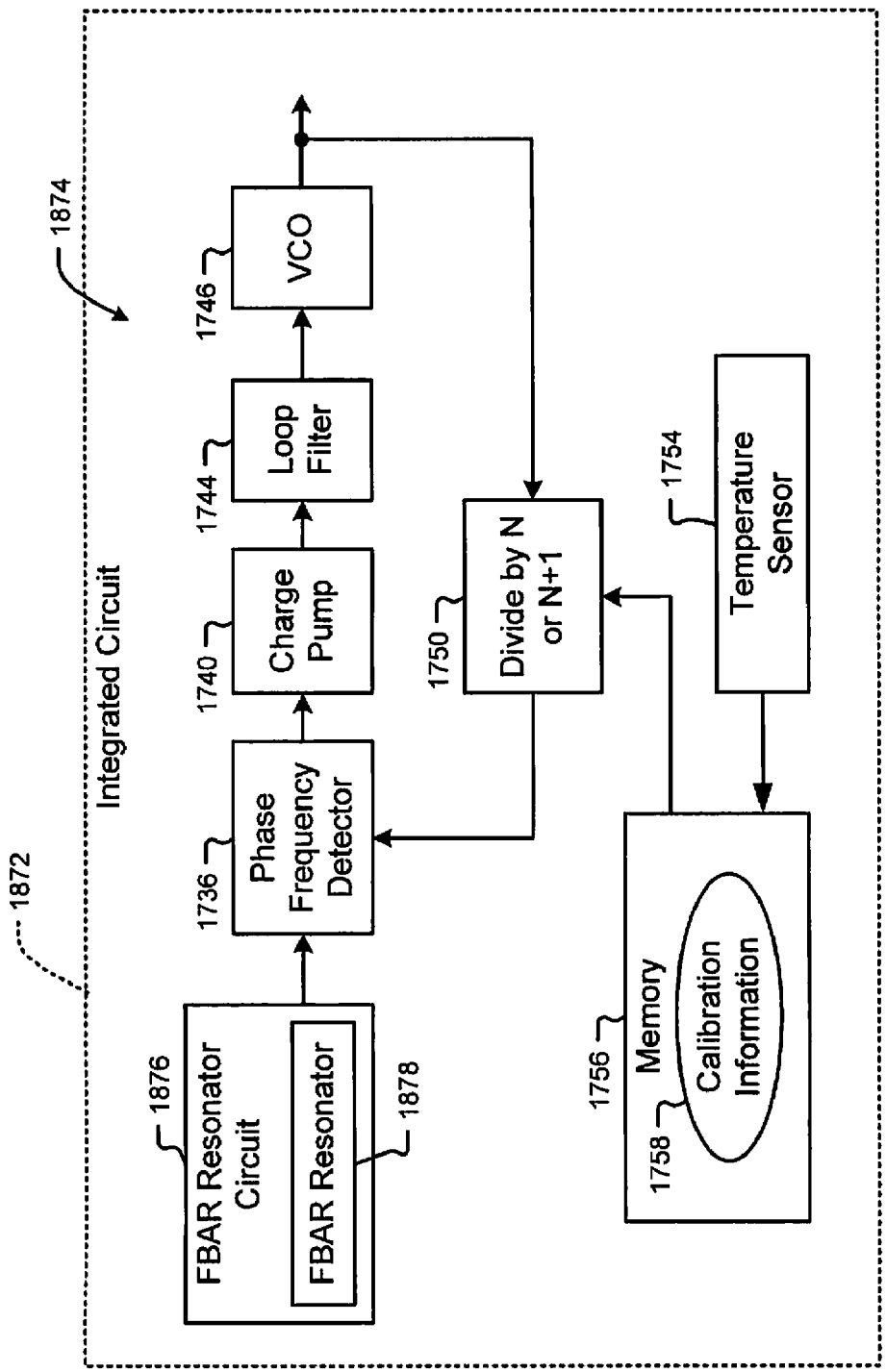
FIG. 50A is a functional block diagram of a fractional phase locked loop including a film bulk acoustic resonator (FBAR) circuit.

Referring now to FIG. 50A, a functional block diagram of an integrated circuit 1872 including a fractional phase locked loop 1874 with a film bulk acoustic resonator (FBAR) circuit 1876 is shown. Reference numbers from FIG. 48A are used where appropriate. The FBAR circuit 1876 includes an FBAR 1878. The FBAR 1878 may be a thin-film device that utilizes bulk acoustic waves that are transmitted inside a layer of piezoelectric material. The FBAR varies resonant frequency by changing the thickness of the piezoelectric material. The FBAR circuit 1976 may be used to generate a reference frequency. Compensation of the fractional phase-locked loop based on temperature is performed as described above in FIG. 48A.

Figure 50B:
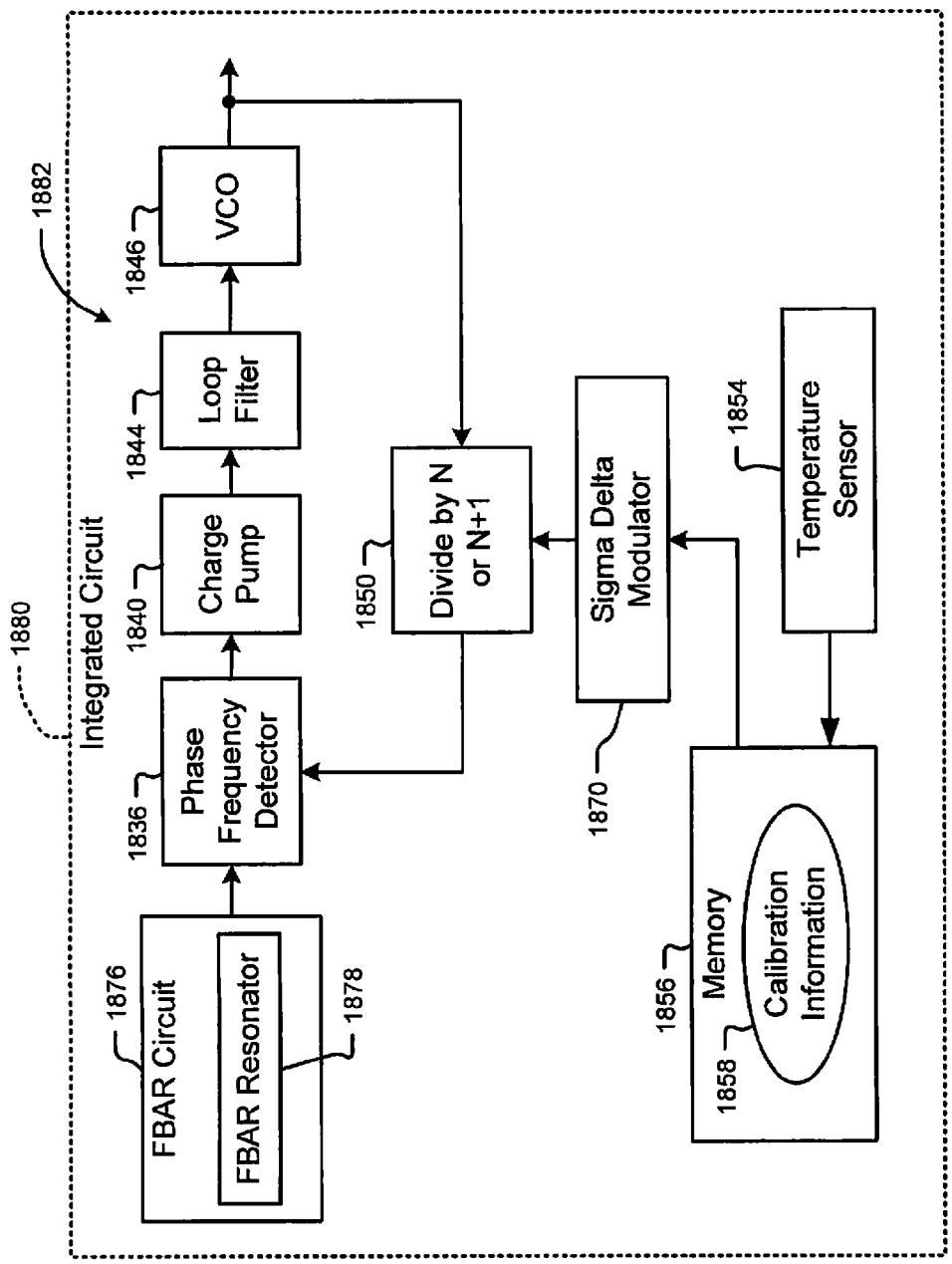
FIG. 50B is a functional block diagram of a Delta-Sigma phase locked loop including a FBAR resonator circuit.

Referring now to FIG. 50B, a functional block diagram of an integrated circuit 1880 including a Delta Sigma phase locked loop 1882 with a film bulk acoustic resonator (FBAR) circuit 1876 is shown. Reference numbers from FIG. 48A and 48B are used where appropriate. The FBAR circuit 1876 includes an FBAR 1878. The FBAR circuit 1876 may be used to generate a reference frequency. Compensation of the Delta Sigma phase-locked loop 1882 based on temperature is performed as described above in FIG. 48B.

Figure 50C:
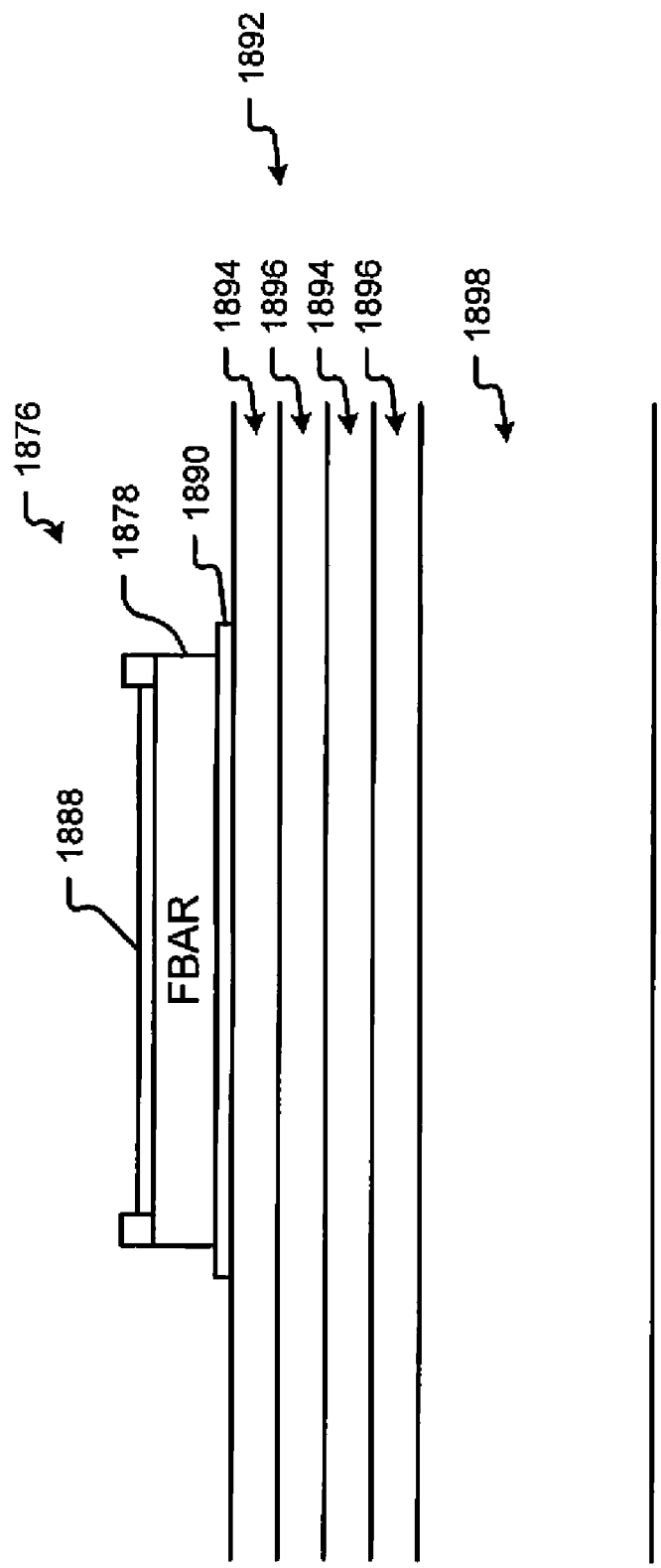
FIG. 50C illustrates an exemplary FBAR circuit and FBAR.

Referring now to FIG. 50C, an exemplary FBAR circuit 1876 and FBAR 1878 are shown. The FBAR circuit 1876 may include an acoustic mirror 1892 arranged adjacent to the FBAR 1878 to provide acoustic isolation between the structure and a substrate 1898. The FBAR 1878 may include a piezoelectric material such as Aln, ZnO, PZT or any other piezoelectric material. The FBAR 1878 may further include electrodes 1888 and 1890. The acoustic mirror 1892 may include alternating high acoustic impedance layers 1894 and low acoustic impedance layers 1896 between the electrode 1890 and the substrate 1898. The resonance frequency of the FBAR 1878 may be determined by the thickness of the piezoelectric material. The substrate 1898 may include silicon, gallium arsenide, glass or suitable insulator material. While an exemplary FBAR structure is shown for example purposes only, other FBAR structures are contemplated.

Referring now to FIG. 51A, an integrated circuit including a semiconductor oscillator circuit 2010 according to the prior art is shown. The semiconductor oscillator circuit 2010 includes an LC tank circuit 2014 that communicates with cross-coupled transistors 2016. A current bias circuit 2018 biases the cross-coupled transistors 2016. The cross-coupled transistors 2016 and the LC tank circuit 2014 resonate to produce an oscillating output signal $V_{out}$. The current bias circuit 2018 provides a bias signal that drives the cross-coupled transistors 2016.

Referring now to FIG. 51B, amplitude drift is shown as a function of time. Over time, the semiconductor oscillator circuit 2010 including the LC tank circuit 2014 may tend to have an amplitude envelope that drifts, e.g. the amplitude envelope either increases (not shown) or decreases (as shown). This may pose problems for other circuits that receive $V_{out}$. Frequency drift may be handled using the approaches described above.

Referring now to FIG. 52, a semiconductor oscillator 2020 with amplitude compensation is shown. The semiconductor oscillator 2020 includes an amplitude adjustment module 2021 and a semiconductor oscillator 2022 with an amplitude adjustment input. The semiconductor oscillator 2020 may include any of the semiconductor oscillators described herein. The amplitude adjustment module 2021 monitors an amplitude of an output of the semiconductor oscillator 2022. Based on the monitored amplitude, the amplitude adjustment module 2021 adjusts a control signal that is output to the semiconductor oscillator output. For example, the amplitude adjustment module 2021 may compare the monitored amplitude with a predetermined threshold and adjust the control signal based on the comparison. The control signal may include a current bias signal, a voltage bias signal, an impedance value that is varied and/or any other control signal. As a result, amplitude drift can be reduced or prevented.

Figure 53B:
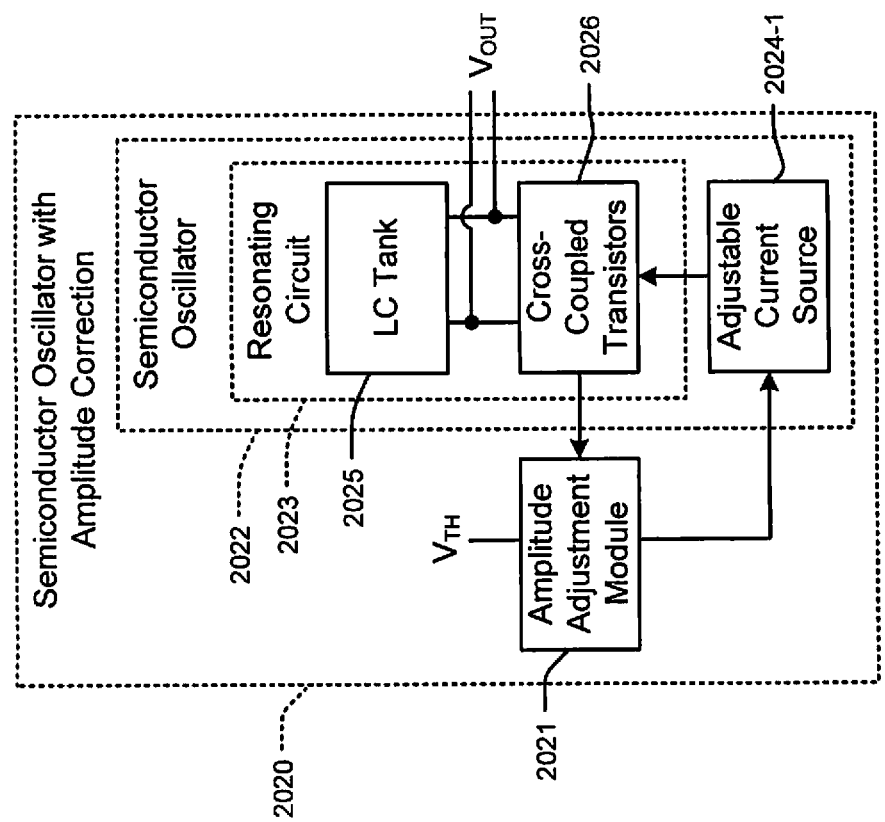
Figure 53A:
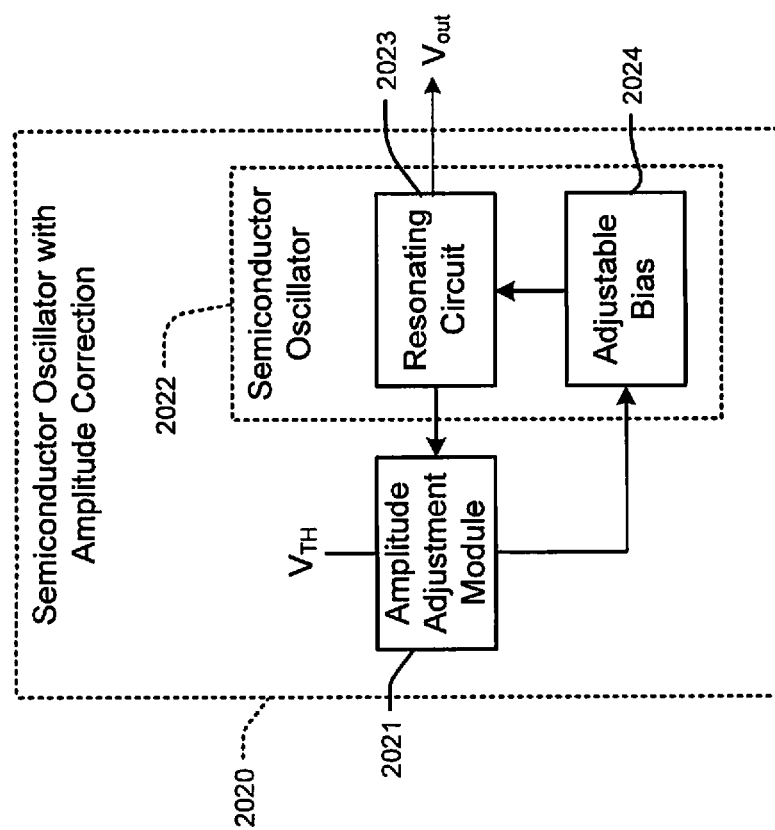

Referring now to FIG. 53A, an exemplary semiconductor oscillator 2020 is shown. The semiconductor oscillator 2020 includes a resonating circuit 2023 and an adjustable bias module 2024. The amplitude adjustment module 2021 monitors $V_{out}$ or another parameter of the resonating circuit 2023 and generates a control signal that adjusts an output of the adjustable bias module 2024. The output of the adjustable bias module 2024 varies operation of the resonating circuit 2023 to adjust the amplitude of the semiconductor oscillator 2022.

Referring now to FIG. 53B, a semiconductor oscillator circuit 2020 according to the present disclosure is shown. The semiconductor oscillator circuit 2020 performs amplitude correction and includes an LC tank circuit 2025 and cross-coupled transistors 2026. The semiconductor oscillator circuit 2020 includes the amplitude adjustment module 2021. The semiconductor oscillator circuit 2020 includes an adjustable current source 2024-1 that provides a current bias signal to the cross-coupled transistors 2026. The amplitude adjustment module 2021 monitors $V_{out}$ and selectively adjusts a control signal. The control signal adjusts the bias signal output by the adjustable current source 2024-1. This, in turn, adjusts the amplitude envelope of $V_{out}$.

The amplitude adjustment module 2034 may sense an amplitude envelope of $V_{out}$ and compare the amplitude envelope to a threshold signal $V_{th}$. Based on a difference between the compared signals, the amplitude adjustment module may adjust the amplitude of $V_{out}$ by adjusting the control signal to the adjustable current source 2024-1.

Figure 54:
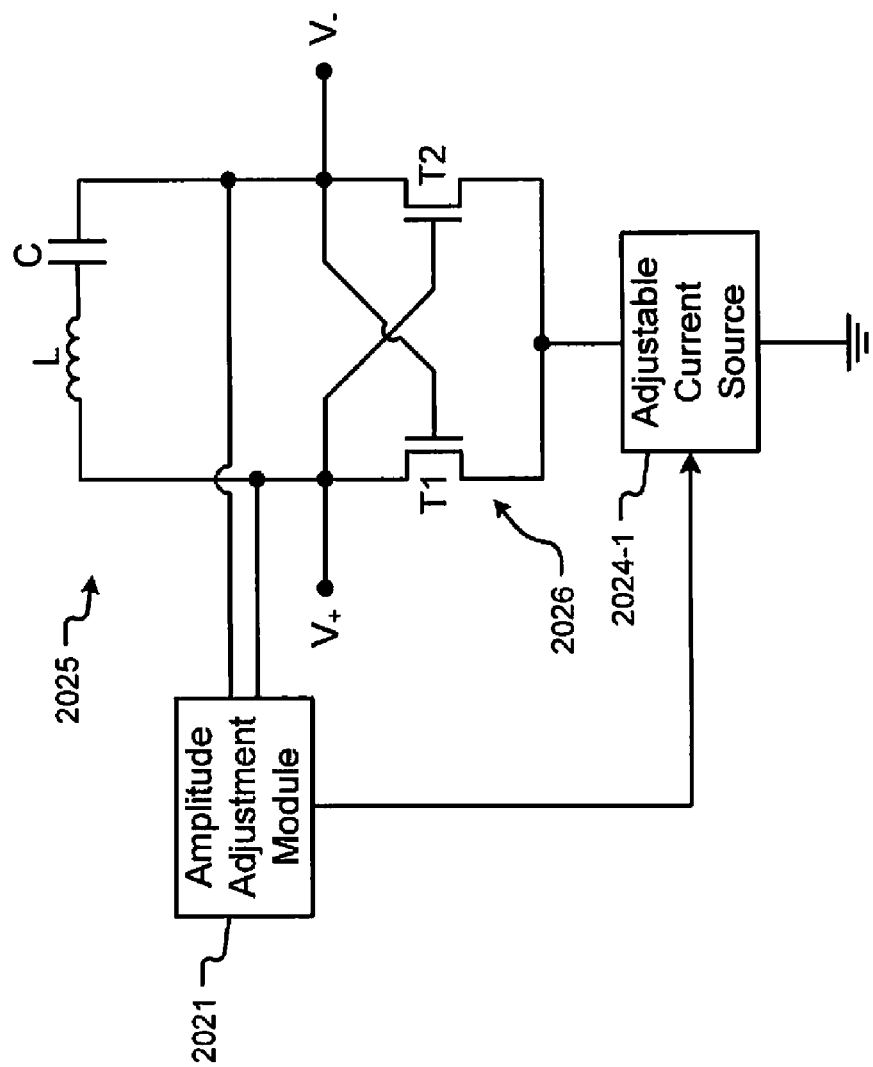
FIG. 54-56 are electrical schematics of exemplary semiconductor LC oscillators according to the present disclosure.
Figures 55, 56:
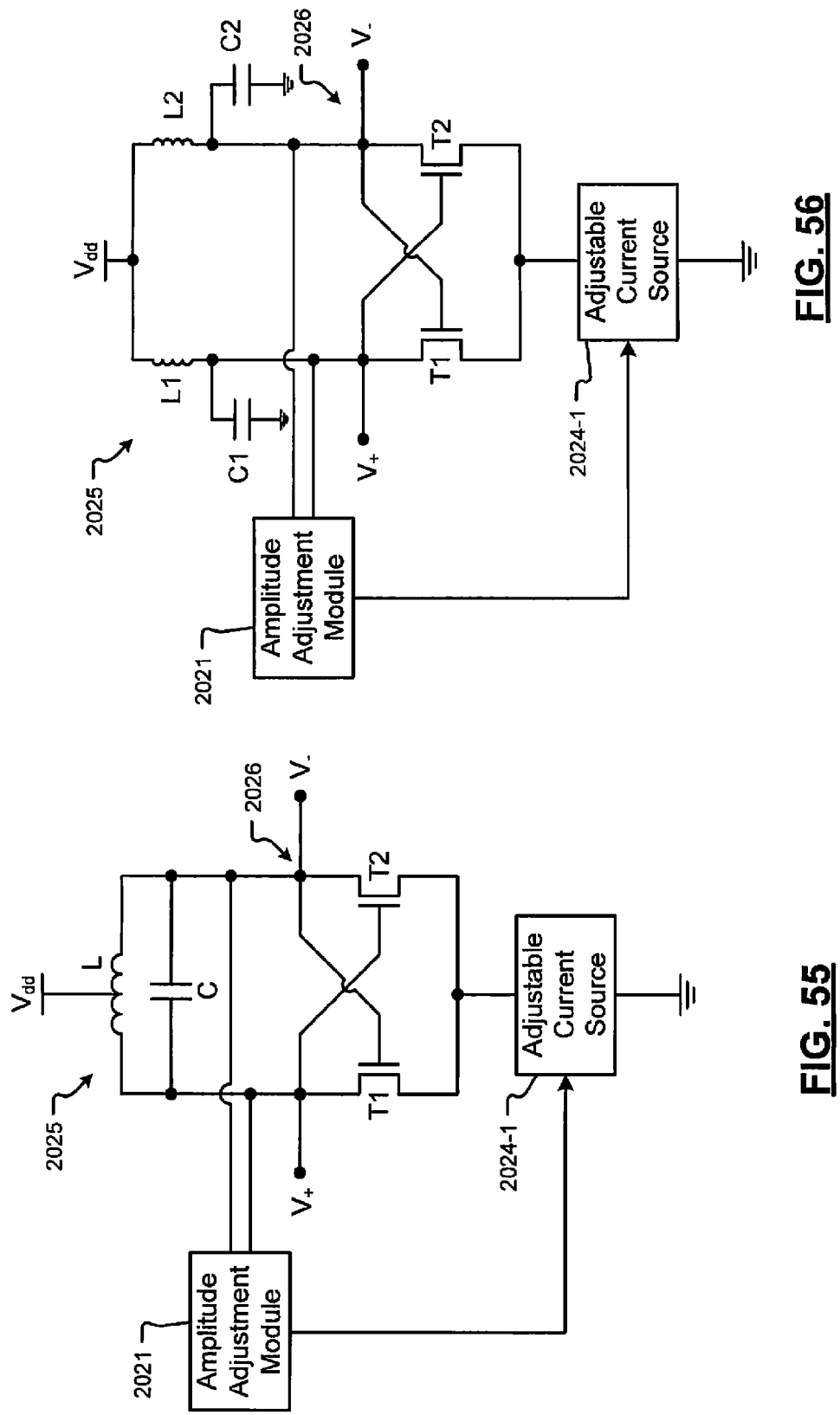

Referring now to FIG. 54-56, electrical schematics of exemplary semiconductor oscillator circuits according to the present disclosure are shown. In FIG. 54, the semiconductor oscillator circuit includes an inductance L, a capacitance C, first and second transistors T1 and T2, the adjustable amplitude module 2021, the adjustable current source 2024-1, and the cross-coupled transistors 2026, which are connected as shown.

In FIG. 55, an alternate arrangement for the LC tank circuit is shown. A voltage supply $V_{dd}$ biases the inductance L. A capacitance C is connected in parallel across first terminals of the transistors T1 and T2. In FIG. 56, first and second inductances L1 and L2 are provided and communicate with first terminals of the transistors T1 and T2, respectively, and with a voltage supply $V_{dd}$. First and second capacitances C1 and C2 have ends that communicate with the first terminals of the transistors T1 and T2, respectively. Still other arrangements may be employed.

In use, the voltage supply $V_{dd}$ supplies voltage to the LC circuit, which causes the LC circuit to resonate. The cross coupled transistors adjust the amplitude envelope of $V_{out}$ based on the bias signal. The amplitude monitoring module monitors the output voltage and compares the envelope to a threshold envelope. The amplitude monitoring module may generate a difference signal. The amplitude monitoring module adjusts a control signal to an adjustable current source based on the difference signal. The control signal adjusts the bias signal.

Figure 57:
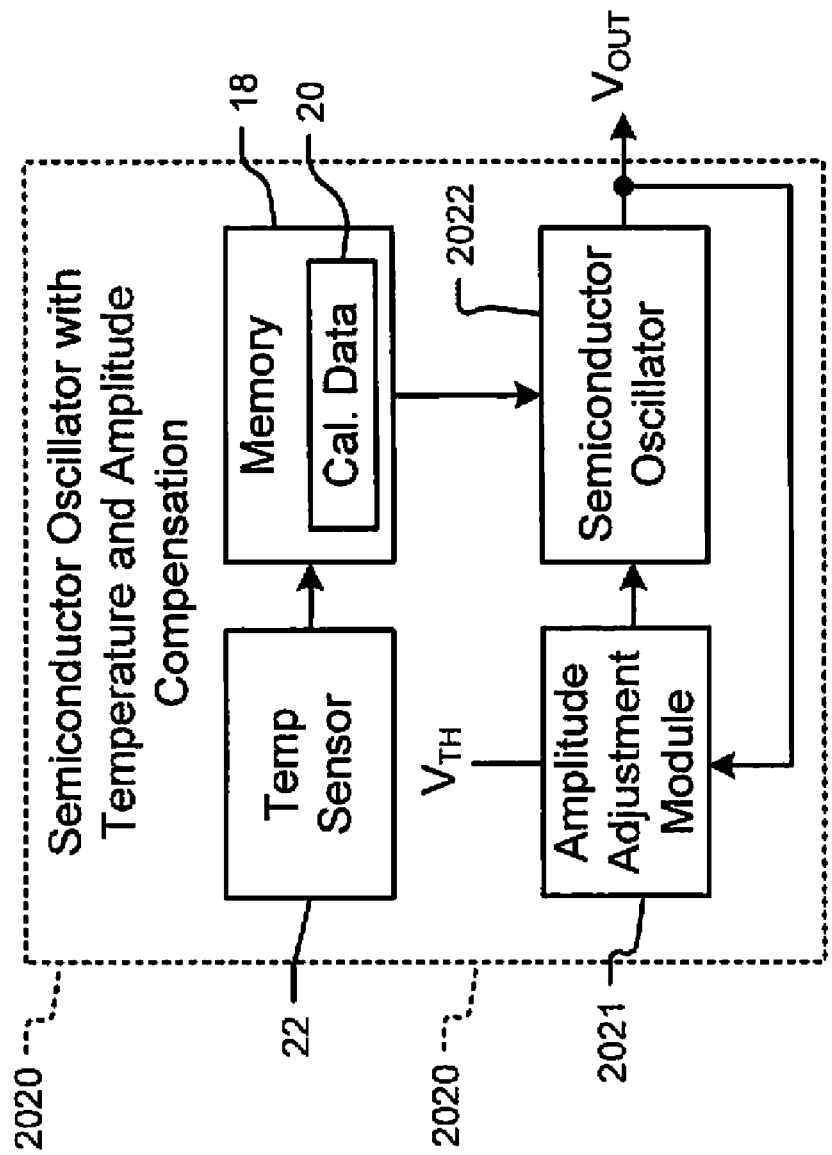
FIG. 57 is a functional block diagram of a semiconductor oscillator with temperature and amplitude compensation.

Referring now to FIG. 57, a semiconductor oscillator with temperature and amplitude compensation is shown. In other words, temperature and amplitude compensation can be combined in a single crystal oscillator emulator. As a result, temperature compensation and amplitude compensation of the semiconductor oscillator is performed and the accuracy of the frequency and amplitude output is improved.

When the semiconductor oscillator implemented by the crystal oscillator emulators described above includes one or more inductors, the inductors preferably comprise a material having a low electron migration characteristic. For example only, the material may comprise Copper (Cu) or Gold (Au). Materials such as Aluminum (Al) tend to have electron migration that is too high. In other words, Cu and Au have lower relative electron migration as compared to Al. The reduced electron migration characteristic of Cu and Au tends to decrease frequency drift as a function of time.

In systems using an external crystal oscillator to generate a reference frequency, Al may also be used to implement inductors. The choice of material used in the inductors tends to be less important in these systems as compared to crystal oscillator emulator systems such as those described above that do not use an external crystal to generate the reference frequency. In other words, the external crystal oscillator in these systems corrects for frequency drift caused by electron migration.

A number of embodiments of the invention have been described. Nevertheless, it will be understood that various modifications may be made without departing from the spirit and scope of the invention. Accordingly, other embodiments are within the scope of the following claims.

What is claimed is:

1. A crystal oscillator emulator integrated circuit, comprising:
   a first temperature sensor configured to sense a first temperature of the crystal oscillator emulator integrated circuit;
   memory configured to (i) store calibration parameters and (ii) select at least one of the calibration parameters based on the first temperature, wherein the calibration parameters include a function of at least one of temperature change and absolute temperature;
   a semiconductor oscillator configured to generate an output signal, wherein (i) the output signal has a frequency and an amplitude and (ii) the frequency is based on the at least one of the calibration parameters; and
   an amplitude adjustment module configured to (i) compare the amplitude to a predetermined amplitude and (ii) generate a control signal to adjust the amplitude based on the comparison.

2. The crystal oscillator emulator integrated circuit of claim 1, wherein the semiconductor oscillator includes a resonating circuit.

3. The crystal oscillator emulator integrated circuit of claim 2, wherein the semiconductor oscillator includes a bias adjusting circuit configured to (i) receive the control signal and (ii) generate a bias signal to bias the resonating circuit to adjust the amplitude based on the control signal.

4. The crystal oscillator emulator integrated circuit of claim 3, wherein the bias signal includes a voltage bias signal.

5. The crystal oscillator emulator integrated circuit of claim 3, wherein the bias signal includes a current bias signal.

6. The crystal oscillator emulator integrated circuit of claim 3, wherein the resonating circuit includes:
   an inductive-capacitive (LC) circuit; and
   cross-coupled transistors in communication with the LC circuit.

7. The crystal oscillator emulator integrated circuit of claim 1, further comprising a select input configured to select the frequency based on an external passive component.

8. The crystal oscillator emulator integrated circuit of claim 1, further comprising:
   a heater configured to adjust the first temperature; and
   a disabling circuit configured to disable the heater after the calibration parameters are stored.

9. The crystal oscillator emulator integrated circuit of claim 8, wherein the heater is configured to operate in response to the first temperature sensor.

10. The crystal oscillator emulator integrated circuit of claim 1, wherein the semiconductor oscillator is selected from a group consisting of inductive-capacitive (LC) oscillators, resistive capacitive (RC) oscillators and ring oscillators.

11. A method for operating a crystal oscillator emulator integrated circuit, the method comprising:
   sensing a first temperature of the crystal oscillator emulator integrated circuit;
   storing calibration parameters in memory;
   selecting at least one of the calibration parameters based on the first temperature;
   generating an output signal having a frequency and an amplitude using a semiconductor oscillator, wherein the frequency is based on at least one of the calibration parameters;
   comparing the amplitude to a predetermined amplitude; and
   generating a control signal to adjust the amplitude based on the comparison.

12. The method of claim 11, wherein the semiconductor oscillator includes a resonating circuit.

13. The method of claim 12, further comprising generating a bias signal to bias the resonating circuit to adjust the amplitude based on the control signal.

14. The method of claim 13, wherein the bias signal includes a voltage bias signal.

15. The method of claim 13, wherein the bias signal includes a current bias signal.

16. The method of claim 11, further comprising configuring a select input to select the frequency based on an external passive component.

17. The method of claim 11, further comprising:
   providing a heater to adjust the first temperature; and
   disabling the heater after the calibration parameters are stored.

* * * * *